(12) United States Patent
Yamaguchi et al.

(10) Patent No.: US 7,930,139 B2
(45) Date of Patent: Apr. 19, 2011

(54) PROBABILITY DENSITY FUNCTION SEPARATING APPARATUS, PROBABILITY DENSITY FUNCTION SEPARATING METHOD, PROGRAM, TESTING APPARATUS, BIT ERROR RATE MEASURING APPARATUS, ELECTRONIC DEVICE, AND JITTER TRANSFER FUNCTION MEASURING APPARATUS

(75) Inventors: Takahiro Yamaguchi, Tokyo (JP); Harry Hou, Santa Clara, CA (US)

(73) Assignee: Advantest Corporation, Tokyo (JP)

( * ) Notice: Subject to any disclaimer, the term of this patent is extended or adjusted under 35 U.S.C. 154(b) by 407 days.

(21) Appl. No.: 12/179,550

(22) Filed: Jul. 24, 2008

(65) Prior Publication Data
US 2009/0043537 A1 Feb. 12, 2009

Related U.S. Application Data

(63) Continuation-in-part of application No. 11/836,786, filed on Aug. 10, 2007, now Pat. No. 7,809,516.

(51) Int. Cl.
*G06F 19/00* (2006.01)
(52) U.S. Cl. ...................................................... 702/180
(58) Field of Classification Search .................. 702/18, 702/182–185
See application file for complete search history.

(56) References Cited

U.S. PATENT DOCUMENTS

| | | | |
|---|---|---|---|
| 2002/0120420 A1 | 8/2002 | Wilstrup et al. | |
| 2003/0004664 A1 | 1/2003 | Ward et al. | |
| 2003/0031284 A1* | 2/2003 | Ishida et al. | 375/371 |
| 2003/0115017 A1 | 6/2003 | Sun et al. | |
| 2005/0027477 A1 | 2/2005 | Li et al. | |
| 2006/0018374 A1 | 1/2006 | Nelson et al. | |

FOREIGN PATENT DOCUMENTS

| | | |
|---|---|---|
| JP | 2002-502041 | 1/2002 |
| JP | 2003-057280 | 2/2003 |
| JP | 2004-125552 | 4/2004 |
| JP | 2005-513841 | 5/2005 |

OTHER PUBLICATIONS

Office Action issued by the German Patent and Trademark Office on Apr. 14, 2010 which cites U.S. Patent Application Publication No. 1 above.
Authored by Li, et al., article titled "A New Method for Jitter Decomposition Through Its Distribution Tail Fitting," adopted from Itc International Test Conference, Paper 302, pp. 788-794.
Gert Hansel et al., "Implemantation of an Economic Jitter Compliance Test for a Multi-Gigabit Device on ATE", ITC International Test Conference, Paper 46.2, Oct. 26-28, 2004. pp. 1303-1311.
Li et al., Paradigm Shift For Jitter and Noise In Design and Test >GB/s Communication Systems, IEEE Proceedings of the 21st International Conference on Computer Design 2003, p. 467-472.
"Office Action of German Counterpart Application" issued on Jun. 7, 2010, p. 1-p. 19, in which the listed reference was cited.
"Office Action of US Co-pending Application", issued on Jan. 3, 2010, p. 1-p. 10, in which the listed reference was cited.

* cited by examiner

*Primary Examiner* — Edward Raymond
(74) *Attorney, Agent, or Firm* — Jianq Chyun IP Office

(57) ABSTRACT

There is provided a probability density function separating apparatus that separates a predetermined component in a given probability density function. The probability density function separating apparatus includes a domain transforming section that is supplied with the probability density function and transforms the probability density function into a spectrum in a predetermined variable axis, and a deterministic component computing section that multiplies a multiplier coefficient according to a type of distribution of a deterministic component included in the given probability density function by a value, in the variable axis, of a first null of the spectrum and computes a peak to peak value of the probability density function with the deterministic component.

19 Claims, 58 Drawing Sheets

|  | EXPECTED VALUE | CONVENTIONAL METHOD | PROBABILITY DENSITY FUNCTION SEPARATING APPARATUS 100 |
|---|---|---|---|
| WITHOUT TIMING ERROR | DJ | 50ps | 44.5ps (11%) | 49.9ps (0.2%) |
| | RJ | 4.02ps | 4.89ps (22%) | 4.22ps (5.0%) |
| WITH TIMING ERROR | DJ | 50ps | 44.9ps (10%) | 49.9ps (0.2%) |
| | RJ | 4.02ps | 4.78ps (19%) | 4.02ps (0.0%) |

FIG. 10

|  |  | PROBABILITY DENSITY FUNCTION SEPARATING APPARATUS 100 | | CURVE FITTING METHOD A [ps] | CURVE FITTING METHOD B [ps] |
|---|---|---|---|---|---|
|  |  | sin PDF | Uniform PDF |  |  |
| RJ | mean | 1.67 | — | 1.60 | 2.00 |
|  | max | 1.81 | — | 1.89 | 2.82 |
|  | min | 1.47 | — | 1.30 | 1.65 |
|  | Standard dev. | 0.07 | — | 0.12 | 0.17 |
| DJ | mean | 3.54 | — | 2.99 | 0.26 |
|  | max | 4.41 | — | 4.64 | 1.74 |
|  | min | 2.57 | — | 1.44 | 0.00 |
|  | Standard dev. | 0.40 | — | 0.62 | 0.37 |

FIG. 13

| | | PROBABILITY DENSITY FUNCTION SEPARATING APPARATUS 100 | | CURVE FITTING METHOD A | | CURVE FITTING METHOD B | |
|---|---|---|---|---|---|---|---|
| | | RJ σ | DDJ p-p | RJ σ | DDJ p-p | RJ σ | DDJ p-p |
| 195 PDFs | RJ*DDJ [ps] | 2.34 | 17.0 | 2.65 | 17.2 | 3.66 | 8.79 |
| | Standard deviation [ps] | 0.17 | 0.46 | 0.23 | 1.82 | 0.27 | 2.11 |

FIG. 14

Gaussian Distribution Probabilities

| BER | Ratio of peak-to-peak deviation to $\sigma$ |
|---|---|
| $10^{-03}$ | 06.180 |
| $10^{-04}$ | 07.438 |
| $10^{-05}$ | 08.530 |
| $10^{-06}$ | 09.507 |
| $10^{-07}$ | 10.399 |
| $10^{-08}$ | 11.224 |
| $10^{-09}$ | 11.996 |
| $10^{-10}$ | 12.723 |
| $10^{-11}$ | 13.412 |
| $10^{-12}$ | 14.069 |
| $10^{-13}$ | 14.698 |
| $10^{-14}$ | 15.301 |

BERScope, "Dual-Dirac, Scope Histograms and BERTScan Measurements-A Primer," 2005

*FIG. 19D*

| Bench-marking | Expected Values [d] | | Present Method | Proposed Method |
|---|---|---|---|---|
| SJ*SmallSJ | DJ | 50 ps | — | 49.0 ps |
| SJ*SJ | DJ | 100 ps | 80.5 ps | 99.0 ps |
| | Number of DJ? | | Impossible | Possible |
| | Number of DJ | 2 | — | 2 |

FIG. 26

| Bench-marking | | Expected Values [c] | Present Method | Proposed Method |
|---|---|---|---|---|
| RJ only | DJ | 0.00 ps | 0.00 ps | 0.00 ps |
| | RJ | 4.02 ps | 4.54 ps rms | 3.82 ps rms |
| RJ&SJ | DJ | 50 ps | 44.5 ps | 51.2 ps |
| | RJ | 4.02 ps | 4.89 ps rms | 3.72 ps rms (3.72 ps rms) |
| RJ&SJ with Timing Error | DJ | 50 ps | 44.9 ps | 51.2 ps |
| | RJ | 4.02 ps | 4.78 ps rms | 3.58 ps rms (3.67 ps rms) |

*FIG. 34*

|  | Small DJ | | Large DJ | |
| --- | --- | --- | --- | --- |
|  | RJ $\sigma$ | DJ pk-to-pk | RJ $\sigma$ | DJ pk-to-pk |
| TESTING APPARATUS 300 | 1.1% | 7.3% | 2.8% | 2.7% |
| CONVENTIONAL METHOD | 17.0% | 20.0% | 23.0% | 6.9% |

*FIG. 38*

PROBABILITY DENSITY FUNCTION SEPARATING APPARATUS, PROBABILITY DENSITY FUNCTION SEPARATING METHOD, PROGRAM, TESTING APPARATUS, BIT ERROR RATE MEASURING APPARATUS, ELECTRONIC DEVICE, AND JITTER TRANSFER FUNCTION MEASURING APPARATUS

CROSS REFERENCE TO RELATED APPLICATION

This is a continuation in-part application of Ser. No. 11/836,786 filed on Aug. 10, 2007 the contents of which are incorporated herein by reference.

BACKGROUND

1. Technical Field

The present invention relates to a probability density function separating apparatus, a probability density function separating method, a program, a testing apparatus, a bit error rate measuring apparatus, an electronic device, and a jitter transfer function measuring apparatus. More particularly, the present invention relates to an apparatus and a method for separating a deterministic component and a random component from a probability density function.

2. Related Art

A method for separating a probability density function with a deterministic component and a probability density function with a random jitter component can be used in an oscilloscope, a time interval analyzer, a universal time frequency counter, automated test equipment, a spectrum analyzer, a network analyzer, and so on. A signal under test may be an electrical signal or an optical signal. The signal under test may indicate information about the variances among products manufactured by the wafer fabrication process.

When amplitude of the signal under test is degraded, a probability by which a reception bit one is erroneously decided to a bit zero is increased. Similarly, when a timing of the signal under test is degraded, a probability of an erroneous decision is increased in proportion to the degradation. It takes longer observation time than $T_b/P_e$ to measure these bit error rates $P_e$ (however, $T_b$ shows a bit rate). As a result, it takes long measurement time to measure an extremely small bit error rate.

For this reason, as measures against amplitude degradation, there has been used a method for setting a bit decision threshold value to a comparatively large value to measure a bit error rate and extrapolate it into an area with an extremely small bit error rate. A deterministic component of a probability density function is bounded and causes a bounded bit error rate. On the other hand, a random component of a probability density function is unbounded. Therefore, a technique for accurately separating a deterministic component and a random component included in measured probability density function and causing bit error rate becomes important.

Conventionally, as a method for separating a deterministic component and a random component included in a probability density function or the like, for example, the invention disclosed in US 2002/0120420 has been known. According to this method, an estimate of variance of a probability density function over a predetermined time interval is computed and the computed estimate of variance is transformed into a frequency domain, in order to determine a random component and a period component constituting the variance. The method uses changing a measured time interval from one cycle to N cycles to measure an autocorrelation function of a period component and an autocorrelation function of a random component and making the Fourier transform respectively correspond to a line spectrum and a white noise spectrum. Here, the variance is a sum of a correlation coefficient of a period component and a correlation coefficient of a random component.

However, a probability density function is given by convolution integrating a deterministic component and a random component. Therefore, according to this method, it is not possible to separate a deterministic component and a random component from a probability density function.

Moreover, as another method for separating a deterministic component and a random component included in a probability density function or the like, for example, the invention disclosed in U.S. Pat. No. 2005/0027477 has been known. As shown in FIG. 2 to be described below, according to this method, both tails of a probability density function are fitted to Gaussian distribution in order to separate two random components from the probability density function. In this method, random components and a deterministic component are performed fit of Gaussian curves under the assumption that both components do not interfere with each other, in order to separate a random component corresponding to Gaussian distribution.

However, it is generally difficult to uniquely determine a boundary between a random component and a deterministic component, and it is difficult to separate a random component with high precision in this method. Moreover, as shown in FIG. 2 to be described below, according to this method, a deterministic component is computed based on a difference $D(\delta\delta)$ between two time instants corresponding to a mean value of each random component.

However, for example, when a deterministic component is a sine wave or the like, it is experimentally confirmed that this difference $D(\delta\delta)$ shows a smaller value than $D(p-p)$ of a true value. In other words, according to this method, since only an ideal deterministic component by a square wave can be approximated, various deterministic components such as a deterministic component of a sine wave are not measured. Furthermore, a measurement error of a random component is also large.

SUMMARY

Therefore, it is an object of an aspect of the present invention to provide a probability density function separating apparatus, a probability density function separating method, a program, a testing apparatus, a bit error rate measuring apparatus, an electronic device, and a jitter transfer function measuring apparatus which are capable of solving the above-mentioned problems. The above and other objects can be achieved by combinations described in the independent claims. The dependent claims define further advantageous and exemplary combinations of the present invention.

A first embodiment of the present invention provides a probability density function separating apparatus that separates a predetermined component in a given probability density function. The probability density function separating apparatus includes a domain transforming section that is supplied with the probability density function and transforms the probability density function into a spectrum in a frequency domain, and a deterministic component computing section that multiplies a multiplier coefficient according to a type of distribution of a deterministic component included in the given probability density function by a first null frequency of the spectrum in the frequency domain and computes a peak to peak value of the probability density function with the deterministic component.

A second embodiment of the present invention provides a probability density function separating method for separating a predetermined component from a given probability density function. The probability density function separating method includes a domain transforming step of being supplied with the probability density function and transforming the probability density function into a spectrum in a frequency domain, and a deterministic component computing step of multiplying a multiplier coefficient according to a type of distribution of a deterministic component included in the given probability density function by a first null frequency of the spectrum in the frequency domain and computing a peak to peak value of the probability density function with the deterministic component.

A third embodiment of the present invention provides a program making a computer function as a probability density function separating apparatus that separates a predetermined component from a given probability density function. The program makes the computer function as a domain transforming section that is supplied with the probability density function and transforms the probability density function into a spectrum in a frequency domain, and a deterministic component computing section that multiplies a multiplier coefficient according to a type of distribution of a deterministic component included in the given probability density function by a first null frequency of the spectrum in the frequency domain and computes a peak to peak value of the probability density function with the deterministic component.

A fourth embodiment of the present invention provides a testing apparatus that tests a device under test. The testing apparatus includes a level comparing section that compares a level of an output signal output from the device under test with a given reference value and outputs a comparison result, a timing comparing section that samples the comparison result according to a given timing signal and converts the sampled result into digital data, a probability density function computing section that computes a probability density function of the output signal based on the digital data, and a probability density function separating apparatus that separates a predetermined component from the probability density function. Here, the probability density function separating apparatus includes a domain transforming section that is supplied with the probability density function and transforms the probability density function into a spectrum in a frequency domain, and a deterministic component computing section that multiplies a multiplier coefficient according to a type of distribution of a deterministic component included in the given probability density function by a first null frequency of the spectrum in the frequency domain and computes a peak to peak value of the probability density function with the deterministic component.

A fifth embodiment of the present invention provides a bit error rate measuring apparatus that measures a bit error rate of output data from a device under test. The bit error rate measuring apparatus includes a sampling section that samples a data value of the output data according to a given timing signal, an expected value comparing section that compares a sampling result by the sampling section with a given expected value, a probability density function computing section that computes a probability density function of the output data based on the comparison result by the expected value comparing section, and a probability density function separating apparatus that separates a predetermined component from the probability density function. Here, the probability density function separating apparatus includes a domain transforming section that is supplied with the probability density function and transforms the probability density function into a spectrum in a frequency domain, and a deterministic component computing section that multiplies a multiplier coefficient according to a type of distribution of a deterministic component included in the given probability density function by a first null frequency of the spectrum in the frequency domain and computes a peak to peak value of the probability density function with the deterministic component.

A sixth embodiment of the present invention provides an electronic device that generates a predetermined signal. The electronic device includes an operation circuit that generates the predetermined signal to output it, a probability density function computing section that measures the predetermined signal and computes a probability density function of the predetermined signal, and a probability density function separating apparatus that separates a predetermined component from the probability density function. Here, the probability density function separating apparatus includes a domain transforming section that is supplied with the probability density function and transforms the probability density function into a spectrum in a frequency domain, and a deterministic component computing section that multiplies a multiplier coefficient according to a type of distribution of a deterministic component included in the given probability density function by a first null frequency of the spectrum in the frequency domain and computes a peak to peak value of the probability density function with the deterministic component.

A seventh embodiment of the present invention provides a jitter transfer function measuring apparatus that measures a jitter transfer function of a device under test. The jitter transfer function measuring apparatus includes a probability density function separating apparatus that separates a deterministic component from a probability density function of jitter included in a signal under test which is output from the device under test in response to an input test signal, and a transfer function computing section that computes the jitter transfer function of the device under test, based on a deterministic component of jitter included in the test signal and the deterministic component of the jitter included in the signal under test. Here, the probability density function separating apparatus includes a domain transforming section that is supplied with the probability density function of the jitter included in the signal under test and transforms the probability density function into a spectrum in a frequency domain, and a deterministic component computing section that multiplies a multiplier coefficient according to a type of distribution of the deterministic component included in the supplied probability density function by a first null frequency of the spectrum in the frequency domain and computes a peak to peak value of the probability density function with the deterministic component.

The summary of the invention does not necessarily describe all necessary features of the present invention. The present invention may also be a sub-combination of the features described above.

BRIEF DESCRIPTION OF THE DRAWINGS

FIG. 10 is a view exemplary showing a measurement result by a probability density function separating apparatus 100 described with reference to FIG. 1 and a measurement result by a conventional curve fitting method described in FIG. 2.

FIG. 13 illustrates an example of the measurement result obtained by the probability density function separating apparatus 100 described with reference to FIGS. 11 and 12.

FIG. 14 illustrates a different example of the measurement result obtained by the probability density function separating apparatus 100 described with reference to FIGS. 11 and 12.

FIG. 19D shows a table indicating the relation between the coefficient which is to be multiplied by the value of the random jitter to compute the total jitter TJ and the corresponding threshold value of the bit error rate.

FIG. 26 shows values of D(p-p) measured by a threshold process and D(δδ) measured by a conventional method for a probability density function including a plurality of deterministic jitters.

FIG. 34 is a view exemplary showing a measurement result of jitter by a jitter separating apparatus 200 and a measurement result of jitter by a conventional method.

FIG. 38 is a view exemplary showing a measurement result by a testing apparatus 300 described with reference to FIG. 37 and a measurement result by a conventional curve fitting method described with reference to FIG. 2.

DETAILED DESCRIPTION OF THE INVENTION

An aspect of the invention will now be described based on the preferred embodiments, which do not intend to limit the scope of the present invention, but exemplify the invention. All of the features and the combinations thereof described in the embodiment are not necessarily essential to the invention.

Figure 1:
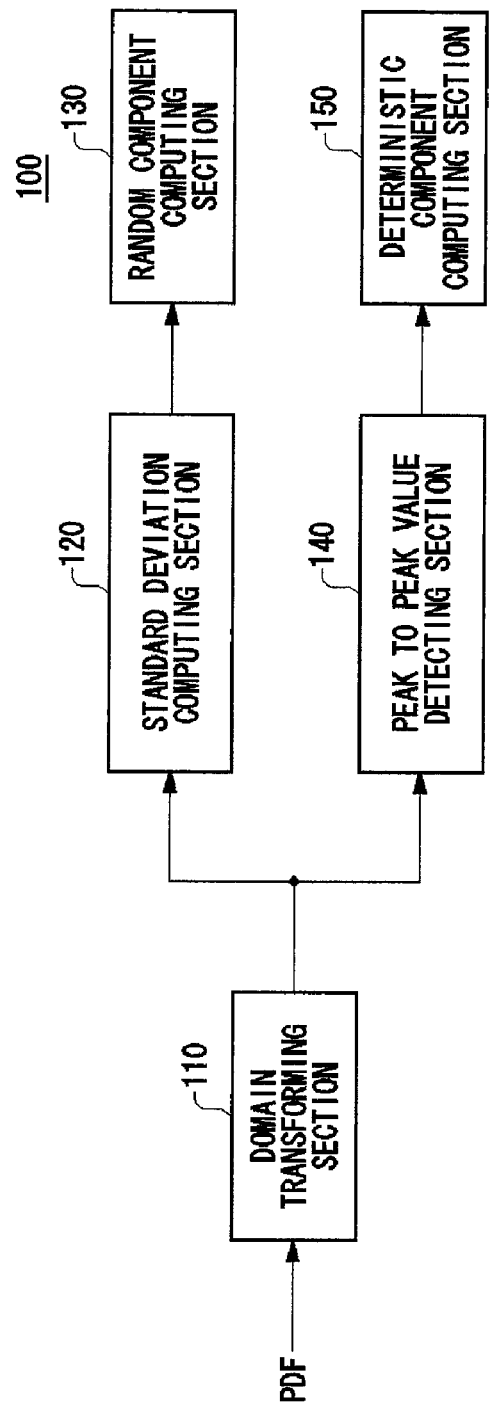
FIG. 1 is a view exemplary showing configurations of a probability density function separating apparatus 100 according to an embodiment of the present invention.

FIG. 1 is a view exemplary showing configurations of a probability density function separating apparatus 100 according to an embodiment of the present invention. The probability density function separating apparatus 100 is an apparatus that separates a predetermined component from a given probability density function, and includes an domain transforming section 110, a standard deviation computing section 120, a random component computing section 130, a peak to peak value detecting section 140, and a deterministic component computing section 150.

The probability density function separating apparatus 100 according to the present example separates a random component and a deterministic component from a given probability density function (hereinafter, referred to as an input PDF). Moreover, the probability density function separating apparatus 100 may separate either of a random component or a deterministic component from an input PDF. In this case, the probability density function separating apparatus 100 may have either combination of the standard deviation computing section 120 and the random component computing section 130 or the peak to peak value detecting section 140 and the deterministic component computing section 150.

The domain transforming section 110 is supplied with an input PDF, and transforms the input PDF into a spectrum of an axis representing a predetermined variable (a predetermined variable axis). For example, the domain transforming section 110 may receive an input PDF in the time axis, and transform the input PDF into a spectrum in the frequency domain. The domain transforming section 110 may perform Fourier transform on the input PDF to generate the spectrum.

When the input PDF is a function of a real number, the operation of performing Fourier transform on the input PDF can be considered equivalent to the operation of performing inverse Fourier transform on the input PDF. When the input PDF is a function of a real number (or a histogram formed by a real number data sequence), the domain transforming section 110 may perform inverse Fourier transform on the input PDF to compute a spectrum in a predetermined variable axis.

Alternatively, the domain transforming section 110 may receive an input PDF in the frequency axis, and compute a spectrum in the time axis by performing inverse Fourier transform on the input PDF. The domain transforming section 110 may compute a spectrum in a predetermined variable axis by performing cosine transform on the input PDF.

For example, an input PDF may be a function showing probability by which a predetermined signal is likely to have an edge for each of timing. In this case, the probability density function separating apparatus 100 separates a random jitter component and a deterministic jitter component included in this signal.

As mentioned above, an input PDF is not limited to the function of a time variable. When the domain transforming section 110 receives an input PDF with a predetermined variable, the domain transforming section 110 may consider this variable as a time variable and generate a spectrum of a frequency domain of the input PDF. That is to say, the present invention relates to an apparatus, a method and so on for separating a predetermined component from an input PDF that is not a time-variable function.

Moreover, an input PDF maybe digital data, and the domain transforming section 110 may have means for transforming an input PDF with an analog signal into a digital signal. The following explains how to transform the input PDF, which is a function of a real number in the time axis, into a spectrum in the frequency axis by Fourier transform or the like, for example.

The standard deviation computing section 120 computes standard deviation of a random component included in the input PDF based on a spectrum output from the domain transforming section 110. Since the random component included in the input PDF follows Gaussian distribution, the standard deviation computing section 120 computes standard deviation of this Gaussian distribution. A concrete computation method will be below described in FIGS. 2 to 7 and FIGS. 17 to 19.

The random component computing section 130 computes a probability density function of a random component based on the standard deviation computed from the standard deviation computing section 120. For example, according to the probability density function separating apparatus 100 in the present example as described below in FIGS. 2 to 7, it is possible to uniquely determine a random component (Gaussian distribution) included in the input PDF based on the standard deviation.

The random component computing section 130 may output Gaussian distribution based on standard deviation, or may output this standard deviation. Moreover, the random component computing section 130 may output this Gaussian distribution or this standard deviation in a time domain.

The peak to peak value detecting section 140 detects a peak to peak value of the input PDF based on the spectrum output from the domain transforming section 110. A concrete computation method will be below described in FIGS. 2 to 7.

The deterministic component computing section 150 computes a deterministic component of the input PDF based on the peak to peak value detected from the peak to peak value detecting section 140. A concrete computation method will be below described in FIGS. 2 to 7. The deterministic component computing section 150 may output a probability density function with a deterministic component in a time domain, or may output this peak to peak value.

Figure 2:
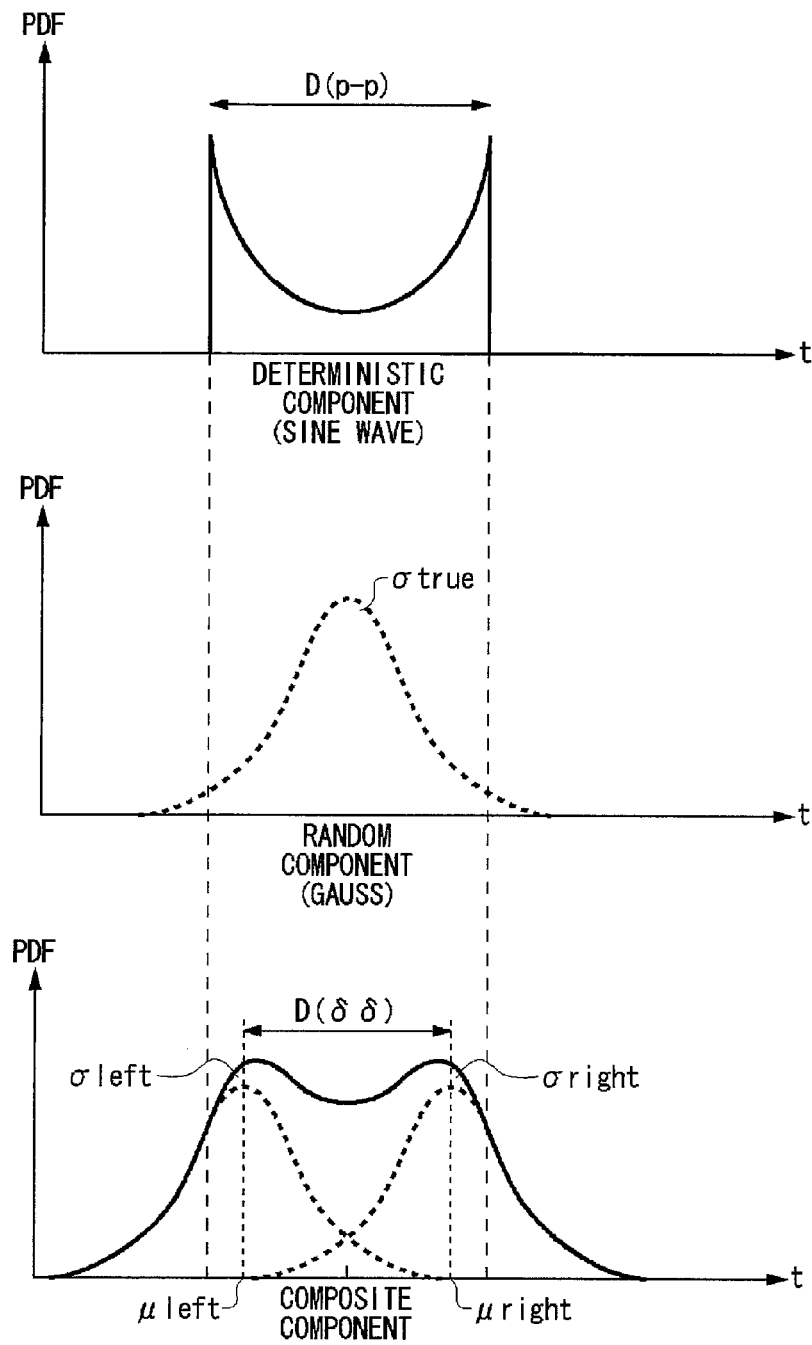
FIG. 2 is a view exemplary showing a waveform of an input PDF.

FIG. 2 is a view exemplary showing a waveform of an input PDF. In the present example, an input PDF includes a probability density function of a sine wave as a deterministic component. However, a deterministic component included in the input PDF is not limited to a sine wave. A deterministic component may be a probability density function with uniform distribution, triangular distribution, a probability density function with a dual Dirac model, a waveform prescribed by the other predetermined function. Moreover, a probability density function with a random component included in the input PDF follows Gaussian distribution. Furthermore, the deterministic component may be based on a combination of uniform distribution, sine wave distribution, triangular distribution and dual Dirac distribution. For example, the deterministic component may be represented by the following expression.

$$d1(t) - \alpha \times d2(\beta \times t)$$

Here, $\alpha$ and $\beta$ are any given coefficients, $d1(t)$ and $d2(t)$ are functions indicating any of the above-mentioned distributions.

Moreover, a deterministic component is determined by a peak interval $D(p-p)$ of the probability density function. For example, when a deterministic component is a sine wave, a peak appears at a position according to amplitude of a sine wave in the probability density function. Moreover, when a deterministic component is a square wave, a peak appears at a position according to amplitude of a square wave in the probability density function. Moreover, when a probability density function with a deterministic component is expressed by a dual Dirac model, a deterministic component is defined by an interval $D(p-p)$ between two delta functions. When a deterministic component is triangular distribution, a peak appears at a position according to the spread of a triangle in the probability density function.

A composite component (an input PDF) obtained by convolving a deterministic component and a random component is given by a convolution integral of a probability density function with a deterministic component and a probability density function with a random component as shown in FIG. 2. For this reason, a peak interval $D(\delta\delta)$ of a composite component becomes smaller than the peak interval $D(p-p)$ of a deterministic component. According to a conventional curve fitting method, $D(\delta\delta)$ is detected as a interval between two peaks determining a deterministic component. However, as described above, since $D(\delta\delta)$ becomes a value smaller than $D(p-p)$ of a true value, the separated deterministic component causes an error.

According to the conventional curve fitting method, each of the left-tail and right-tail peaks which are indicated by the solid line in the lowest graph in FIG. 2 is approximated with a Gaussian distribution. After this, the square root of the sum of the squares of the standard deviations ($\sigma$left and $\sigma$right) of the Gaussian distributions obtained from the left-tail and right-tail peaks is extracted. In this way, the standard deviation $\sigma$ of the random component can be computed. As illustrated in FIG. 2, however, the standard deviations $\sigma$left and $\sigma$right are larger than the true value $\sigma$true. Therefore, the standard deviation $\sigma$ obtained by the above computation becomes larger than the true value $\sigma$true. Consequently, an error is inevitable.

Figure 3:
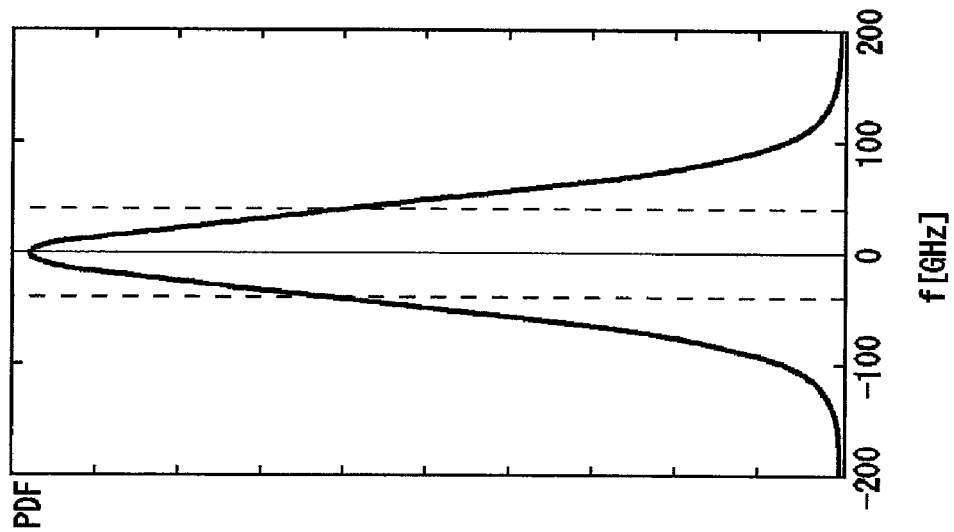
FIG. 3 is a view exemplary showing a probability density function with a random component and a spectrum thereof.
Figure 3:
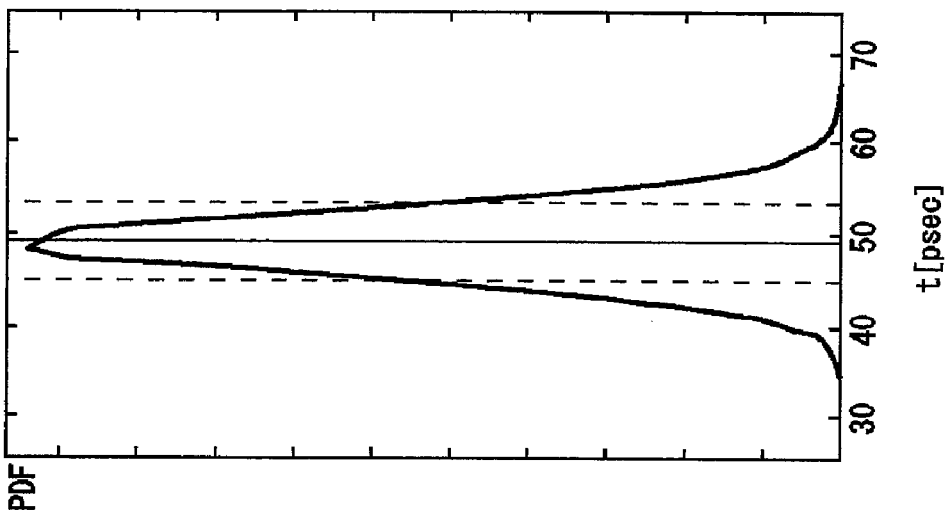

FIG. 3 is a view exemplary showing a probability density function with a random component. A left waveform shown in FIG. 3 shows a probability density function with a random component in a time domain and a right waveform shown in FIG. 3 shows a probability density function with a random component in a frequency domain. A random component $p(t)$ in a time domain is Gaussian distribution and is shown by the following Expression.

$$p(t) = \frac{1}{\sigma\sqrt{2\pi}} e^{-(t-u)^2/(2\sigma^2)} \qquad \text{Expression (1)}$$

Here, $\sigma$ shows standard deviation of Gaussian distribution, u shows time at which Gaussian distribution shows a peak.

Then, a random component $P(f)$ in a frequency domain obtained by performing Fourier transform on the random component $p(t)$ in a time domain is shown by the following Expression.

$$P(f) = Ce^{-f^2/2\sigma^2} \qquad \text{Expression (2)}$$

As shown in Expression (2), the result obtained by performing Fourier transform on Gaussian distribution also shows Gaussian distribution. At this time, Gaussian distribution in a frequency domain has a peak at zero frequency.

Figure 4A:
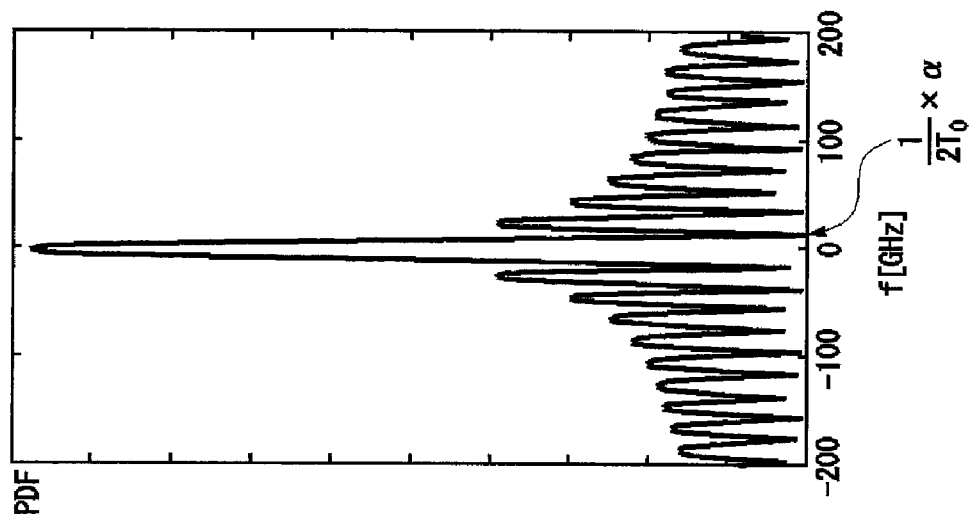
FIG. 4A is a view exemplary showing a probability density function with a deterministic component and a spectrum thereof.
Figure 4A:
Figure 4A:
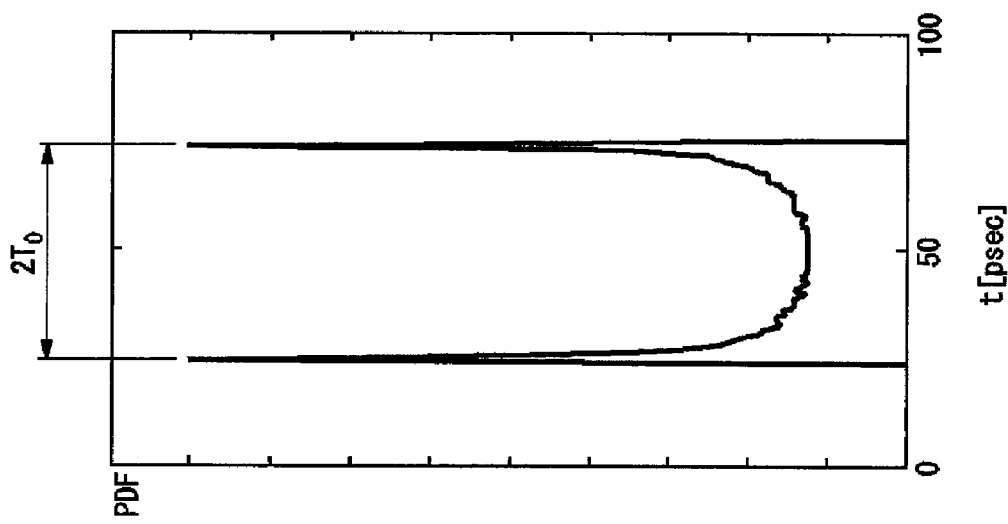

FIG. 4A is a view exemplary showing a probability density function with a deterministic component. A left waveform shown in FIG. 4A shows a probability density function with a deterministic component in a time domain and a right waveform shown in FIG. 4A shows a probability density function with a deterministic component in a frequency domain. Moreover, it is assumed that a peak interval of a probability density function with a deterministic component in a time domain is $2T_0$.

A spectrum obtained by performing Fourier transform on a waveform in this time domain has a first null at frequency obtained by multiplying a predetermined multiplier coefficient $\alpha$ by $1/(2T_0)$. That is to say, it is possible to obtain a peak interval $2T_0$ defining a deterministic component by detecting a first null frequency of a spectrum in a frequency domain. In addition, a multiplier coefficient α can be determined according to the type of distribution of a deterministic component included in a probability density function.

Figure 4B:
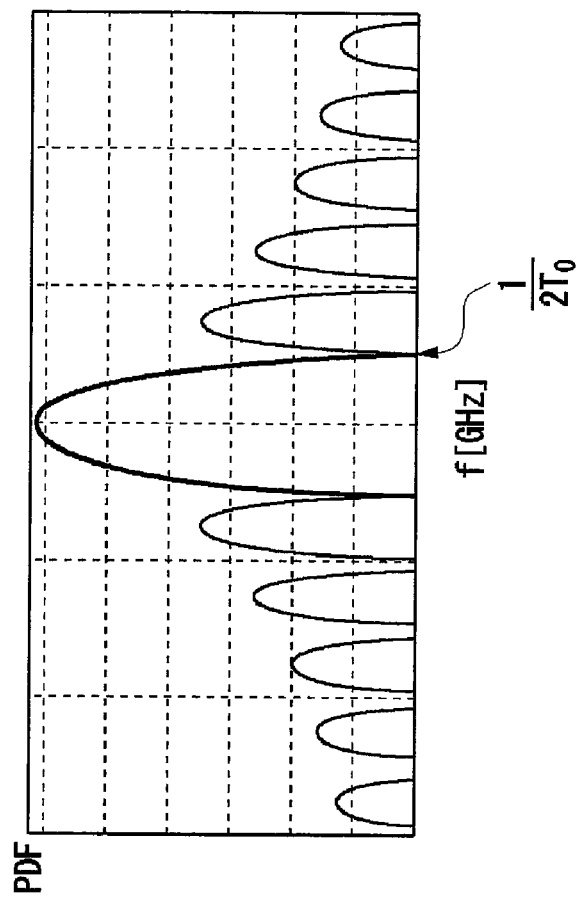
FIG. 4B is a view exemplary showing a probability density function with a deterministic component of uniform distribution.
Figure 4B:
Figure 4B:
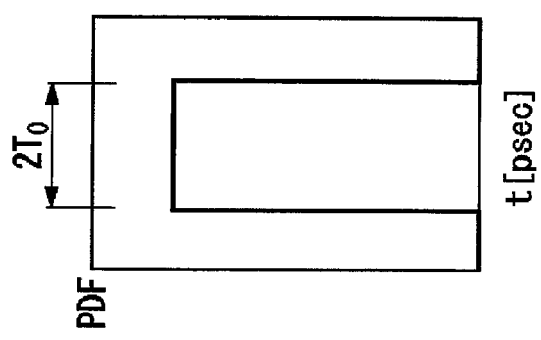
Figure 4C:
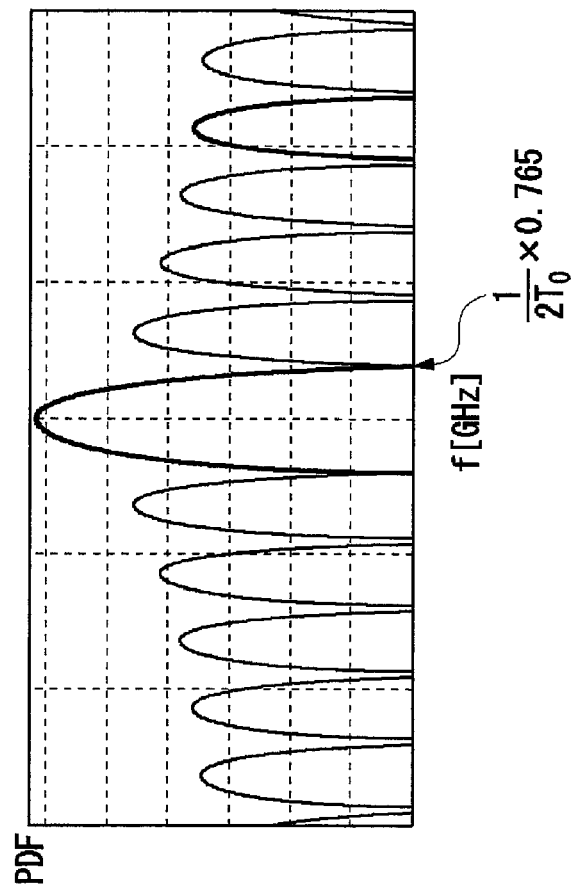
FIG. 4C is a view exemplary showing a probability density function with a deterministic component of sine wave distribution.
Figure 4C:
Figure 4C:
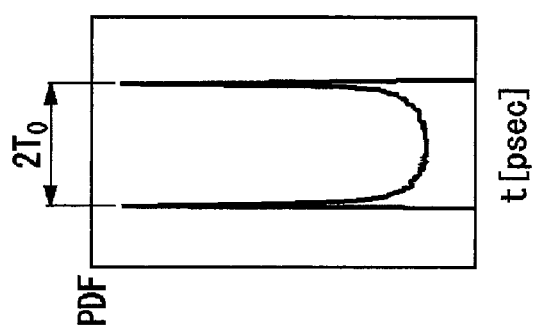
Figure 4D:
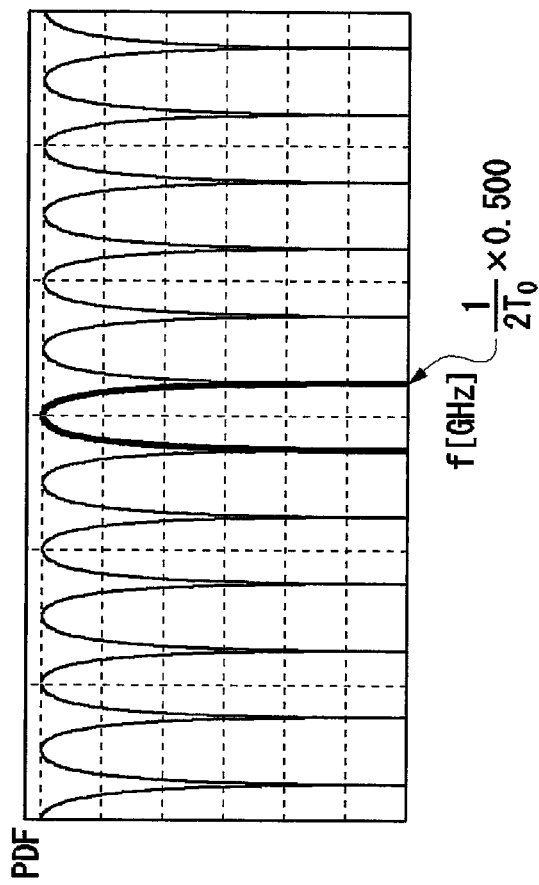
FIG. 4D is a view exemplary showing a probability density function with a deterministic component of dual Dirac distribution.
Figure 4D:
Figure 4D:
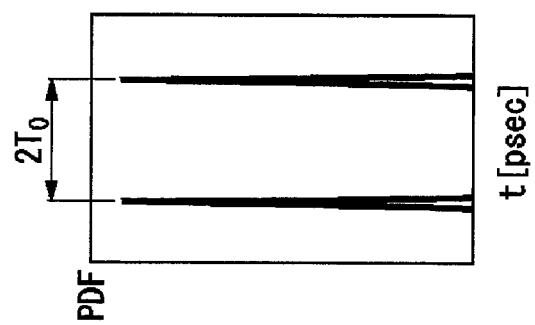
Figure 4E:
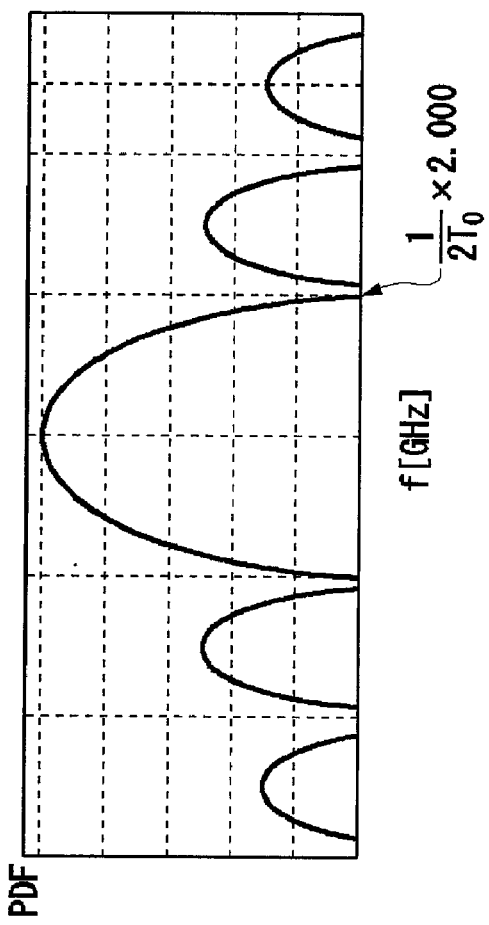
FIG. 4E is a view exemplary showing a probability density function with a deterministic component of triangular distribution.
Figure 4E:
Figure 4E:
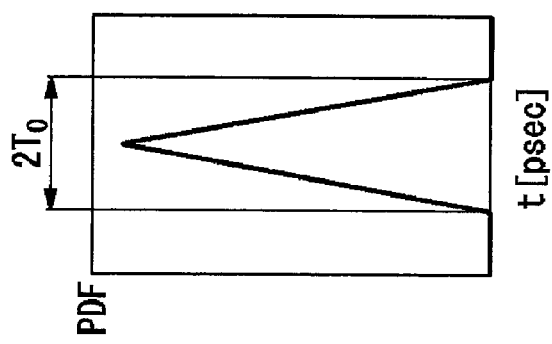

FIG. 4B is a view exemplary showing a probability density function with a deterministic component of uniform distribution. Moreover, FIG. 4C is a view exemplary showing a probability density function with a deterministic component of sine wave distribution. Moreover, FIG. 4D is a view exemplary showing a probability density function with a deterministic component of dual Dirac distribution. Moreover, FIG. 4E is a view exemplary showing a probability density function with a deterministic component of triangular distribution.

Left waveforms of FIG. 4B, FIG. 4C, FIG. 4D and FIG. 4E show a probability density function with a deterministic component in a time domain and right spectra of FIG. 4B, FIG. 4C, FIG. 4D and FIG. 4E shows a probability density function with a deterministic component in a frequency domain. Moreover, it is considered that a peak interval of a probability density function with a deterministic component in a time domain is $2T_0$.

As shown in FIG. 4B, a first null frequency of a spectrum obtained by performing Fourier transform on a probability density function with a deterministic component of uniform distribution is substantially $1/2T_0$. That is to say, it is possible to compute a peak interval $2T_0$ by multiplying a multiplier coefficient α=1 by an reciprocal number of the first null frequency.

Moreover, as shown in FIG. 4C, a first null frequency of a spectrum obtained by performing Fourier transform on a probability density function with a deterministic component of sine wave distribution is substantially $0.765/2T_0$. That is to say, it is possible to compute a peak interval $2T_0$ by multiplying a multiplier coefficient α=0.765 by an reciprocal number of the first null frequency.

Furthermore, as shown in FIG. 4D, a first null frequency of a spectrum obtained by performing Fourier transform on a probability density function with a deterministic component of dual Dirac distribution is substantially $0.500/2T_0$. That is to say, it is possible to compute a peak interval $2T_0$ by multiplying a multiplier coefficient α=0.500 by a reciprocal number of the first null frequency.

Furthermore, as shown in FIG. 4E, a first null frequency of a spectrum obtained by performing Fourier transform on a probability density function of a deterministic component of triangular distribution is substantially $2.000/2T_0$. That is to say, it is possible to compute a peak interval $2T_0$ by multiplying a multiplier coefficient α=2.000 by a reciprocal number of the first null frequency.

Figure 5:
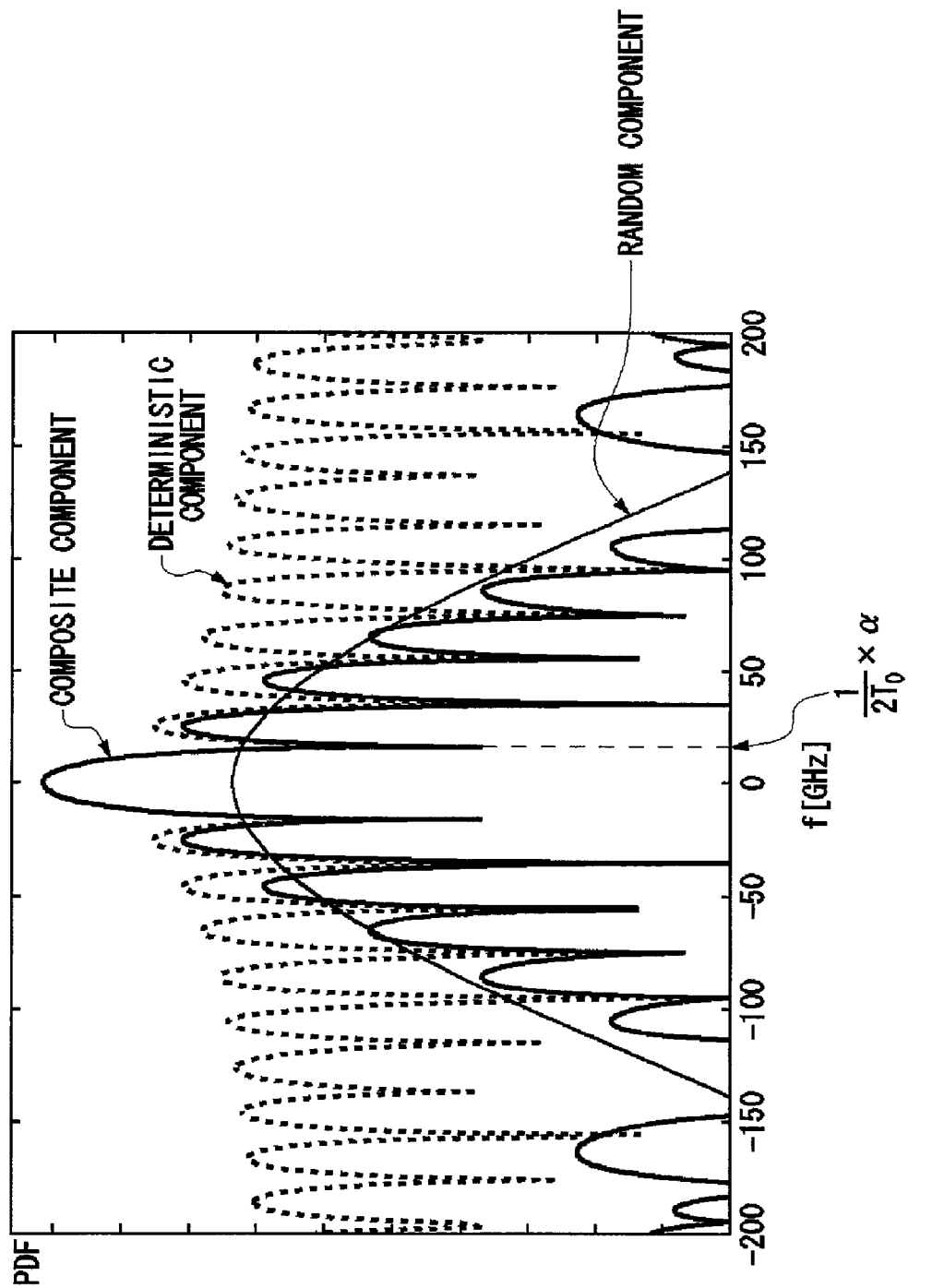
FIG. 5 is a view exemplary showing a spectrum of a probability density function obtained by convolving a deterministic component and a random component.

FIG. 5 is a view exemplary showing a spectrum of a probability density function obtained by convolving a deterministic component and a random component. A function obtained by convolving (a convolution integral) a probability density function with a deterministic component and a probability density function with a random component in a time domain becomes an input PDF. Moreover, a convolution integral in a time domain is multiplication of spectra in a frequency domain. That is to say, a spectrum of an input PDF is shown by a product of a spectrum of a probability density function with a deterministic component and a spectrum of a probability density function with a random component.

In FIG. 5, a deterministic component is shown with a dashed line and a random component is shown with a Gaussian curve of a solid line. When a random component is multiplied by a deterministic component, each peak spectrum of the deterministic component is attenuated in proportion to loss of a Gaussian curve. For this reason, it is possible to obtain a Gaussian curve that provides a random component in a frequency domain by detecting an input PDF, i.e., a level of predetermined frequency of a spectrum of a composite component.

The standard deviation computing section 120 may compute standard deviation for a Gaussian curve based on a variable component, in a predetermined variable axis, of the spectrum of the input PDF. The standard deviation computing section 120 relating to the present example may compute standard deviation for a Gaussian curve based on the level of the predetermined frequency component of the input PDF. The random component computing section 130 may compute a Gaussian curve in a frequency domain as shown in FIG. 5. At this time, as described in FIG. 3, a Gaussian curve in a frequency domain uses zero frequency as a reference. For this reason, the random component computing section 130 can easily compute this Gaussian curve based on the standard deviation computed from the standard deviation computing section 120.

Moreover, as described in FIG. 4, $D(p-p)=2T_0$ defining a deterministic component can be obtained from the first null frequency of the spectrum of the deterministic component. Since a peak to peak value of the spectrum of the deterministic component is preserved even when multiplying a Gaussian curve, a value of $D(p-p)$ can be computed from the first null frequency of the spectrum of the input PDF.

The peak to peak value detecting section 140 detects a peak to peak value based on a value, in a predetermined variable axis, of a first null of the spectrum of the input PDF. The peak to peak value detecting section 140 relating to the present example detects a peak to peak value from the first null frequency of the spectrum of the input PDF. As described above, the peak to peak value detecting section 140 may multiply a multiplier coefficient α according to the type of distribution of a deterministic component included in a given probability density function by the first null frequency of the spectrum of the probability density function and compute a peak to peak value of the probability density function with the deterministic component.

Moreover, the peak to peak value detecting section 140 may previously store a multiplier coefficient every type of distribution of a deterministic component and compute a peak to peak value by means of a multiplier coefficient corresponding to the reported type of distribution of the deterministic component. For example, the peak to peak value detecting section 140 may previously store a multiplier coefficient α for distribution of each deterministic component such as a sine wave, uniform distribution, triangular distribution, or a dual Dirac model. A multiplier coefficient α for each deterministic component can be previously obtained, for example, by performing Fourier transform on a probability density function with a deterministic component of which a peak to peak value has been known and detecting the first null frequency of the spectrum.

Moreover, the peak to peak value detecting section 140 may compute a peak to peak value when using each previously given multiplier coefficient α. The deterministic component computing section 150 may select a value that seems to be the most definite among the peak to peak values computed from the peak to peak value detecting section 140. For example, the deterministic component computing section 150 may respectively compute a probability density function with a deterministic component based on each peak to peak value and compare the computed probability density function with the given probability density function, in order to select a peak to peak value.

Moreover, the deterministic component computing section 150 may compare a composite probability density function obtained by synthesizing a probability density function corresponding to each peak to peak value and a probability density function with a random component computed from the random component computing section 130 and the given probability density function, in order to select a peak to peak value.

Since a null value of a spectrum is sharply changed in comparison with a peak of a spectrum, it is possible to detect a peak to peak value with high precision in comparison with when a peak to peak value is computed based on peak frequency of a spectrum. Moreover, as an absolute value of frequency becomes large, null frequency has a large error for a peak to peak value. For this reason, it is possible to detect a peak to peak value with high precision by detecting a peak to peak value based on a first null frequency of which an absolute value is the smallest.

However, when detecting a peak to peak value, frequency is not limited to null frequency of which an absolute value is the smallest. For example, a peak to peak value may be detected based on at least one null frequency that is selected from the predetermined number of frequency having a small absolute value.

Moreover, a multiplier coefficient $\alpha$ is not limited to a value described in FIG. 4B, FIG. 4C, and FIG. 4D. The peak to peak value detecting section 140 can appropriately use a multiplier coefficient $\alpha$ substantially equal to this value. Moreover, the peak to peak value detecting section 140 may differentiate a spectrum of a probability density function by frequency and detect a first null frequency based on a differential result. That is to say, the null frequency is not limited to a null frequency which can be clearly detected in the spectrum. For example, when a null frequency is difficult to be clearly detected in the spectrum g(f) as illustrated in FIGS. 6B and 7, the frequency f1 which is detected in the second-order derivative spectrum g"(f) may be used as the null frequency.

Figure 6A:
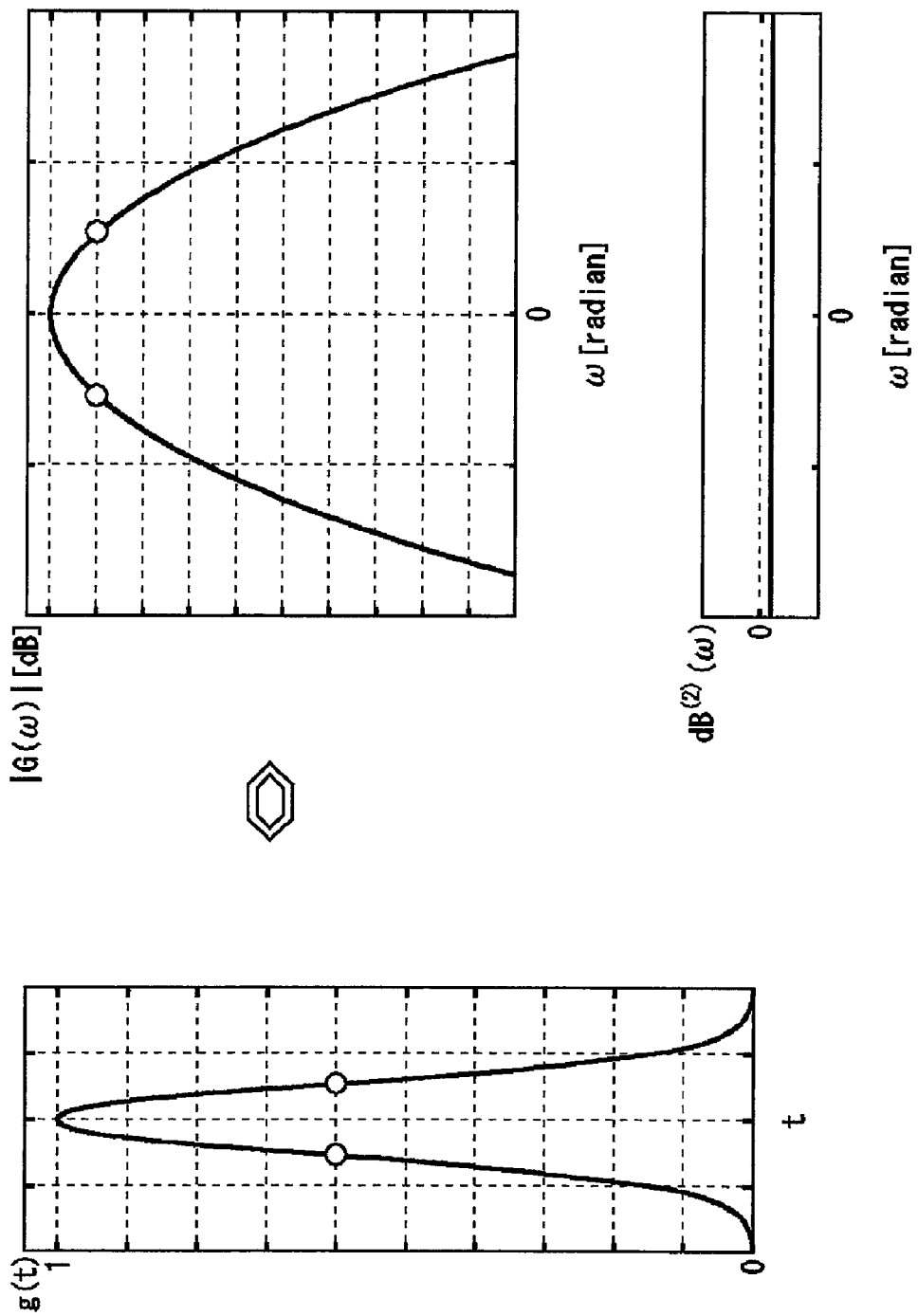
FIG. 6A is a view exemplary showing a probability density function with a random component, a spectrum of the probability density function, and the second-order derivative of the spectrum with respect to the frequency.

FIG. 6A illustrates, as an example, a second-order derivative ($dB^{(2)}(\omega)$) of a spectrum $G(\omega)$ of a probability density function g(t) with a random component with respect to the frequency. It should be noted that the probability density function g(t) illustrated in FIG. 6A does not contain a deterministic component. The second-order derivative spectrum $dB^{(2)}(\omega)$ takes a constant value, and thus has no peaks. Therefore, a peak of a second-order derivative spectrum of a probability density function containing therein both random and deterministic components corresponds to a peak of a second-order derivative spectrum of the deterministic component, which is to say, a first null frequency in the spectrum of the deterministic component.

Figure 6B:
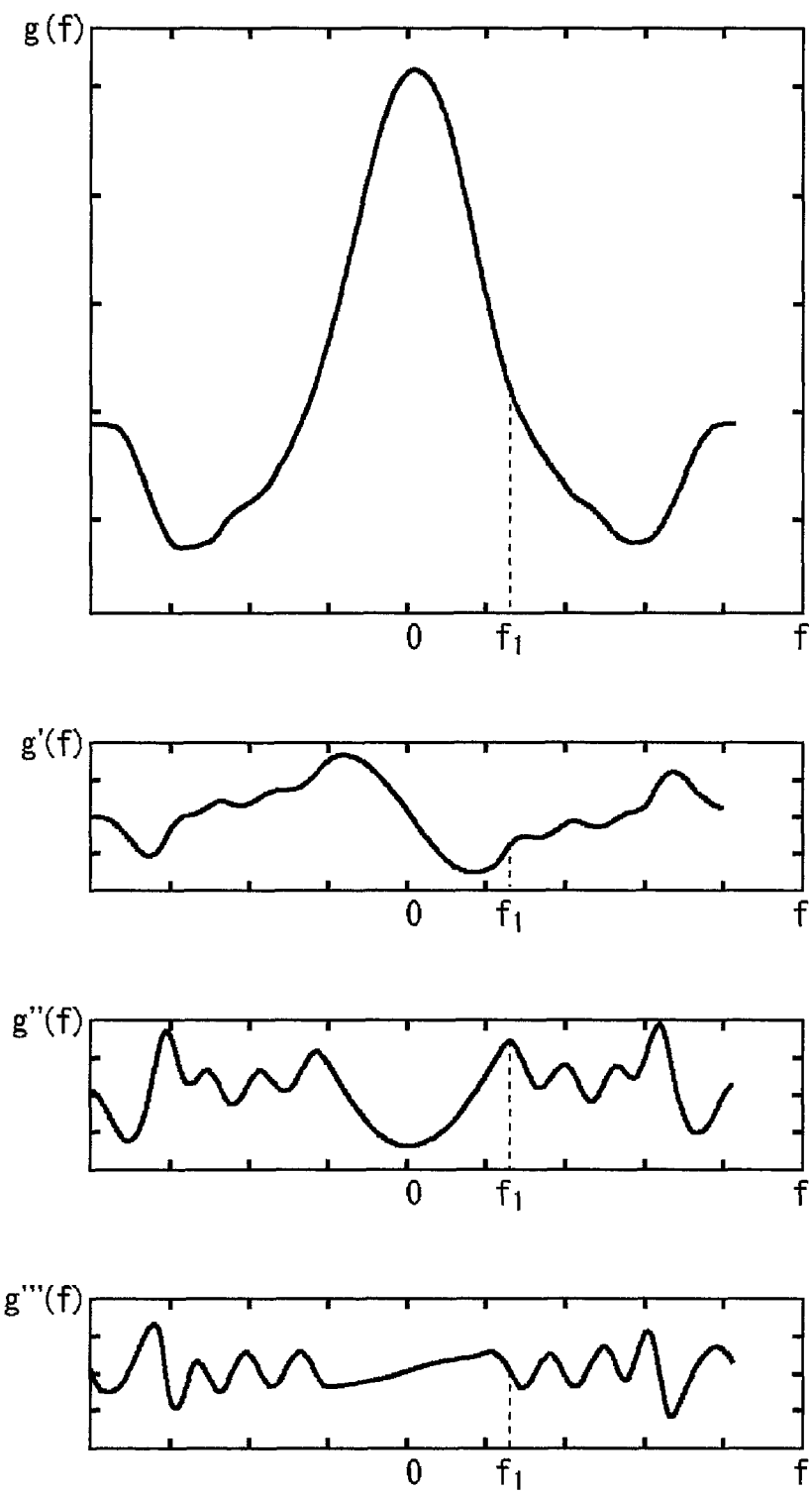
FIG. 6B is a view exemplary showing a spectrum of a probability density function, which corresponds to the convolution of a deterministic component and a random component, and a result obtained by differentiating the spectrum with respect to frequency.
Figure 7:
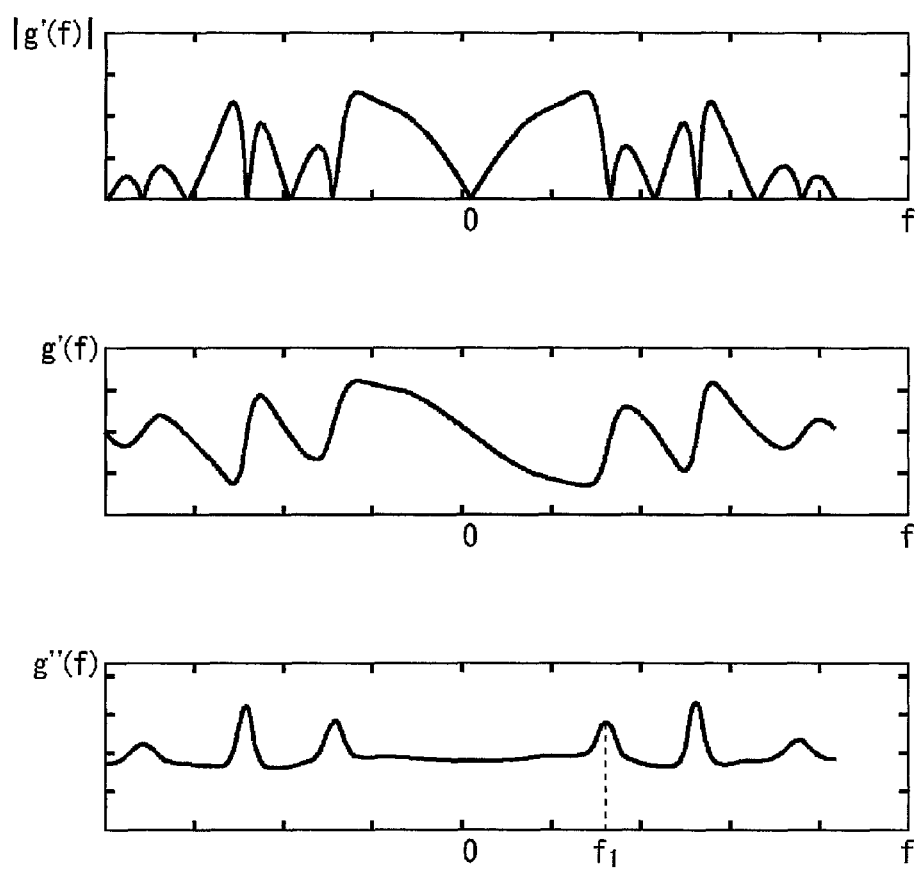
FIG. 7 is a view showing another example of a result obtained by differentiating a spectrum of a probability density function with respect to frequency.

FIG. 6B is a view exemplary showing a result obtained by differentiating a spectrum of a probability density function containing thereon random and deterministic components, with respect to frequency. In the present example, it is considered that a first null frequency of a spectrum is f1. As shown in FIG. 4A, when a given probability density function has a few noises, the first null frequency of a spectrum can be precisely detected. Correspondingly, when a given probability density function has noises, as shown in a spectrum g(f) in FIG. 6B, the first null may not be detected from frequency f1 to be detected.

In this case, as shown in FIG. 6B, it is possible to detect the first null frequency with high precision by differentiating this spectrum with respect to frequency. As shown in FIG. 6B, a peak of a second-order derivative spectrum g"(f) of this spectrum g(f) corresponds to a null of the spectrum g(f). For this reason, the peak to peak value detecting section 140 may second-order differentiate a spectrum of a probability density function and detect the first null frequency based on peak frequency of the derivative spectrum.

FIG. 7 is a view showing another example of a result obtained by differentiating a spectrum of a probability density function with respect to frequency. In this example, there is shown a result obtained by differentiating a spectrum of a probability density function without noises as shown in FIG. 4A.

Since a null of a spectrum is a point at which an inclination of a spectrum of a spectrum changes from a negative to a positive, it is possible to detect a null of a spectrum by detecting a peak of a second-order derivative spectrum g"(f)

By such a method, as shown in FIG. 6B, it is possible to more precisely detect the first null frequency even if noises are large. The peak to peak value detecting section 140 may detect frequency of which an absolute value is the smallest as the first null frequency among peaks of the second-order derivative spectrum g"(f).

Figure 8:
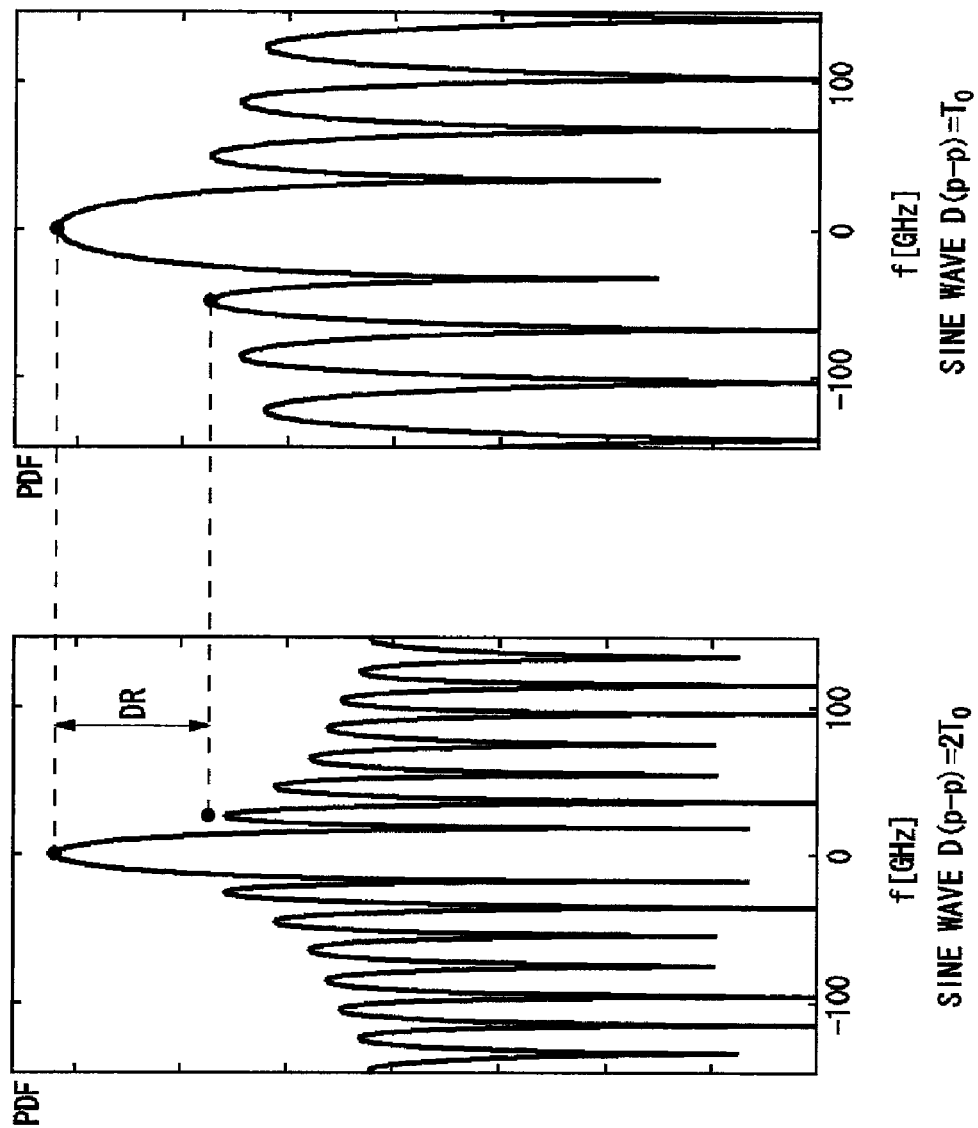
FIG. 8 is a view exemplary showing a spectrum of a deterministic component of which a value of D(p-p) is different.

FIG. 8 is a view exemplary showing a spectrum of a deterministic component of which a value of D(p-p) is different. A left waveform shown in FIG. 8 shows a spectrum in case of $D(p-p)=2T_0$ and a right waveform shown in FIG. 8 shows a spectrum in case of $D(p-p)=T_0$. Although the value of D(p-p) changes, a ratio between a level of a main lobe of zero frequency and a peak level of each side lobe does not change. That is to say, relative level of each spectrum of a probability density function with a deterministic component is uniquely determined according to whether the deterministic component is a sine wave, uniform distribution, triangular distribution, or a dual Dirac model.

For this reason, it is possible to obtain a spectrum of a random component by detecting a ratio between corresponding peak levels in a spectrum of a deterministic component and a spectrum of an input PDF. Here, it is noted that this level ratio depends on attenuation of a spectrum of a deterministic component caused by a random component.

Figure 9:
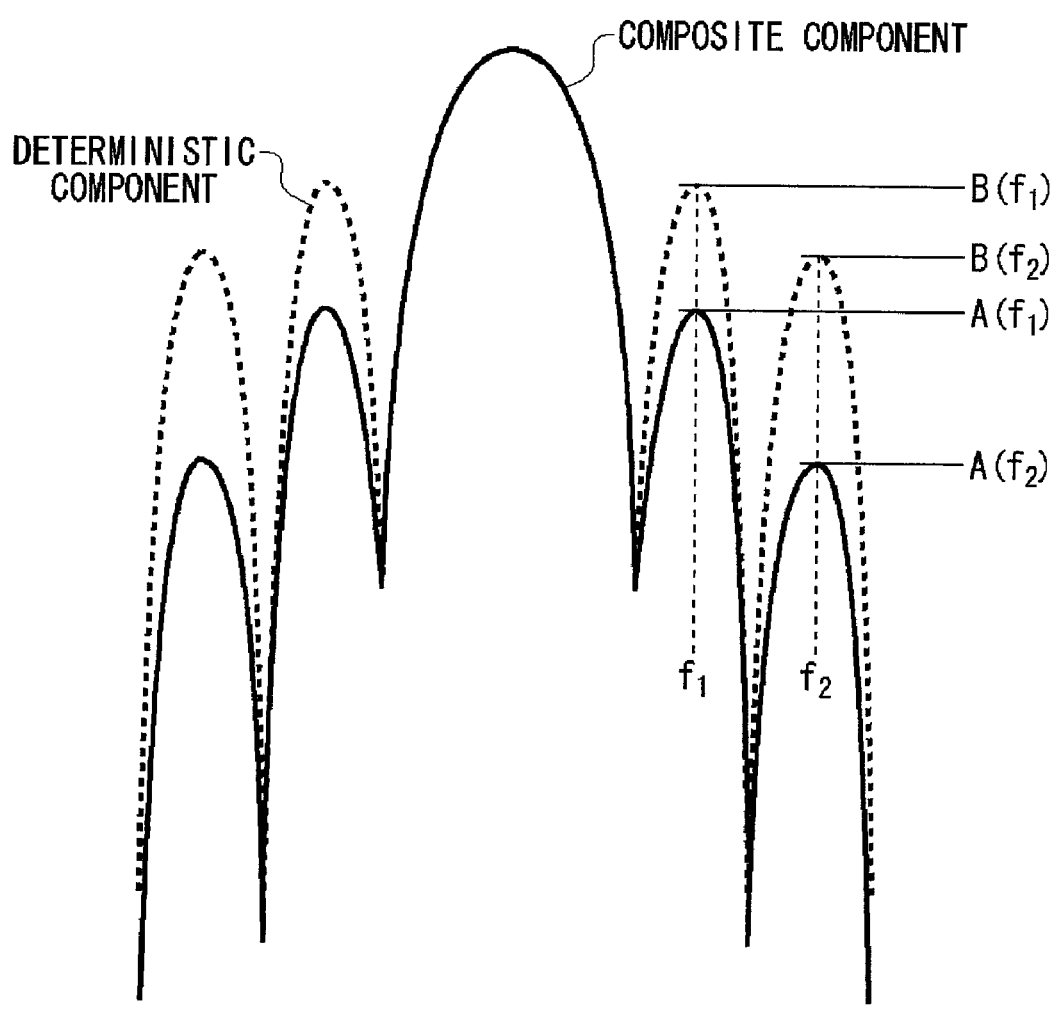
FIG. 9 is a view exemplary explaining a procedure for computing standard deviation of a random component.

FIG. 9 is a view exemplary explaining a method for computing standard deviation of a random component. A Gaussian curve in a frequency domain showing a random component is given by Expression (2). When a base takes a logarithm of e for Expression (2), a quadratic function of f is obtained like Expression (3).

$$\log_e P(f) = \log_e C e^{-f^2/2\sigma^2} \qquad \text{Expression (3)}$$
$$= \log_e C - \frac{f^2}{2\sigma^2}$$

Here, as shown in FIG. 9, it is assumed that frequency of a first peak of a spectrum (a composite component) of an input PDF is f1 and a level is A(f1) and that frequency of a second peak is f2 and a level is A(f2). At this time, a level ratio between the first peak and the second peak is expressed by Expression (4).

$$\log \frac{A(f_2)}{A(f_1)} = \log_e A(f_2) - \log_e A(f_1) \qquad \text{Expression (4)}$$
$$= -\frac{f_2^2 - f_1^2}{2\sigma^2}$$

For this reason, it is possible to compute standard deviation based on a level ratio between two frequency components of a spectrum of an input PDF. The standard deviation computing section 120 may compute standard deviation based on a level ratio between a first frequency component and a second frequency component of the spectrum of the input PDF. According to Expression (4), precise measurement for dual Dirac is given. Moreover, an approximate solution for other deterministic components is given.

Moreover, it is preferable that these two frequency components are peaks of the spectrum of the input PDF. The standard deviation computing section 120 may compute standard deviation based on a level ratio between any two peaks of the input PDF.

A level of the peak of the spectrum of the input PDF shows resultant attenuation in a peak level of a spectrum of a deterministic component caused by a spectrum of a random component. For this reason, when a level of each peak of the spectrum of the deterministic component is constant, it is possible to compute standard deviation with high precision based on Expression (4).

Moreover, when a level of each peak of the spectrum of the deterministic component is not constant, the standard deviation computing section 120 may compute standard deviation further based on the level of the peak of the spectrum of the deterministic component. That is to say, the standard deviation computing section 120 may compute standard deviation based on a level ratio between a predetermined frequency component of the spectrum of the input PDF and a frequency component corresponding to a spectrum obtained by transforming a probability density function with a deterministic component into a frequency domain. In this case, the standard deviation computing section 120 may compute standard deviation based on Expression (5). Here, B(f1) is a level of the first peak of the spectrum of the deterministic component, and B(f2) is the second level of the spectrum of the deterministic component. Here, the frequency f2 may be a frequency contained in the main or side lobe of the spectrum.

$$-\frac{1}{2\sigma^2} = \frac{1}{f_2^2 - f_1^2} \cdot \log\left(\frac{A(f_2)}{B(f_2)} \bigg/ \frac{A(f_1)}{B(f_1)}\right) \quad \text{Expression (5)}$$

In addition, standard deviation can be obtained according to a procedure equal to Expression (5). For example, in Expression (5), standard deviation is computed based on a value obtained by dividing a level ratio A(f2)/B(f2) between the input PDF in the second frequency component and the spectrum of the deterministic component by a level ratio A(f1)/B(f1) in the first frequency component. Similarly, standard deviation may be obtained based on a value obtained by dividing a level ratio A(f2)/A(f1) between the second frequency component in the input PDF and the first frequency component by a level ratio B(f2)/B(f1) between the second frequency component in the deterministic component and the first frequency component.

A spectrum of a probability density function of a random component and a spectrum of a probability density function of a deterministic component both take their maximum values at dc (f=0) as illustrated in FIG. 3 and FIGS. 4A to 4E. Therefore, when division is performed on the magnitudes of the respective frequency components by using the values of the spectra at f1=dc, A(f1)=B(f1)=1.0. Accordingly, A(f2)/A(f1)=A(f2) and B(f2)/B(f1)=B(f2). As a result, the standard deviation of the random component can be computed by using the magnitude of the component at the single frequency f2.

In this case, a ratio between a magnitude of the second frequency component and a magnitude of the first frequency component in the spectrum of the probability density function with the deterministic component may be given in advance. The standard deviation computing section 120 may store this magnitude ratio on a memory in advance. This magnitude ratio can be determined according to the type of distribution of the deterministic component included in the input PDF in advance. Particularly, when the deterministic component is given with a function of dual Dirac, this magnitude ratio is 1.0.

Moreover, a spectrum of a deterministic component can be obtained based on the above-described D(p–p). A deterministic component is determined by a value of D(p–p) as described above and whether the deterministic component is given by a sine wave, uniform distribution, triangular distribution, or dual Dirac.

The deterministic component computing section 150 may compute a deterministic component by being previously supplied with a function corresponding to a sine wave, uniform distribution, triangular distribution, dual Dirac, or the like defining the deterministic component and applying a peak to peak value detected from the peak to peak value detecting section 140 to this function. In this case, the random component computing section 130 computes a random component based on the spectrum of the deterministic component computed from the deterministic component computing section 150.

Moreover, assuming that f1=0 in Expression (5), since the magnitude of the spectrum of the input PDF in f1=0 and the magnitude of the spectrum in the deterministic component are equal to each other, Expression (5) becomes like Expression (6). The frequency f2 may be a frequency contained in the main or side lobe of the spectrum.

$$-\frac{1}{2\sigma^2} = \frac{1}{f_2^2} \cdot \log\left(\frac{A(f_2)}{B(f_2)}\right) \quad \text{Expression (6)}$$

The standard deviation computing section 120 may compute standard deviation based on Expression (6). That is to say, the standard deviation computing section 120 may compute standard deviation from a magnitude ratio between any corresponding peaks in the spectrum of the input PDF and the probability density function with the deterministic component. In this case, it is possible to compute standard deviation by simpler measurement and with high precision.

Moreover, the standard deviation computed based on Expression (5) and Expression (6) is standard deviation of Gaussian distribution in a frequency domain. The standard deviation computing section 120 may compute standard deviation σt in a time domain based on standard deviation σf in a frequency domain. Relation between σf and σt is expressed by Expression (7).

$$\sigma_t = \frac{1}{2\pi}\sqrt{2\sigma_f^2} \quad \text{Expression (7)}$$

In this way, it is possible to compute a probability density function in a time domain of a random component.

It is possible to obtain a Gaussian curve in a frequency domain from Expression (2) by means of σf. A Gaussian curve in a time domain of Expression (1) may be directly obtained by performing Fourier transform on the Gaussian curve in the frequency domain. In other words, a probability density function in a time domain of a random component can be directly obtained from the Gaussian curve in the frequency domain.

FIG. 10 is a view exemplary showing a measurement result by a probability density function separating apparatus 100 described with reference to FIG. 9 and a measurement result by a conventional curve fitting method described in FIG. 2. In the present example, distribution in which a peak to peak value of a deterministic component is 50 ps and a random component is 4.02 ps is used as a probability density function to be measured. Moreover, for a sampling timing in sampling a measuring object, two cases was studied: one case of timing error in sampling and another case of zero timing error in sampling. As shown in FIG. 10, the probability density function separating apparatus 100 can obtain a measurement result with a smaller error than a conventional curve fitting method in any cases.

Figure 11:
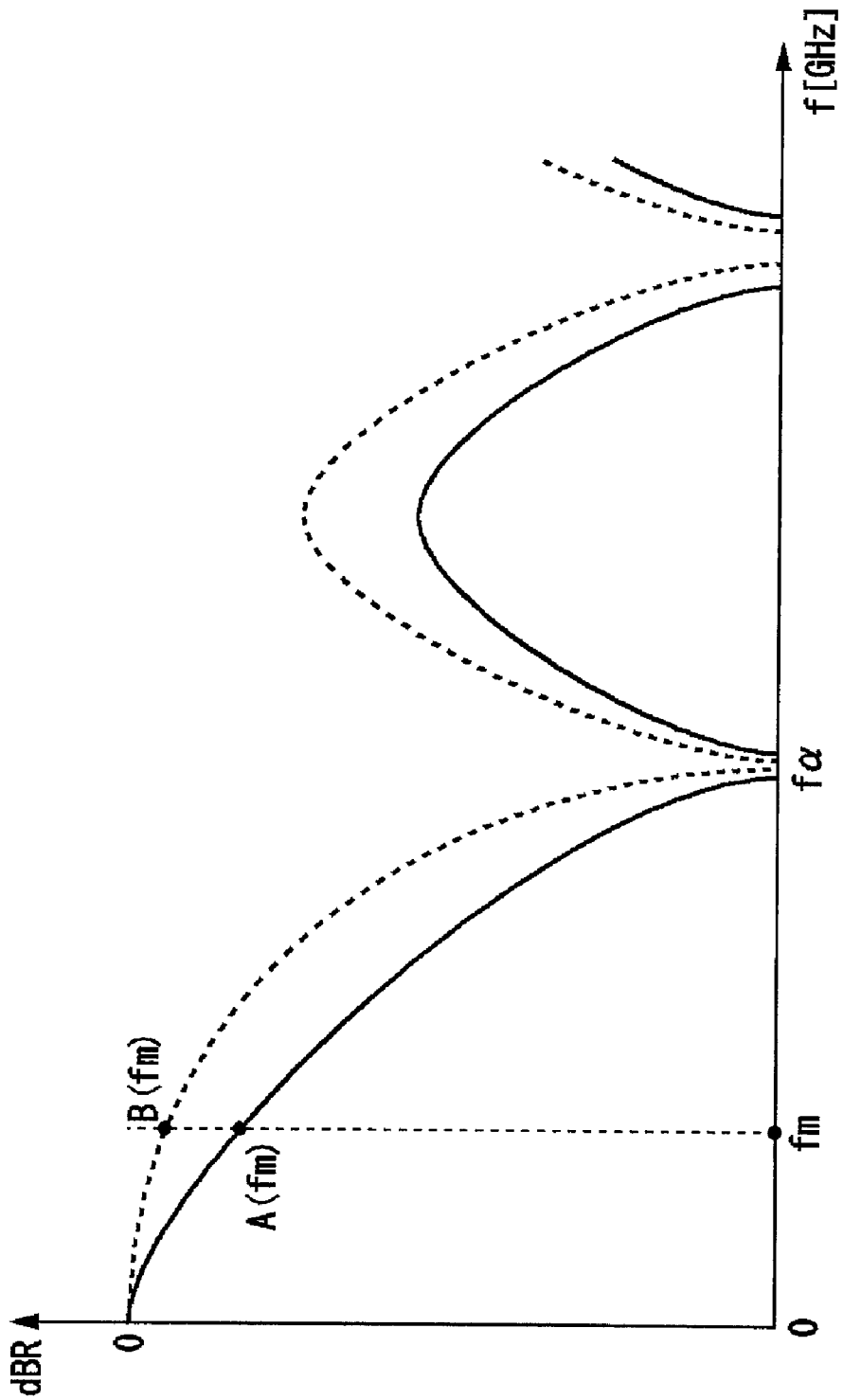
FIG. 11 is used to explain an exemplary method to compute the standard deviation of a random component.

FIG. 11 is used to explain an exemplary method to compute the standard deviation of the random component. In FIG. 11, the frequency is plotted along the horizontal axis, and the magnitude spectrum of the probability density function is plotted along the vertical axis. In FIG. 11, a spectrum B(f) indicated by the dotted line is an ideal spectrum for the deterministic component contained in the probability density function, and a spectrum A(f) indicated by the solid line is the spectrum of a given probability density function.

The method described with reference to FIG. 9 computes the standard deviation of the random component from the magnitudes of the side lobes. However, the given (or measured) probability density function contains errors therein due to measurement errors and the like. Such errors affect the side lobes more notably than the main lobe since the side lobes have a smaller magnitude than the main lobe. For this reason, when the standard deviation of the random component is computed from the magnitudes of the side lobes, the obtained standard deviation may have relatively large errors. Here, the main lobe of the spectrum may indicate the lobe which contains therein, for example, a frequency component at 0 Hz or the carrier frequency of the signal, and the side lobes may indicate lobes of the spectrum excluding the main lobe.

On the other hand, the probability density function separating apparatus 100 relating to the present embodiment computes the standard deviation of the random component based on the magnitude (A(fm)) of a component at a predetermined frequency (fm) in the main lobe of the spectrum of the probability density function. For example, the standard deviation computing section 120 may compute the standard deviation of the random component based on the magnitude (A(fm)) of the component at the predetermined frequency (fm) in the main lobe of the spectrum (A(f)) of a given probability density function and the magnitude (B(fm)) of the component at the same frequency (fm) in the main lobe of an ideal spectrum (B(f)) for the deterministic component of the probability density function.

Here, the ideal spectrum for the deterministic component can be obtained based on the type of the deterministic component contained in the probability density function and the first null frequency (fα). For example, the peak to peak value of the deterministic component can be computed based on the first null frequency (fα) and the type of the deterministic component as described with reference to FIG. 4.

It is then possible, as illustrated in FIG. 4, to uniquely determine a probability density distribution which has the computed peak to peak value and corresponds to the deterministic component type. By performing Fourier transform on the probability density distribution, the ideal spectrum for the deterministic component can be obtained. In the probability density function separating apparatus 100 relating to the present example, the deterministic component computing section 150 may compute the ideal spectrum for the deterministic component, and supplies the obtained ideal spectrum for the deterministic component to the standard deviation computing section 120.

As mentioned above, the standard deviation computing section 120 computes the standard deviation of the random component based on the magnitudes A(fm) and B(fm) of the spectra. In more detail, the standard deviation computing section 120 may compute the standard deviation a by using, for example, the following expression which is similar to Expression (6).

$$-\frac{1}{2\sigma^2} = \frac{1}{f_m^2} \cdot \log\left(\frac{A(f_m)}{B(f_m)}\right)$$

Here, the magnitudes of the spectra are detected at the predetermined frequency fm which may be designated in advance by a user or the like. The standard deviation computing section 120 may use, as the predetermined frequency fm, a frequency in the main lobe of the ideal spectrum for the deterministic component which falls within such a range that the amount of attenuation of the component at the frequency fm is smaller than a predetermined value. This frequency range may be determined by the user or the like.

Figure 12:
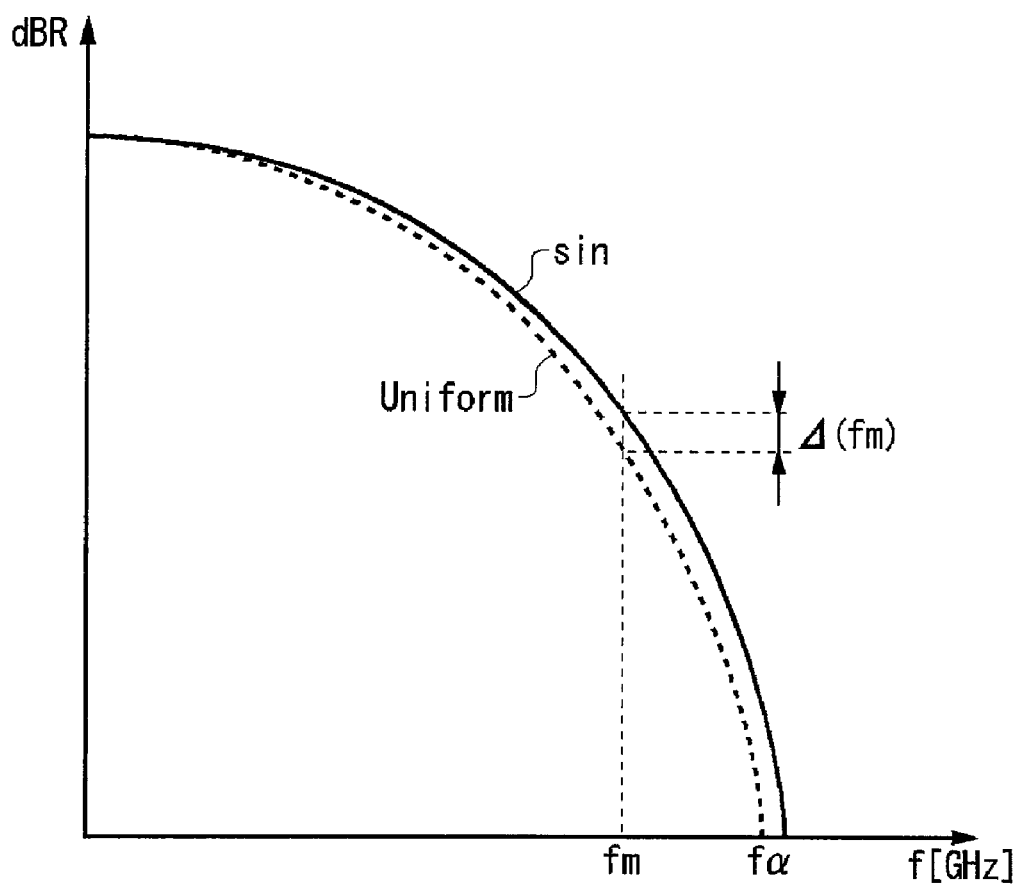
FIG. 12 illustrates, as an example, ideal spectra for a deterministic component of a sine wave distribution and a deterministic component of uniform distribution.

FIG. 12 illustrates, as an example, ideal spectra for a deterministic component of a sine wave distribution and a deterministic component of uniform distribution. In FIG. 12, the solid line indicates a spectrum of a deterministic component of a sine wave distribution, and the dotted line indicates a spectrum of a deterministic component of uniform distribution. FIG. 12 shows the main lobes of the respective spectra.

As seen from FIG. 12, for the deterministic components of different types, the spectrum shapes of the main lobs are different from each other, even when the deterministic components are associated with the same first null frequency. For this reason, when the type of the deterministic component contained in the probability density function is unknown, the computed value of the standard deviation may have an error which is attributed to the different shapes.

As mentioned above, the standard deviation computing section 120 may use, as the predetermined frequency fm, a frequency in the main lobe of the ideal spectrum of deterministic component, which falls within such a range that the difference between the magnitudes of the components at the frequency fm (Δ(fm)) is smaller than a predetermined value. As seen from FIG. 12, the difference between the magnitudes (Δ(fm)) increases as the frequency increases. Therefore, when the standard deviation computing section 120 selects the predetermined frequency fm, a frequency fmax at which the difference between the magnitudes (Δ(fm)) becomes equal to a predetermined value may be set as the upper limit.

The ideal spectra of the respective deterministic components may be computed by the deterministic component computing section 150 based on the detected first null frequencies fα, and supplied to the standard deviation computing section 120. The above-mentioned predetermined value may be set in accordance with the required measurement accuracy (e.g. tolerated measurement error or the like).

Referring back to FIG. 11, when the predetermined frequency fmis set in the vicinity of 0 Hz, the difference between the magnitude of the spectrum A(f) under test and the magnitude of the ideal spectrum B(f) is substantially equal to zero.

This makes it difficult to compute the standard deviation. For this reason, when the standard deviation computing section 120 selects the predetermined frequency fm, a predetermined frequency fmin, which is not 0 Hz, may be set as the lower limit. The standard deviation computing section 120 may select, as the predetermined frequency fm, a frequency equal to substantially half the above-mentioned frequency fmax which may be set as the upper limit.

Even when having the same first null frequency, deterministic components of different types have spectra with different characteristics in their main lobes. To be specific, a variation in magnitude Δ(fm) in the main lobe for a deterministic component of a certain type may be larger than a variation in magnitude Δ(fm) in the main lobe for a deterministic component of a different type. The probability density function separating apparatus 100 relating to the present embodiment also addresses this issue, and thus can compute the standard deviation of the random component more accurately.

FIG. 13 illustrates, as an example, the measurement result obtained by the probability density function separating apparatus 100 described with reference to FIGS. 11 and 12. FIG. 13 also shows the measurement results obtained by means of the conventional curve fitting methods (the tail-fit method and Q-scale method).

It should be noted that the probability density function separating apparatus 100 relating to the present example performed the measurement under the assumption that the probability density function contains a deterministic component of a sine wave distribution. As seen from FIG. 13, the values measured by the probability density function separating apparatus 100 relating to the present example provide the smaller standard deviations than the standard deviations of the measurement values estimated by using the two conventional curve fitting methods. As a consequence, the result of the measurement performed by the probability density function separating apparatus 100 relating to the present example is expected to be closer to the true values.

FIG. 14 illustrates a result of measuring the data dependent jitter measured by using the probability density function separating apparatus 100 described with reference to FIGS. 11 and 12. According to this example, a seven-stage pseudo random binary sequence (PRBS) generating circuit is used to generate a data pattern at the rate of 2.5 Gbps and 6400800 bits. In this example, the probability density function separating apparatus 100 separates jitter from the same probability density function under the assumption that the deterministic component has uniform distribution, and computes the measurement result.

The values measured by the probability density function separating apparatus 100 indicate the smaller standard deviations than the standard deviations of the measurement values estimated by using the two conventional curve fitting methods. As a consequence, the measurement result obtained by the probability density function separating apparatus 100 relating to the present example is expected to be closer to the true values.

The probability density function separating apparatus 100 also measures the standard deviation σ of the random component (RJ). In this case, the values measured by the probability density function separating apparatus 100 are smaller than the values measured by using the two conventional curve fitting methods. As explained with reference to FIG. 2, the values of the standard deviation of the random component which are measured by using the conventional curve fitting methods are larger than the true values. Considering this, the measurement result obtained by the probability density function separating apparatus 100 is expected to be closer to the true values and appropriate.

The values of the peak to peak value of the deterministic component (DDJ) which are measured by the probability density function separating apparatus 100 are equal to or larger than the values of the peak to peak value of the deterministic component (DDJ) which are measured by using the two conventional curve fitting methods. As explained with reference to FIG. 2, the values of the peak to peak value of the deterministic component which are measured by using the conventional curve fitting methods are smaller than the true values. Considering this, the measurement result obtained by the probability density function separating apparatus 100 is expected to be closer to the true values and appropriate.

Figure 15:
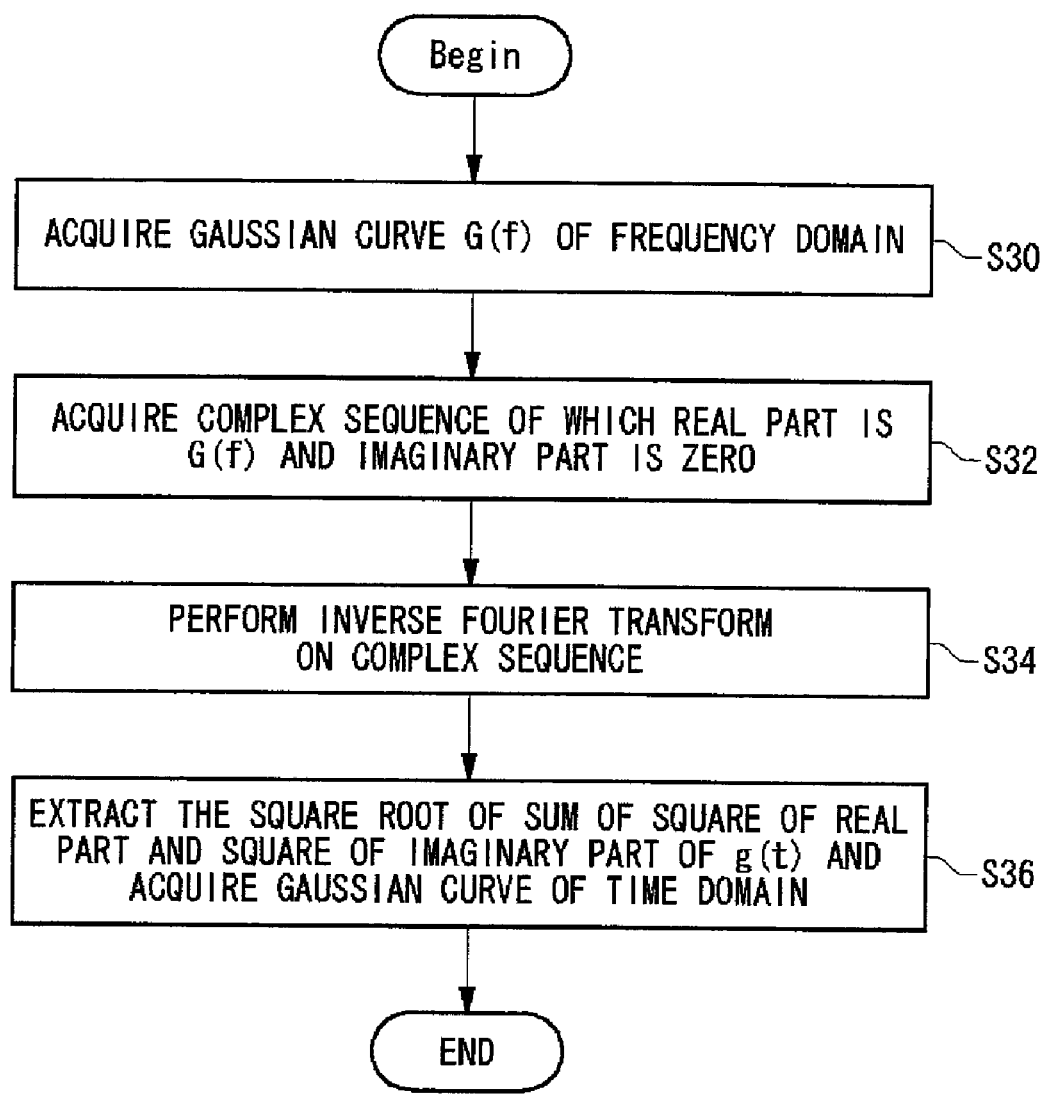
FIG. 15 is a flowchart exemplary showing a method for directly computing a probability density function in a time domain of a random component from a Gaussian curve in a frequency domain.

FIG. 15 is a flowchart exemplary showing a method for directly computing a probability density function in a time domain of a random component from a Gaussian curve in a frequency domain. First, a Gaussian curve G(f) in a frequency domain is acquired by substituting standard deviation of in a frequency domain for Expression (2) (S30). At this time, if required, in order to distribute a Gaussian curve in a time domain around a mean value μ of the input PDF, a result obtained by multiplying exp(j2πμf) by G(f) is used considering time shifting property.

Next, a complex sequence (really, it is noted that it is a real sequence) of which a real part is G(f) and an imaginary part is zero is acquired (S32). Then, a function g(t) in a time domain obtained by performing inverse Fourier transform on the acquired complex sequence is acquired (S34). At this time, since an original signal is a real number, Fourier transform or cosine transform maybe performed in place of inverse Fourier transform.

Next, a Gaussian curve in a time domain is acquired by extracting the square root of a sum of a square of a real part and a square of an imaginary part of the g(t) acquired in S34 (S36). In other words, a Gaussian curve in a time domain is acquired by computing a square root of sum of squares of real part and imaginary part of g(t). By such a process, a Gaussian curve in a time domain can be acquired.

Figure 16:
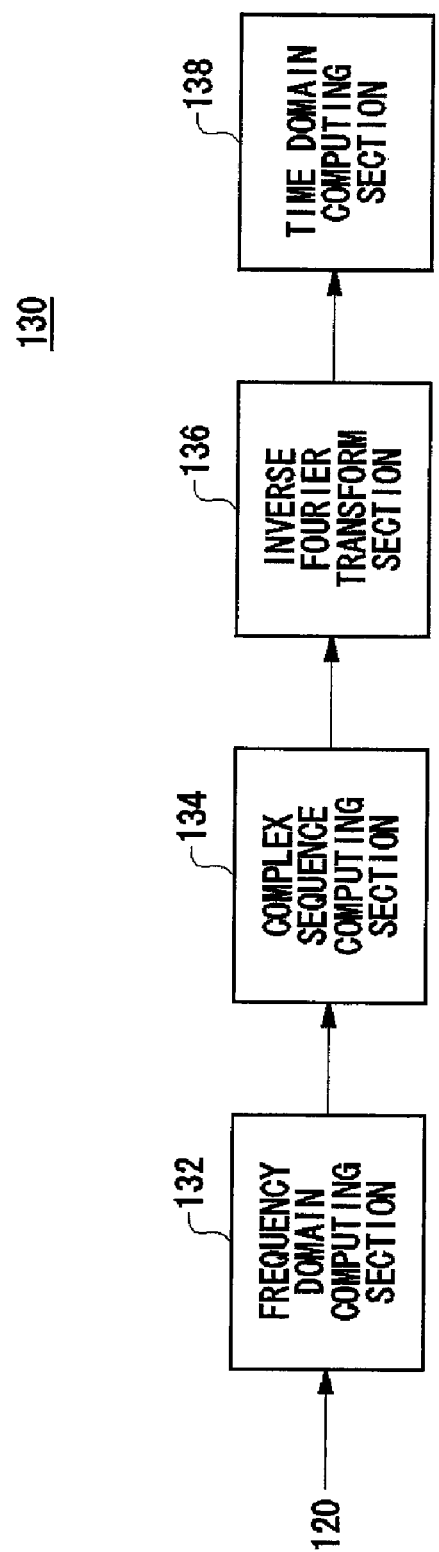
FIG. 16 is a view exemplary showing an example of a configuration of a random component computing section 130.

FIG. 16 is a view exemplary showing a configuration of the random component computing section 130. The random component computing section 130 according to the present example acquires a Gaussian curve in a time domain using a method described in FIG. 15. The random component computing section 130 has a frequency domain computing section 132, a complex sequence computing section 134, an inverse Fourier transform section 136, and a time domain computing section 138.

The frequency domain computing section 132 computes a Gaussian curve G(f) in a frequency domain based on standard deviation of a random component in a frequency domain computed from the standard deviation computing section 120. At this time, the frequency domain computing section 132 may compute a Gaussian curve G(f) in a frequency domain in a manner similar to the step of S30 described in FIG. 15.

The complex sequence computing section 134 computes a complex sequence of which a real part is G(f) and an imaginary part is zero. The inverse Fourier transform section 136 computes a function g(t) in a time domain obtained by performing inverse Fourier transform (or Fourier transform) on this complex sequence. The time domain computing section 138 extracts the square root of sum of squares of real part and imaginary part of the function g(t) in a time domain, and acquires a Gaussian curve in a time domain, that is, a probability density function in a time domain of a random component.

In addition, a process described in FIGS. 15 and 16 is not limited to a process for a probability density function. That is to say, it is possible to suppose a waveform in a time domain from a spectrum in an arbitrary frequency domain by means of a process similar to that described in FIGS. 15 and 16.

In this case, the time domain computing section 138 described in FIG. 16 is supplied with a magnitude spectrum of a signal under test. Then, the time domain computing section 138 computes a waveform in a time domain by transforming the magnitude spectrum into a function in a time domain. When transforming a magnitude spectrum into a function in a time domain, it is possible to obtain a function in this time domain by applying Fourier transform, inverse Fourier transform, cosine transform or the like to this magnitude spectrum. Then, the time domain computing section 138 can suppose a waveform in a time domain by extracting the square root of sum of squares of real part and imaginary part of this time domain.

In this manner, a computing apparatus for computing a waveform in a time domain from a spectrum in a frequency domain may further include a frequency domain measuring section for detecting a magnitude spectrum of a signal under test in addition to the time domain computing section 138. The frequency domain measuring section supplies the detected magnitude spectrum to the time domain computing section 138. By such a configuration, it is possible to suppose a waveform in a time domain of a signal under test based on only a magnitude spectrum of a signal under test.

As described above, according to the probability density function separating apparatus 100 in the present example, it is possible to separate a random component and a deterministic component from a given probability density function with high precision. For example, in case of a random component, it is possible to compute a random component with high precision based on standard deviation computed in a frequency domain without performing an approximation such as conventional curve fitting. Moreover, in case of a deterministic component, it is possible to detect a value D(p–p) closer to a true value for D(δδ) having an error like a conventional method.

Figure 17A:
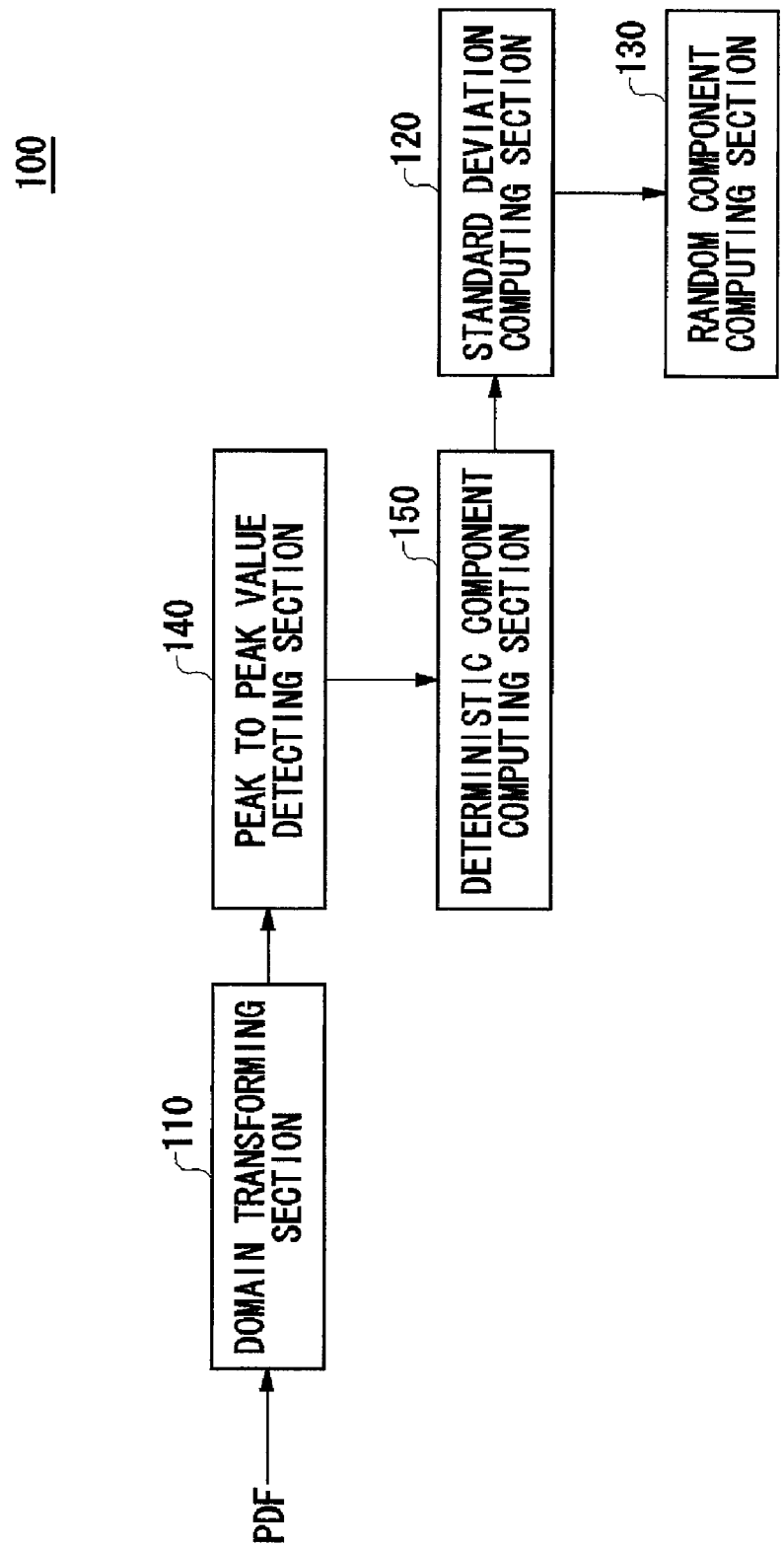
FIG. 17A is a view illustrating a different exemplary configuration of the probability density function separating apparatus 100.

FIG. 17A illustrates a different exemplary configuration of the probability density function separating apparatus 100. The probability density function separating apparatus 100 relating to the present example includes therein the peak to peak value detecting section 140, the standard deviation computing section 120, the deterministic component computing section 150, and the random component computing section 130. The respective constituents may be the same as the corresponding constituents in FIG. 1 which are assigned the same reference numerals.

Figure 17B:
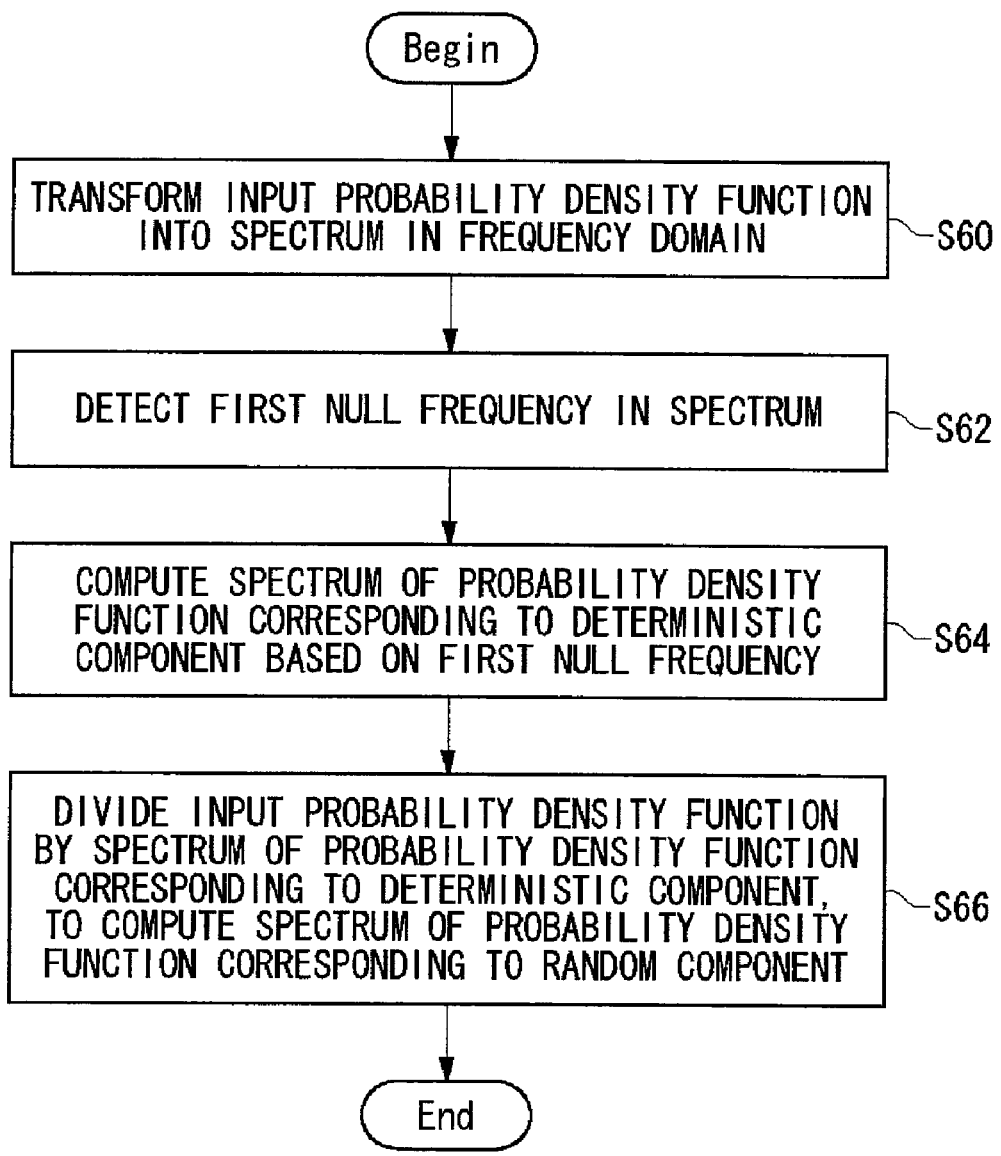
FIG. 17B is a flowchart showing an example of an operation of the probability density function separating apparatus 100 shown in FIG. 17A.

FIG. 17B is a flowchart showing an example of an operation of the probability density function separating apparatus 100 illustrated in FIG. 17A. The probability density function separating apparatus 100 relating to the present example computes the probability density function corresponding to the deterministic component from the first null frequency of the spectrum of the probability density function, similarly to the description made with reference to the FIGS. 4A to 4E.

An operation of the domain transforming section 110 is equal to that of the domain transforming section 110 described with reference to FIG. 1. In other words, the domain transforming section 110 transforms a given probability density function into a spectrum in a frequency domain (S60).

After this, the peak to peak value detecting section 140 detects a first null frequency of the spectrum (S62). For example, the peak to peak value detecting section 140 may detect the first null frequency of the spectrum from the second-order derivative waveform of the spectrum, as described with reference to FIGS. 6B and 7.

In addition, the peak to peak value detecting section 140 may compute the peak to peak value of the probability density function corresponding to the deterministic component, based on the first null frequency of the spectrum. For example, the peak to peak value detecting section 140 may compute the peak to peak value in the manner described with reference to FIGS. 4A to 4D.

Subsequently, the deterministic component computing section 150 computes the probability density function corresponding to the deterministic component based on the first null frequency (or the peak to peak value) (S64). The deterministic component computing section 150 may compute a spectrum in the frequency domain for the probability density function corresponding to the deterministic component. For example, the deterministic component computing section 150 may compute the spectrum which is indicated by the dotted line in FIG. 5 or 11.

Following this, the random component computing section 130 computes the spectrum of the probability density function corresponding to the random component, by dividing the spectrum of the input probability density function by the spectrum of the probability density function corresponding to the deterministic component (S66). The random component computing section 130 may divide the absolute values of the spectrum of the input probability density function (the magnitude spectrum) by the absolute values of the spectrum of the probability density function corresponding to the deterministic component. For example, the random component computing section 130 may divide the absolute values of the spectrum of the input probability density function indicated by the solid line in FIG. 5 or 11 by the absolute values of the spectrum indicated by the dotted line in FIG. 5 or 11.

In the above-described manner, the probability density function separating apparatus 100 can compute the probability density functions of the random and deterministic components. The standard deviation computing section 120 may compute the standard deviation of the random component from the computed spectrum of the probability density function corresponding to the random component. Here, the standard deviation computing section 120 may convert the spectrum of the probability density function corresponding to the random component into a spectrum plotted along a logarithmic axis.

Alternatively, in place of the operations performed in the steps S64 and S66, the standard deviation computing section 120 may compute the standard deviation of the random component based on the magnitude of the predetermined frequency component in the main lobe of the spectrum of the input probability density function in the manner described with reference to FIG. 11. The random component computing section 130 may compute the probability density function corresponding to the random component based on the standard deviation of the random component.

Figure 18A:
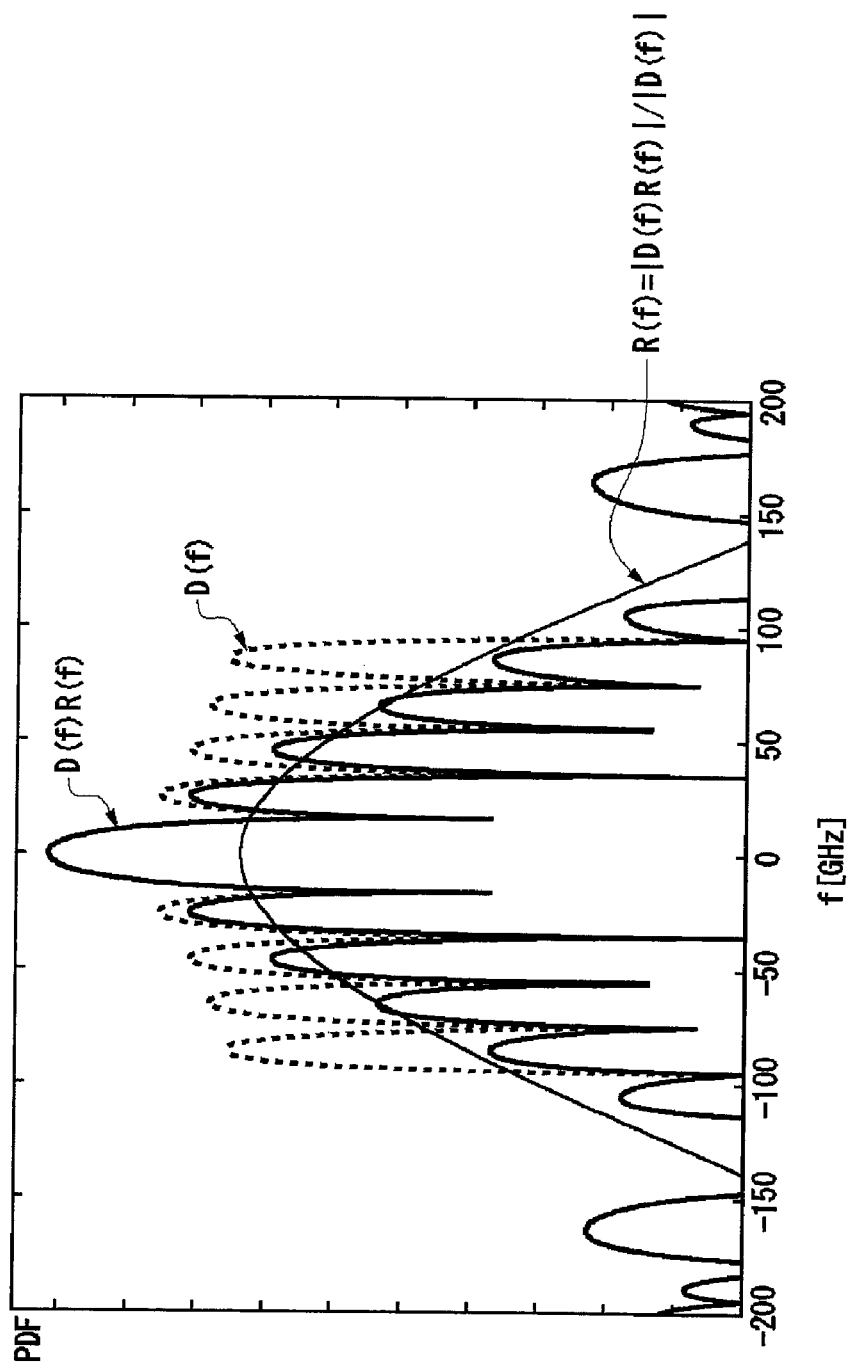
FIG. 18A is a view explaining the operation of the probability density function separating apparatus 100 described in FIG. 17.

FIG. 18A is a view explaining an operation of the probability density function separating apparatus 100 described in FIG. 17. As described above, the domain transforming section 110 outputs a spectrum D(f)R(f) of a probability density function. A spectrum of a random component R(f) is given by dividing the spectrum D(f)R(f) by a magnitude spectrum |D(f)| with a deterministic component.

Here, it is not necessary to divide the entire range of the spectrum D(f)R(f) by the magnitude spectrum |D(f)|. Alternatively, the random component may be computed from the amount of attenuation of the predetermined frequency component as described with reference to Expressions (5) and (6). Which is to say, the random component can be computed from the ratio between the value of the spectrum D(f)R(f) of the input probability density function and the value of the spectrum D(f) of the deterministic component at the predetermined frequency f2. Here, the predetermined frequency f2 may be a frequency in the main or side lobe of the spectrum of the input probability density function.

Figure 18C:
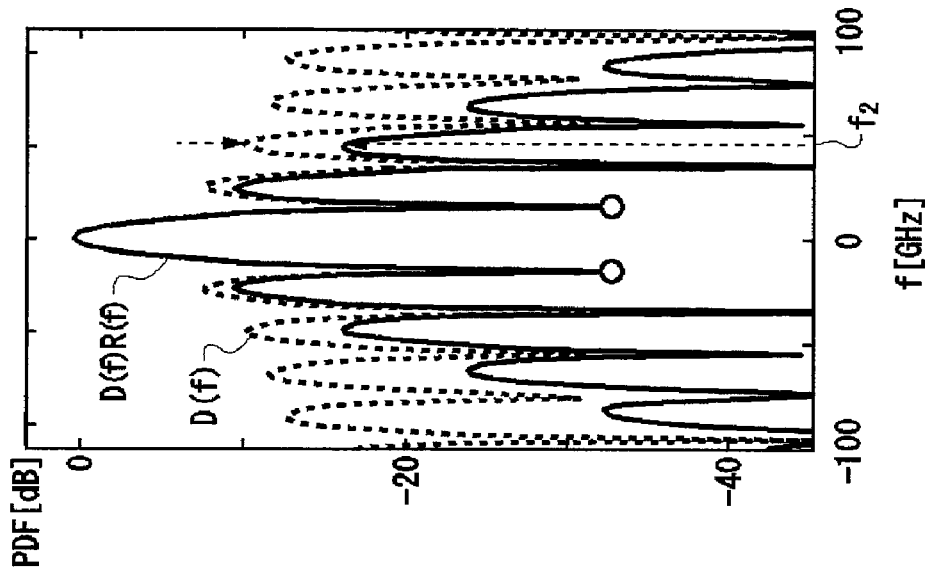
FIG. 18C is used to describe an exemplary case where a random component is computed based on the amount of attenuation of a predetermined frequency component in the side lobe of the spectrum.
Figure 18B:
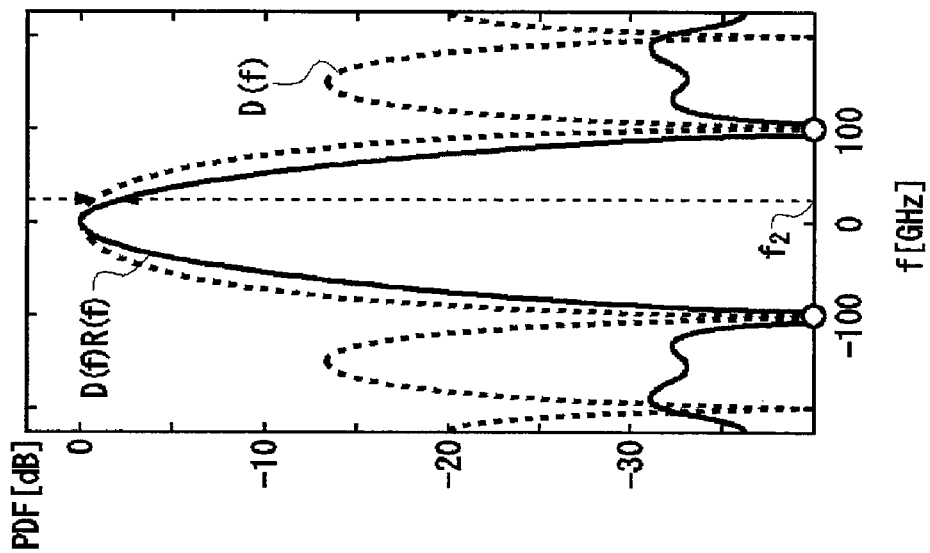
FIG. 18B is used to describe an exemplary case where a random component is computed based on the amount of attenuation of a predetermined frequency component in the main lobe of the spectrum.

FIG. 18B is used to explain an exemplary case where the random component is computed based on the amount of attenuation of the predetermined frequency component in the main lobe of the spectrum. The probability density function separating apparatus 100 may compute the spectrum of the probability density function corresponding to the random component, based on the magnitude of the predetermined frequency component f2 in the main lobe of the spectrum of the input probability density function, in the manner described with reference to FIG. 11.

For example, when the input probability density function contains therein a sine wave distribution with a small amplitude as the deterministic component, the error component in the side lobe of the spectrum of the input probability density function is evident. When the deterministic component contained in the input probability density function is of a sine wave distribution and the energy of the sine wave is smaller than a predetermined value, the probability density function separating apparatus 100 may compute the standard deviation of the random component based on the ratio between the predetermined frequency components in the main lobes of the spectra of the input probability density function and deterministic component. For example, when an unexpected sine wave is generated as the deterministic component and when the energy of the sine wave is smaller than a predetermined value, the probability density function separating apparatus 100 may compute the standard deviation of the random component from the main lobes of the spectra.

FIG. 18C is used to explain an exemplary case where the random component is computed from the amount of attenuation of the predetermined frequency component in the side lobe of the spectrum. The probability density function separating apparatus 100 may compute the spectrum of the probability density function corresponding to the random component, based on the magnitude of the predetermined frequency component f2 in the side lobe of the spectrum of the input probability density function. When the deterministic component contained in the input probability density function is not of a sine wave, the probability density function separating apparatus 100 may compute the standard deviation of the random component based on the ratio between the predetermined frequency components in the side lobes of the spectra of the input probability density function and deterministic component. When the deterministic component contained in the input probability density function is of a sine wave distribution and the energy of the sine wave is larger than a predetermined value, the probability density function separating apparatus 100 may compute the standard deviation of the random component from the side lobe of the spectrum.

Furthermore, as shown in FIG. 18A, an error component of the spectrum D(f)R(f) of a probability density function becomes large as frequency becomes high. For this reason, the deterministic component computing section 150 may compute a probability density function in a time domain with a deterministic component by transforming a spectrum in a predetermined frequency range including frequency of a main lobe into a function in a time domain among the spectra D(f) with the computed deterministic component. Moreover, the deterministic component computing section 150 may extract the predetermined number of side lobes in vicinity of the main lobe from the spectra D(f) with the computed deterministic component and transform the extracted main lobe and side lobe into a function in a time domain. By such a process, it is possible to reduce an influence of an error in a high-frequency area.

Figure 19A:
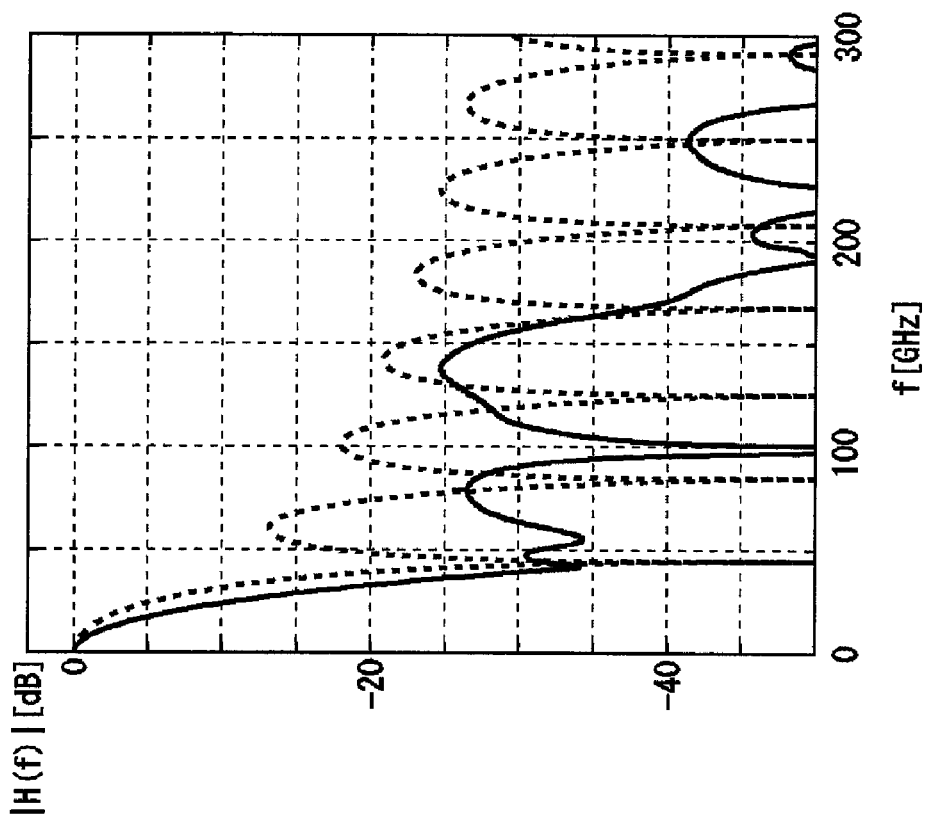
FIG. 19A illustrates, as an example, an input probability density function h(t), and the spectrum of the input probability density function |H(f)|.
Figure 19A:
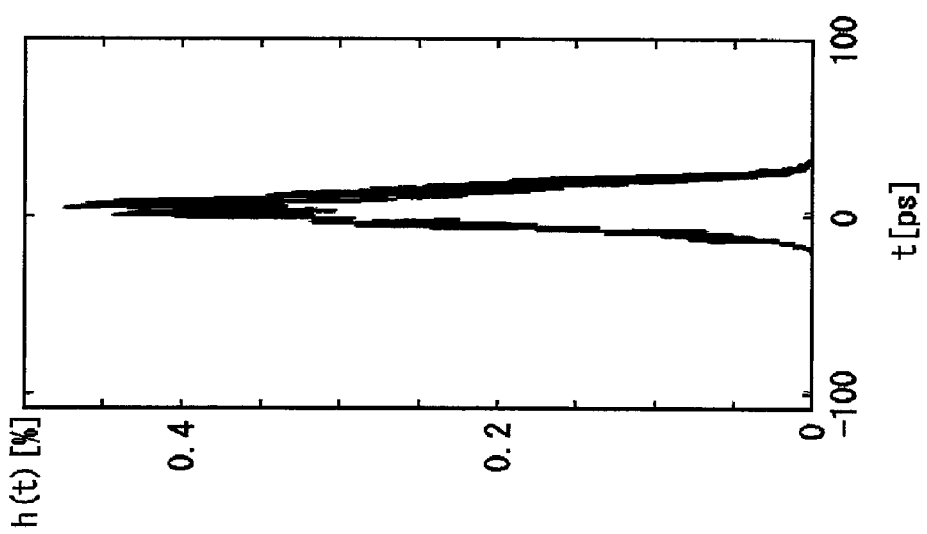

FIG. 19A illustrates, as an example, an input probability density function h(t), and the spectrum |H(f)| of the input probability density function. In this example, a 15-stage pseudo random binary sequence (PRBS) is input into a coaxial cable, and a probability density function of jitter of a data sequence output from the coaxial cable is obtained as the input probability density function h(t). This data sequence has data dependent jitter (DDJ) caused therein in accordance with the length of the coaxial cable. In the present example, the coaxial cable has a length of 5 m.

Figure 19B:
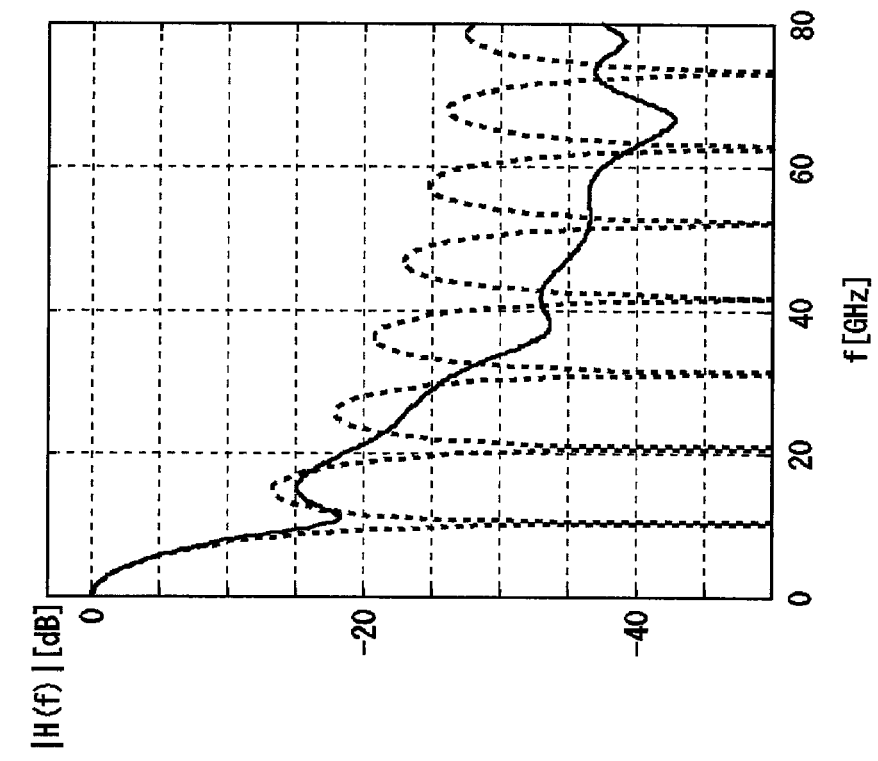
FIG. 19B illustrates, as an example, a different input probability density function h(t) and the spectrum |H(f)| of the input probability density function.
Figure 19B:
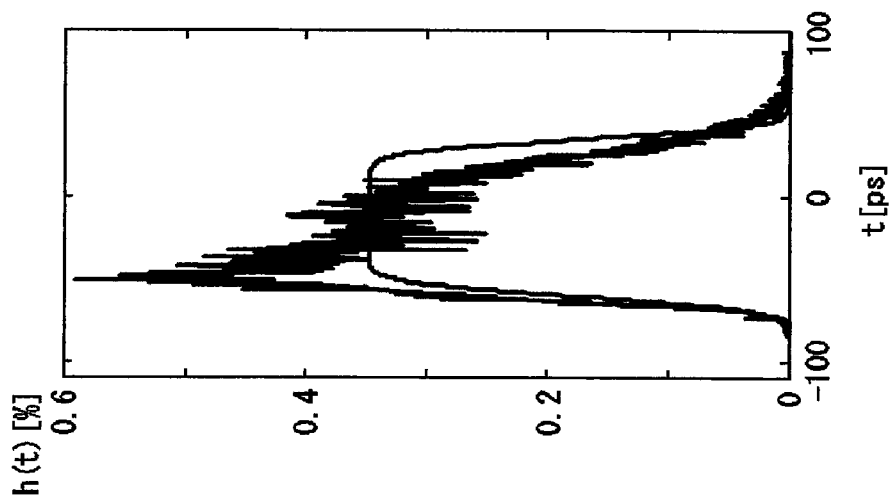

FIG. 19B illustrates, as an example, a different input probability density function h(t) and the spectrum |H(f)| of the input probability density function. The input probability density function h(t) and the spectrum |H(f)| of the input probability density function shown in FIG. 19B are obtained under the same conditions as the input probability density function h(t) and the spectrum |H(f)| shown in FIG. 19A except for that the coaxial cable has a length of 15 m. When compared with the example shown in FIG. 19A, the data dependent jitter DDJ is more obvious in the example shown in FIG. 19B.

The probability density function separating method described with reference to FIG. 17 is used to separate the random jitter RJ and the deterministic jitter DJ in the input probability density function, so that the total jitter TJ is computed. The total jitter TJ can be computed based on the following expression, for example:

$$TJ = DJ(p-p) + 12 \times RJ \qquad \text{Expression (8)}$$

Here, the coefficient "12" is determined in accordance with the bit error rate threshold, and selected from the table shown in FIG. 19D, for example. In this example, the coefficient associated with the bit error rate of $10^{-9}$ is used.

Figure 19C:
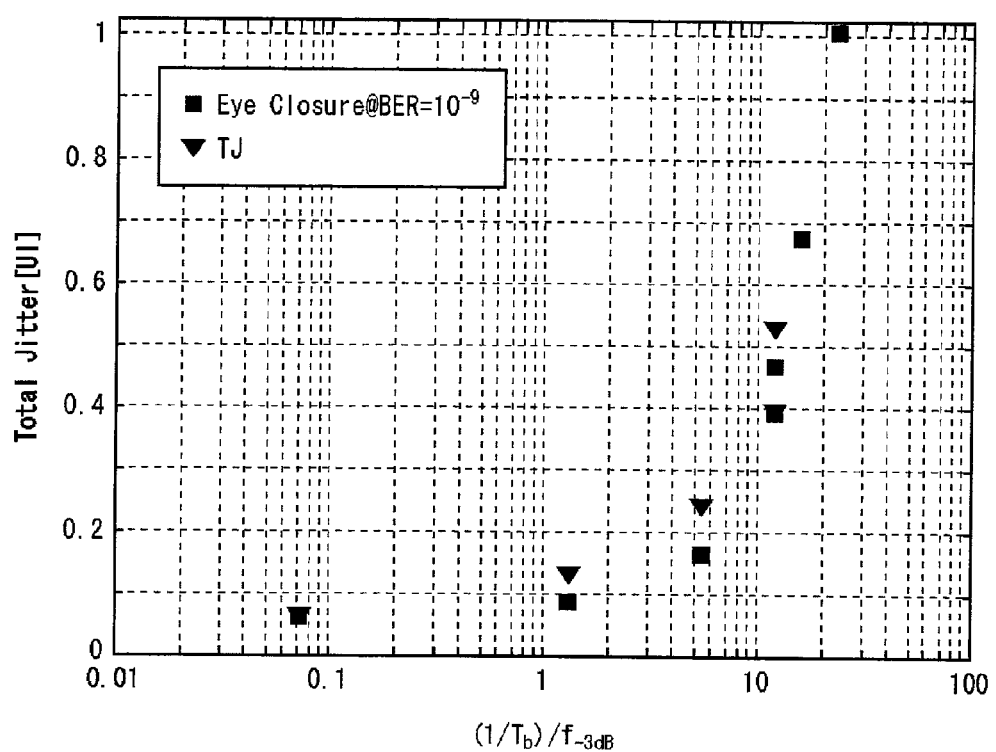
FIG. 19C compares the value of the total jitter TJ which is computed in accordance with the probability density function separating method described with reference to FIG. 17, and the value of the total jitter which is measured by a bit error rate testing system.

FIG. 19C compares the values of the total jitter TJ which are computed in accordance with the probability density function separating method described with reference to FIG. 17, and the values of the total jitter which were measured by a bit error rate testing system. In FIG. 19C, the values of the total jitter are plotted with respect to the value of $1/T_b/f_{-3\ dB}$, where $T_b$ denotes the bit time interval of the pseudo random binary sequence, and $f_{-3\ dB}$ denotes the 3 dB bandwidth of the coaxial cable.

According to this example, the number of samples of data measured for the probability density function separating method is different from that captured by the bit error rate testing system. (For the probability density function separating method, the number of samples of data measured was $3 \times 10^4$, while for the bit error rate test system and the number was $10^9$.) Therefore, in the region where the value of $1/T_b/f_{-3\ dB}$ is small and the random jitter is a dominant factor, the error of the values obtained by the measurement performed in accordance with the probability density function separating method with respect to the values obtained by the measurement performed by using the bit error rate test system is approximately 50%. In the region where the value of $1/T_b/f_{-3\ dB}$ is large and the deterministic jitter is a dominant factor, the error is 10% or less.

The error of the measured values of the random jitter can be reduced by obtaining the histogram or the probability density function from the same number of samples of data as captured samples of data from which the bit error rate of the device under test was measured. Therefore, it has been confirmed that the measurement of the total jitter which is performed by using the probability density function separating method described with reference to FIG. 17 is related to the measurement performed by using the conventional bit error rate test system.

Figure 19E:
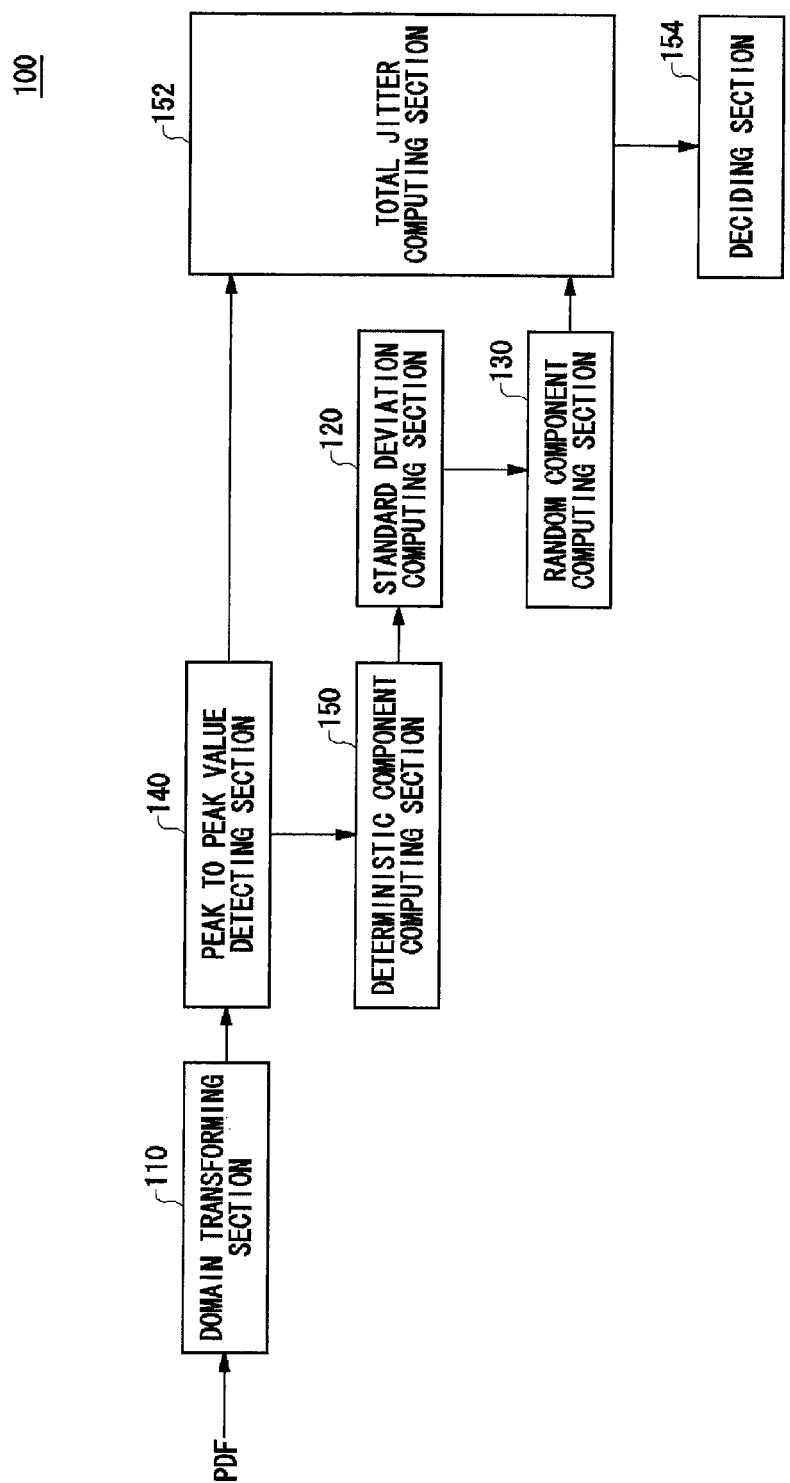
FIG. 19E illustrates a different exemplary configuration of the probability density function separating apparatus 100.

FIG. 19E illustrates a different exemplary configuration of the probability density function separating apparatus 100. The probability density function separating apparatus 100 relating to the present example has a total jitter computing section 152 and a deciding section 154 in addition to the constituents of the probability density function separating apparatus 100 illustrated in one of FIGS. 1 and 17A. The configuration shown in FIG. 19E is obtained by adding the total jitter computing section 152 and deciding section 154 to the probability density function separating apparatus 100 shown in FIG. 17A. The probability density function separating apparatus 100 relating to the present example is supplied a probability density function indicating a noise component contained in a signal under test.

The total jitter computing section 152 computes the value of the total jitter contained in the signal under test based on the peak to peak value which is computed by the deterministic component computing section 150 (or the peak to peak value detecting section 140). The total jitter computing section 152 may compute the value of the total jitter by using the method described with reference to Expression (8).

For example, the total jitter computing section 152 may receive the random component computed by the random component computing section 130, and compute the value of the total jitter based on the received random component and the above-mentioned peak to peak value. Alternatively, the total jitter computing section 152 may receive the value of the random component contained in the probability density function from the user or the like. If such is the case, the probability density function separating apparatus 100 may not necessarily include therein the standard deviation computing section 120 and random component computing section 130.

The deciding section 154 decides whether the signal under test is acceptable or not based on the value of the total jitter computed by the total jitter computing section 152. For example, the deciding section 154 may make the decision whether the signal under test is acceptable or not by judging whether the value of the total jitter falls within a predetermined range.

Figure 20:
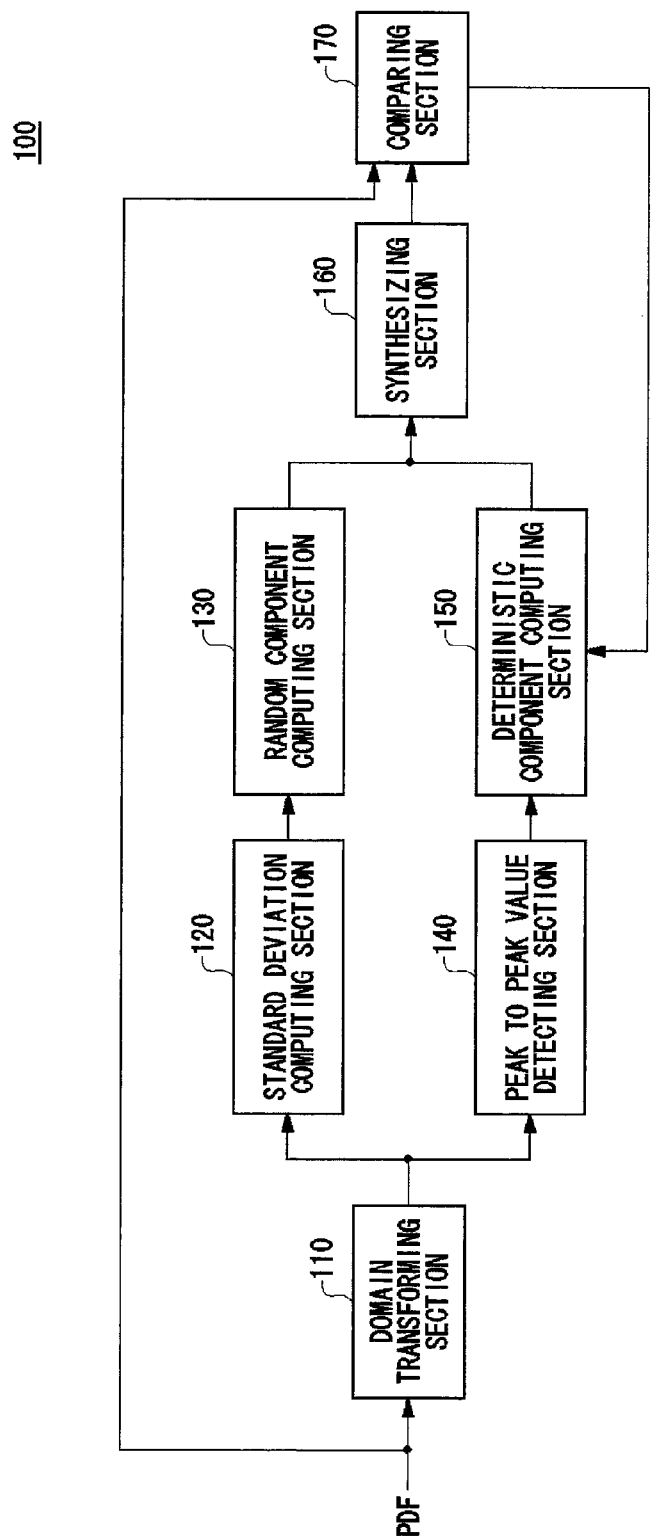
FIG. 20 is a view showing another example of a configuration of a probability density function separating apparatus 100.

FIG. 20 is a view showing another example of a configuration of the probability density function separating apparatus 100. The probability density function separating apparatus 100 according to the present example further includes a synthesizing section 160 and a comparing section 170 in addition to a configuration of the probability density function separating apparatus 100 described with reference to FIG. 1. Other components have a function equal to that of components that have been described using the same symbols in FIG. 1.

The synthesizing section 160 generates a composite probability density function (hereinafter, referred to as a composite PDF) obtained by convolving (convolution integrating) a probability density function of a random component computed from the random component computing section 130 and a probability density function of a deterministic component computed from the deterministic component computing section 150.

The comparing section 170 compares a composite PDF output from the synthesizing section 160 and an input PDF. As described in FIG. 9, the deterministic component computing section 150 is previously supplied with a function of which a peak to peak value is unknown and substitute the peak to peak value detected from the peak to peak value detecting section 140 for the function, in order to compute a probability density function with a deterministic component.

At this time, this function is different according to whether a deterministic component is a sine wave, uniform distribution, triangular distribution, or dual Dirac. For this reason, in order to compute a probability density function with a deterministic component based on a peak to peak value, it is preferable to be able to decide which function is a function with a deterministic component.

The deterministic component computing section 150 may be supplied with which function is a function with a deterministic component in advance. Moreover, the deterministic component computing section 150 maybe previously supplied with a plurality of functions according to the type of distribution of a deterministic component, substitute the peak to peak value detected from the peak to peak value detecting section 140 for each function, and respectively compute a probability density function for each type of distribution of a deterministic component.

In this case, the synthesizing section 160 respectively synthesizes each probability density function output from the deterministic component computing section 150 and a probability density function output from the random component computing section 130. The comparing section 160 respectively compares the composite PDF each synthesized by the synthesizing section 160 and the input PDF. The comparing section 170 selects a function appropriate as a function showing a deterministic component included in the input PDF based on a comparison result for each composite PDF. For example, the comparing section 170 may select a function in which a difference between the composite PDF and the input PDF becomes smallest.

Then, the deterministic component computing section 150 may output a probability density function with a deterministic component corresponding to the function selected by the comparing section 170 as an appropriate probability density function. By such a process, although a type of distribution of a deterministic component is indefinite, it is possible to select appropriate distribution from distribution of a predetermined type and compute a probability density function with a deterministic component included in an input PDF.

Moreover, the peak to peak value detecting section 140 detects a peak to peak value with predetermined measurement resolution. In this case, the detected peak to peak value includes an error according to measurement resolution. The probability density function separating apparatus 100 in the present example can perform a process reducing this measurement error. Moreover, the probability density function separating apparatus 100 may perform both of selection of a function prescribing the deterministic component and a process reducing a measurement error to be described below.

For example, the deterministic component computing section 150 computes a deterministic component corresponding to each peak to peak value when sequentially changing the peak to peak values using the peak to peak value detected from the peak to peak value detecting section 140 as standard. At this time, the deterministic component computing section 150 may sequentially change the peak to peak values in a range according to measurement resolution.

For example, when measurement resolution is 2a and the peak to peak value detected from the peak to peak value detecting section 140 is $2T_0$, the deterministic component computing section 150 may sequentially change the peak to peak values in a range of $2T_0-a$ to $2T_0+a$. At this time, it is preferable that resolution changing a peak to peak value is sufficiently smaller than measurement resolution.

The synthesizing section 160 sequentially generates composite PDF obtained by sequentially synthesizing a probability density function with each deterministic component sequentially output from the deterministic component computing section 150 and a probability density function with a random component. The comparing section 170 compares each composite PDF and the input PDF, and selects either of the peak to peak values as an optimum value based on the comparison result. By such a process, it is possible to reduce a measurement error caused by measurement resolution.

Figure 21:
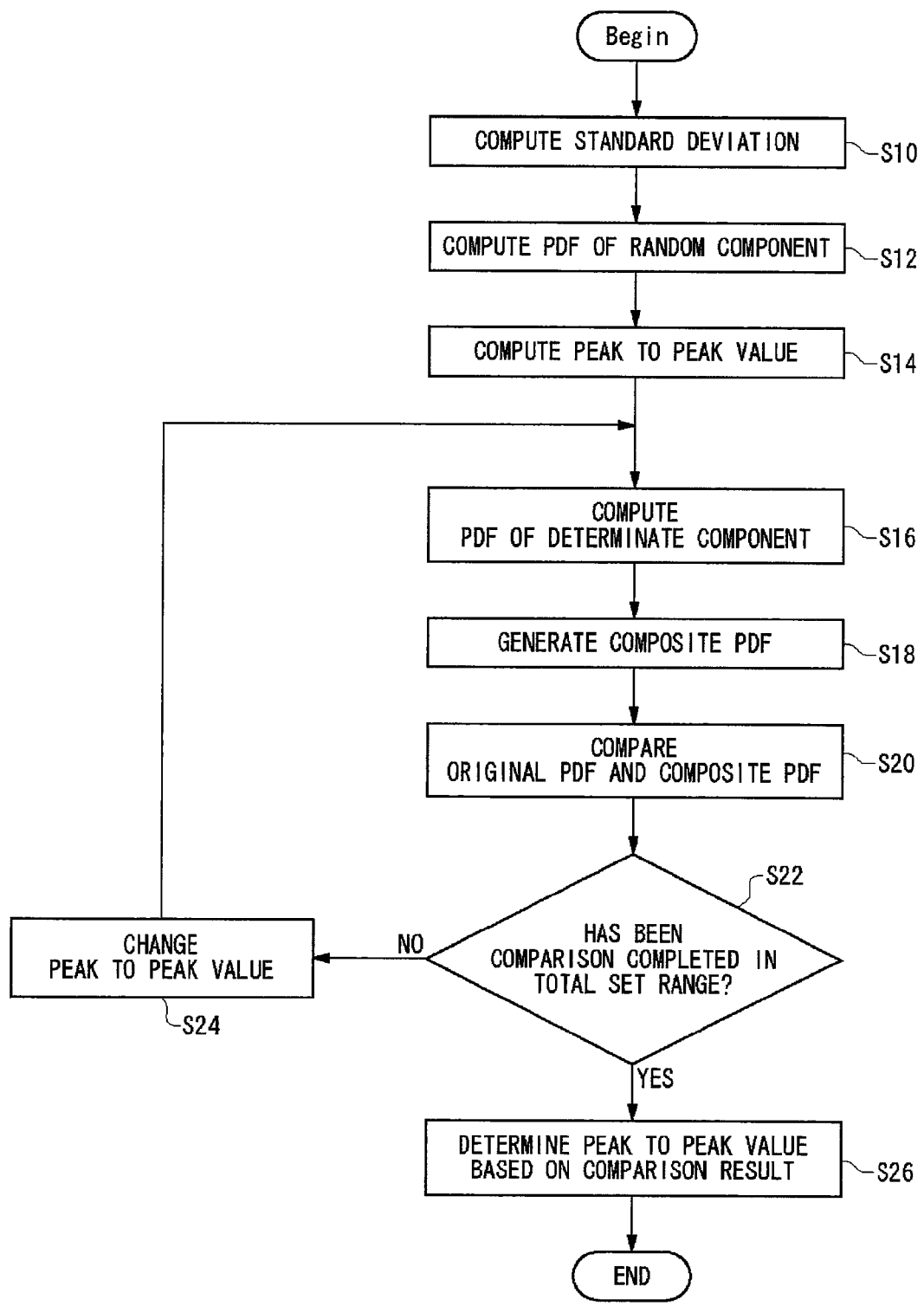
FIG. 21 is a view exemplary showing operations of a probability density function separating apparatus 100 shown in FIG. 20.

FIG. 21 is a view exemplary showing operations of the probability density function separating apparatus 100 shown in FIG. 20. In this example, it will be explained about an operation when reducing the measurement error. First, the domain transforming section 110 transforms the input PDF into a spectrum in a frequency domain.

Then, the standard deviation computing section 120 computes standard deviation of a random component included in the input PDF based on this spectrum (S10). Then, the random component computing section 130 computes a probability density function with this random component based on this standard deviation (S12).

Next, the peak to peak value detecting section 140 computes a peak to peak value of a spectrum of the input PDF (S14). Then, the deterministic component computing section 150 computes a probability density function with a deterministic component based on this peak to peak value (S16).

Next, the synthesizing section 160 generates composite PDF made by convolving a probability density function of a random component and a probability density function of a deterministic component (S18). This synthesizing may be performed by convolution integrating probability density functions in each time domain.

Next, the comparing section 170 compares the input PDF and the composite PDF (S20). The comparing section 170 may compute an error between the input PDF and the composite PDF. This error may be root mean square of an error on a time section respectively set. Tail sections on both ends of a probability density function may be designated as the time sections.

Next, the peak to peak value is changed in predetermined entire range, and it is determined whether comparison between the input PDF and the composite PDF has been completed (S22). When there is a range in which the peak to peak value is not changed, the peak to peak value is changed into a value to be compared (S24), and processes of S16 to S20 are repeated.

When the peak to peak value is changed in entire range, a peak to peak value having a small error is determined based on the comparison result in S20 for each peak to peak value (S26).

By such a process, it is possible to reduce a measurement error and determine an optimal peak to peak value. The B(f) of Expression (5) may be recalculated to compute standard deviation of a random component with high precision by means of a probability density function with a deterministic component having this peak to peak value.

Tails on both ends of a probability density function are decided by a random component. On the contrary, it is possible to compare a value of a probability density function with a predetermined threshold value from both ends to a central portion and detect a time width having probability density larger than this threshold value, in order to compute D(p-p).

Figure 22A:
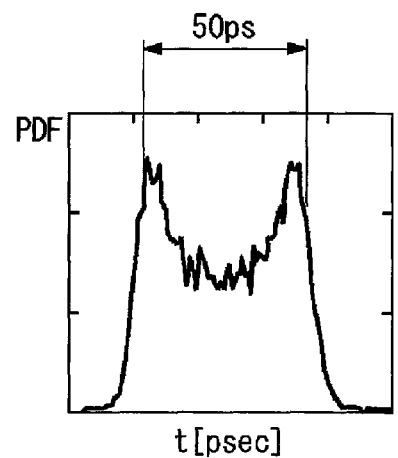
FIG. 22A shows a probability density function with a deterministic component including only a sine wave as a deterministic jitter.

FIG. 22A shows a probability density function with a deterministic component including only a sine wave as a deterministic jitter. An expected value of D(p-p) of a sine wave in the present example is 50 ps.

Figure 22B:
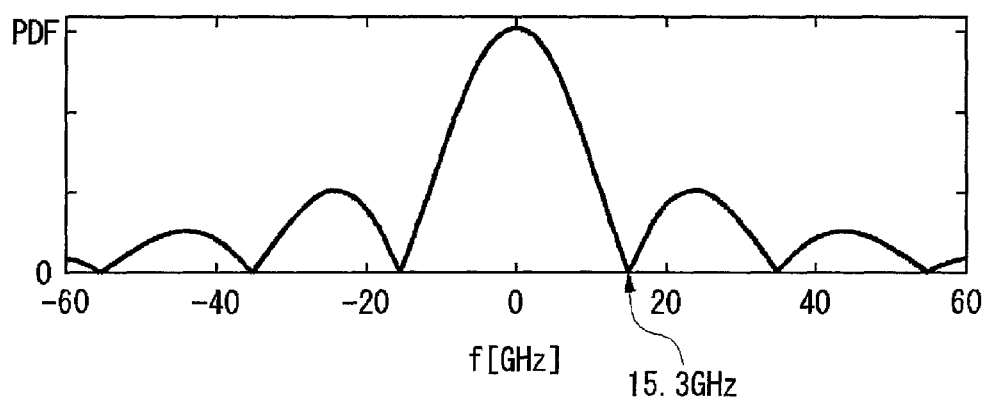
FIG. 22B shows a spectrum obtained by transforming a probability density function shown in FIG. 22A into a frequency domain.

FIG. 22B shows a spectrum obtained by transforming a probability density function shown in FIG. 22A into a frequency domain. Null frequency of this spectrum is 15.3 GHz (0.765/50 ps) of an expected value.

Figure 23A:
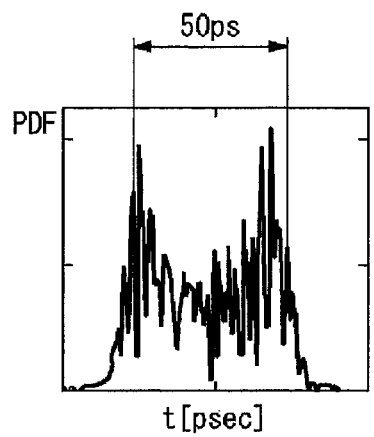
FIG. 23A shows a probability density function with a deterministic component including a sine wave and a sine wave of which energy is relatively smaller than that of the sine wave as a deterministic jitter.

FIG. 23A shows a probability density function with a deterministic component including a sine wave and a sine wave of which energy is relatively smaller than that of the sine wave as a deterministic jitter. In this case, this probability density function is obtained by convolution integrating two sine waves. It is understood that a small sine wave acts on a probability density function as noises.

Figure 23B:
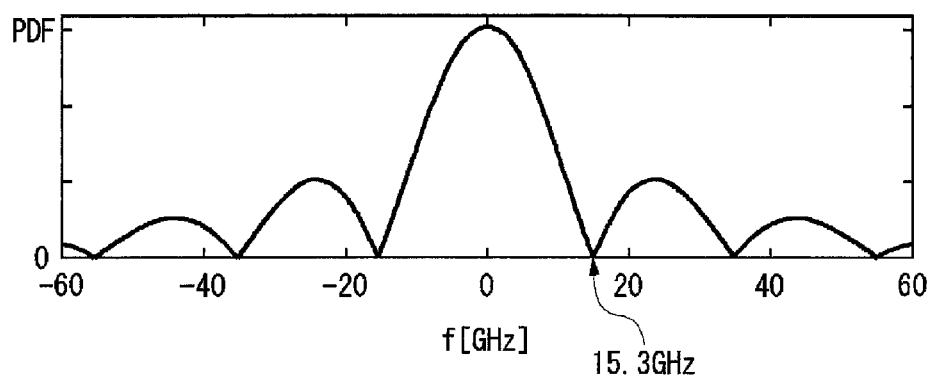
FIG. 23B shows a spectrum obtained by transforming a probability density function shown in FIG. 23A into a frequency domain.

An expected value of D(p-p) of a large sine wave in the present example is 50 ps. FIG. 23B shows a spectrum obtained by transforming a probability density function shown in FIG. 23A into a frequency domain. Null frequency of this spectrum is 15.3 GHz. In other words, it is understood that noises of a probability density function does not act on null frequency. That is to say, according to the present method for detecting D(p-p) based on null frequency, it is possible to reduce an influence of noise of a probability density function to detect D(p-p).

Figure 23C:
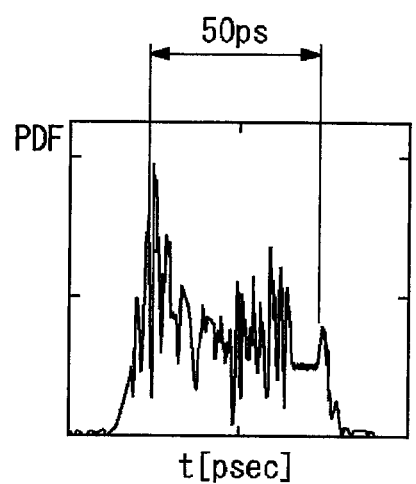
FIG. 23C shows an asymmetric probability density function.
Figure 23D:
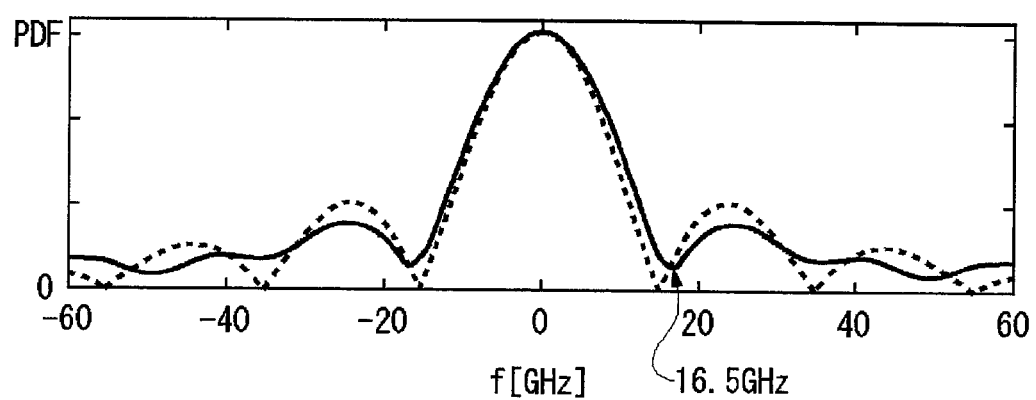
FIG. 23D shows a spectrum obtained by transforming a asymmetric probability density function shown in FIG. 23C into a frequency domain.

FIG. 23C shows a asymmetric probability density function. FIG. 23D shows a spectrum obtained by transforming a asymmetric probability density function shown in FIG. 23C into a frequency domain. In the present example, an expected value of D(p-p) is 50 ps, and null frequency of this spectrum is 16.5 GHz. In other words, a conventional method cannot detect reproducible D(p-p). However, the present method for detecting D(p-p) based on null frequency can detect D(p-p) with an error of 8%.

Figure 24A:
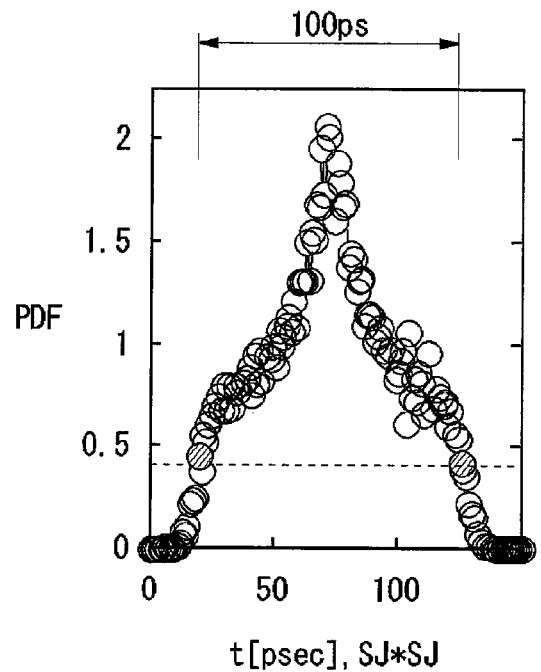
FIG. 24A shows a probability density function with a deterministic component consisting of two sine waves whose energies are equal to each other.

FIG. 24A shows a probability density function with a deterministic component including a sine wave and a sine wave of which energy is equal to that of the sine wave as a deterministic jitter. An expected value of D(p-p) in the present example is 100 ps.

Figure 24B:
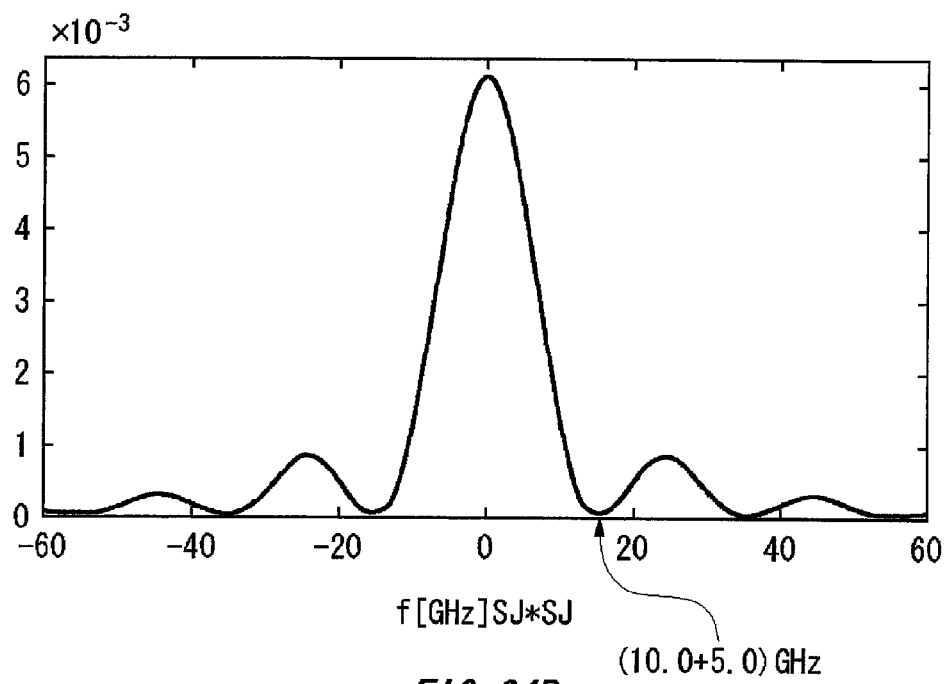
FIG. 24B shows a spectrum obtained by transforming a probability density function shown in FIG. 24A into a frequency domain.

FIG. 24B shows a spectrum obtained by transforming a probability density function shown in FIG. 24A into a frequency domain. Null frequency of this spectrum has an error of about 5 GHz for 10 GHz of an expected value.

Figure 25A:
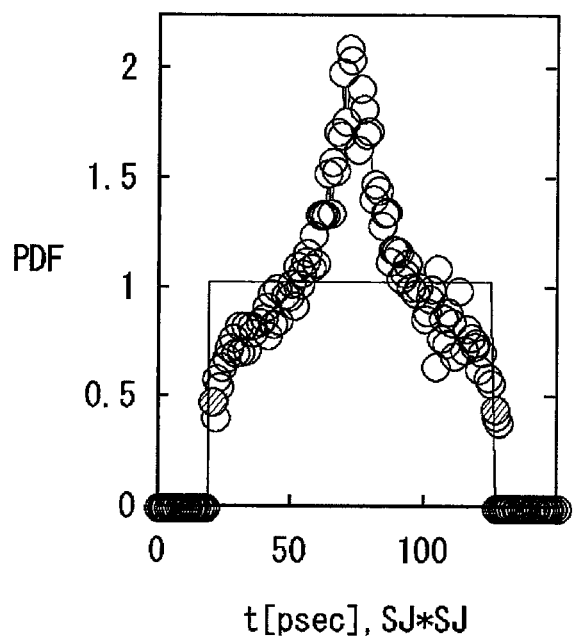
FIG. 25A is a view showing uniform distribution obtained by performing a predetermined threshold process on a probability density function shown in FIG. 24A.

FIG. 25A is a view showing uniform distribution obtained by performing a predetermined threshold process on a probability density function shown in FIG. 24A. In other words, a value larger than a predetermined threshold value is replaced by this threshold value among values of this probability density function and a value smaller than the predetermined threshold value is replaced by zero, in order to show a probability density function transformed into uniform distribution.

Figure 25B:
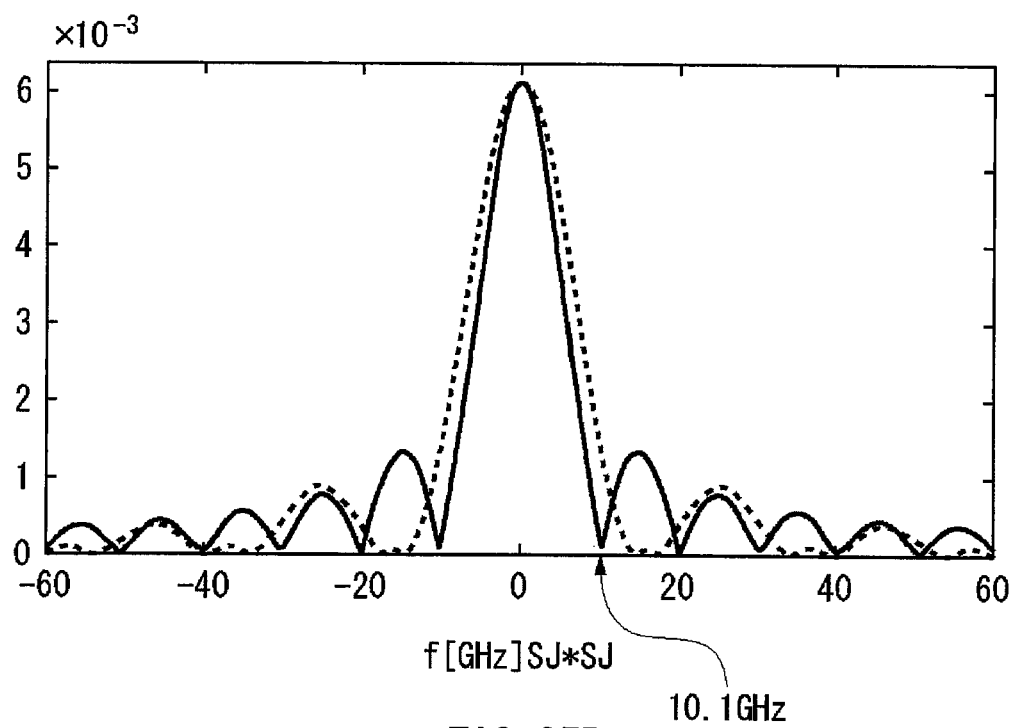
FIG. 25B is a view showing a spectrum obtained by transforming uniform distribution shown in FIG. 25A into a frequency domain.

FIG. 25B is a view showing a spectrum obtained by transforming uniform distribution shown in FIG. 25A into a frequency domain. It is possible to obtain 10.1 GHz substantially equal to an expected value as D(p-p) by performing a threshold process. A threshold value providing D(p-p) substantially identical with an expected value can be determined by, for example, sequentially changing a threshold value to compute D(p-p) for each threshold value and detecting a threshold value of which D(p-p) is not substantially changed.

FIG. 26 shows values of D(p-p) measured by a threshold process and D(δδ) measured by a conventional method for a probability density function including a plurality of deterministic jitters. As described in FIGS. 24A, 24B, 25A and 25B, in case of measuring a probability density function made by convolution integrating two sine waves, in a conventional curve fitting method, a result of $D(\delta\delta)=80.5$ ps is obtained when an expected value of a peak to peak value of a deterministic component is 100 ps.

Correspondingly, in the measurement performing a threshold process, it is possible to obtain $D(p-p)=99.0$ ps substantially equal to an expected value. Similarly, when measuring a probability density function made by convolution integrating two sine waves of a sine wave and a relatively small sine wave as a deterministic jitter, in the measurement performing a threshold process, it is possible to obtain $D(p-p)=49.0$ ps substantially equal to an expected value. Moreover, conventionally, each deterministic component cannot be separated from a probability density function in which a plurality of deterministic components is convolution integrated.

Figures 27A, 27B:
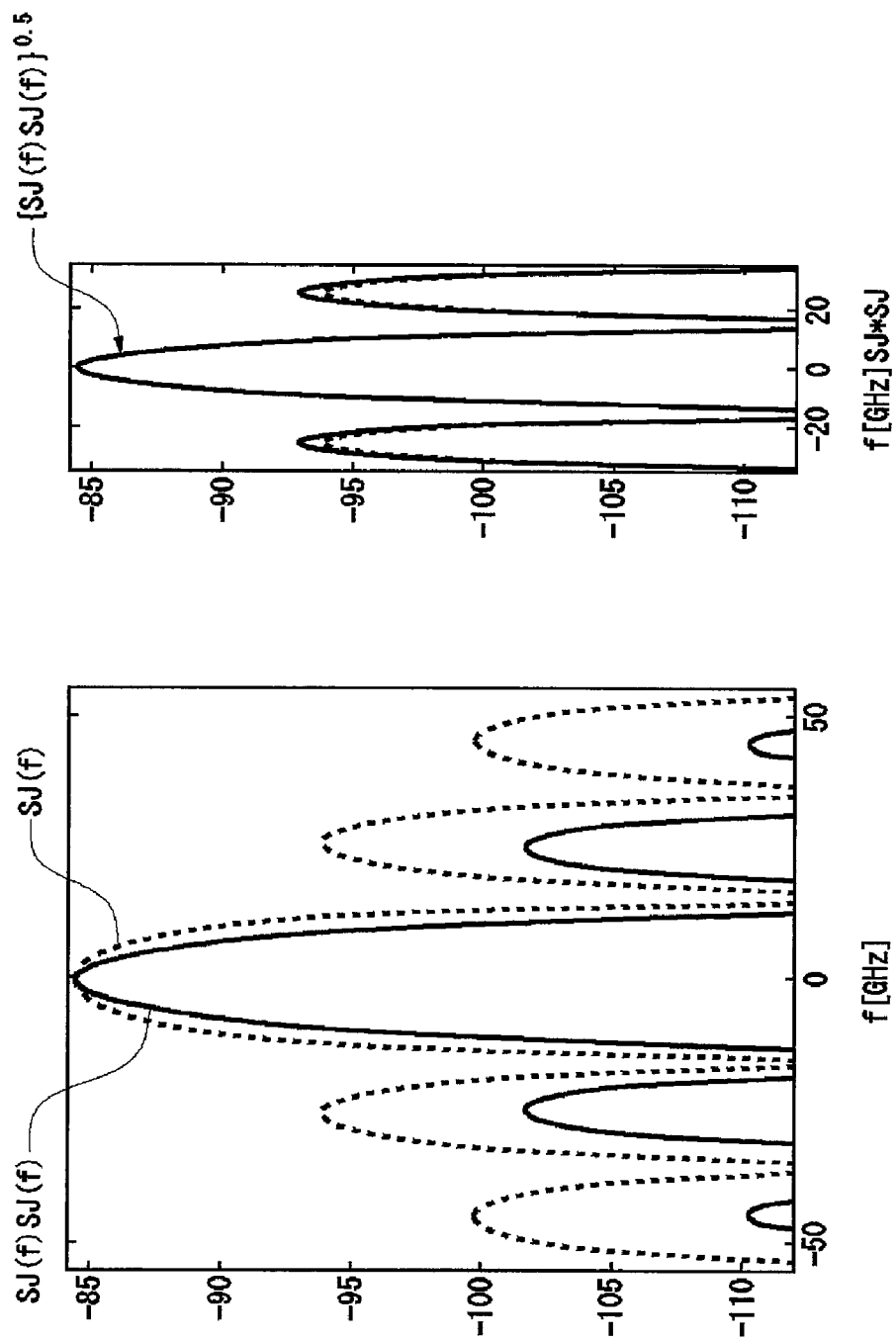
FIG. 27A shows a spectrum of a probability density function with a deterministic component of a sine wave and a spectrum of a probability density function with a deterministic component in which two sine waves are convolution integrated.
FIG. 27B is a view showing comparison for a main lobe.

FIG. 27A shows a spectrum of a probability density function with a deterministic component of a sine wave and a spectrum of a probability density function with a deterministic component in which two sine waves are convolution integrated. Since a spectrum of a probability density function in which two sine waves are convolution integrated is a square of a spectrum of a probability density function of one sine wave, a magnitude of a main lobe adjacent to 0 Hz changes.

In other words, as shown in FIG. 27B, when raising a spectrum of a probability density function in which two sine waves are convolution integrated to 0.5th power, a probability density function of one sine wave and a main lobe are to be identical with each other. Using the above-described principle, it is possible to obtain the number of deterministic components included in a probability density function.

Figure 28:
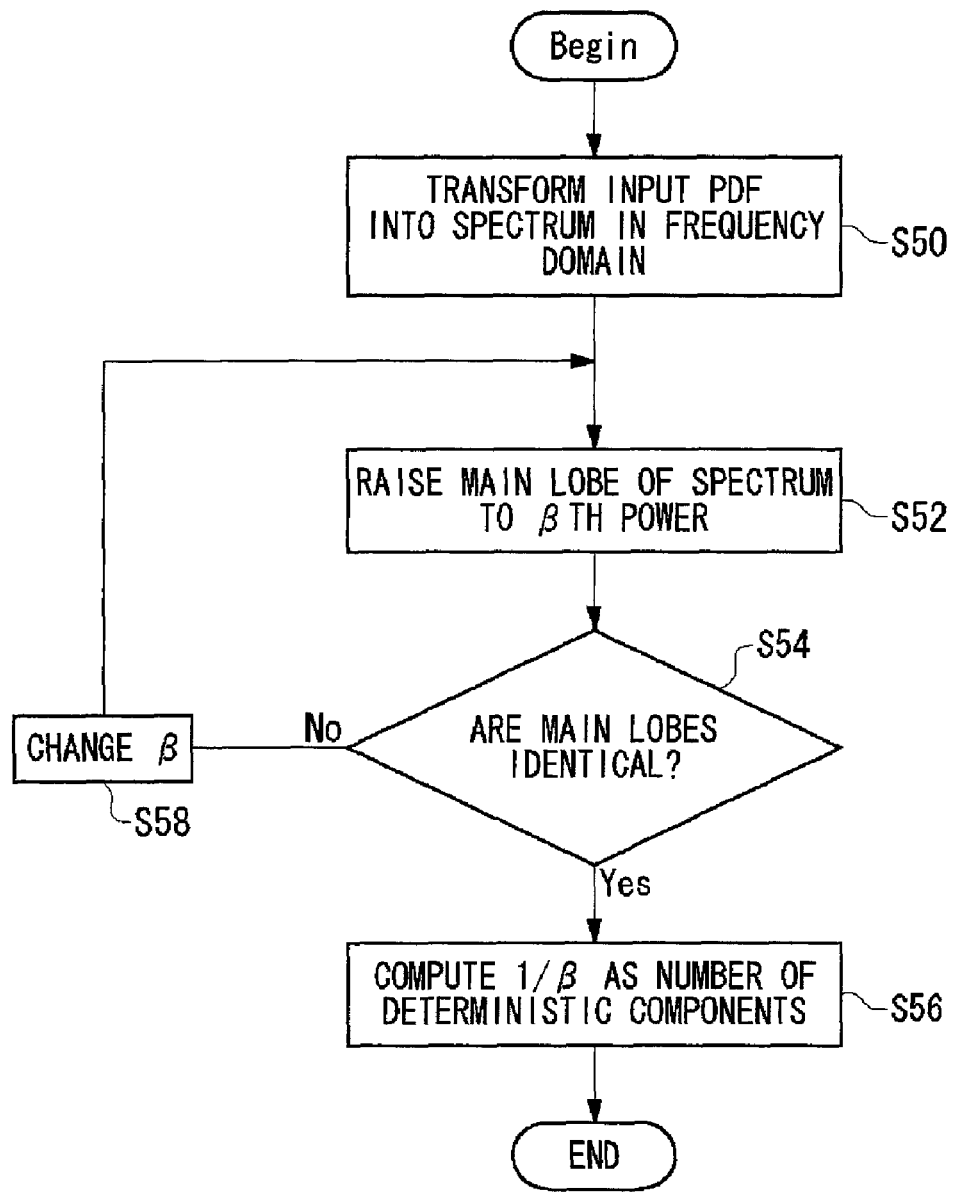
FIG. 28 is a flowchart exemplary showing a method for obtaining the number of deterministic components included in a probability density function.

FIG. 28 is a flowchart exemplary showing a method for obtaining the number of deterministic components included in a probability density function. First, an input PDF is transformed into a spectrum in a frequency domain (S50). The step S50 may be performed by the domain transforming section 110.

Next, a main lobe of a spectrum is raised to $\beta$th power (S52). Then, it is decided whether a main lobe of a spectrum of a probability density function with a predetermined deterministic component and $\beta$ power of the main lobe obtained in S52 are identical with each other (S54). That main lobes are identical with each other may be determined when an error between the main lobes is within a predetermined range. A probability density function with a predetermined deterministic component may be designated by a user. Moreover, as described in reference to FIG. 10, the deterministic component computing section 150 may select a probability density function with a deterministic component out of a previously given plurality of functions.

In S54, when it is determined that the main lobes are not identical with each other, $\beta$ is changed (S58), and then the processes of S52 and S54 are repeated. Moreover, in S54, when it is determined that the main lobes are identical with each other, the number of deterministic components is computed in S56.

In S56, $1/\beta$ is computed as the number of deterministic components. At this time, $\beta$ is not limited to an integer number. A value of $\beta$ after the decimal point shows that a deterministic component with the different size is included.

For example, when $D(p-p)$ values of two sine waves described in FIGS. 24A, 24B, 25A and 25B are 50 ps, the whole value of $D(p-p)$ becomes 100 ps. Then, for example, when performing a threshold process described in FIGS. 25A and 25B, a value substantially equal to 100 ps is measured as $D(p-p)$ of a deterministic jitter.

Furthermore, by a method described in reference to FIG. 28, the number of deterministic components is computed. Since values of $D(p-p)$ of two sine waves are substantially equal, $\beta=0.5$ is computed and the number of deterministic components becomes two. From the above-described result, it is possible to compute $D(p-p)$ of each sine wave as 50 ps.

As described above, according to this method, it is possible to estimate the number of deterministic components from a probability density function including a plurality of deterministic components. The number of deterministic components may be computed by the deterministic component computing section 150 according to the method.

Figure 29:
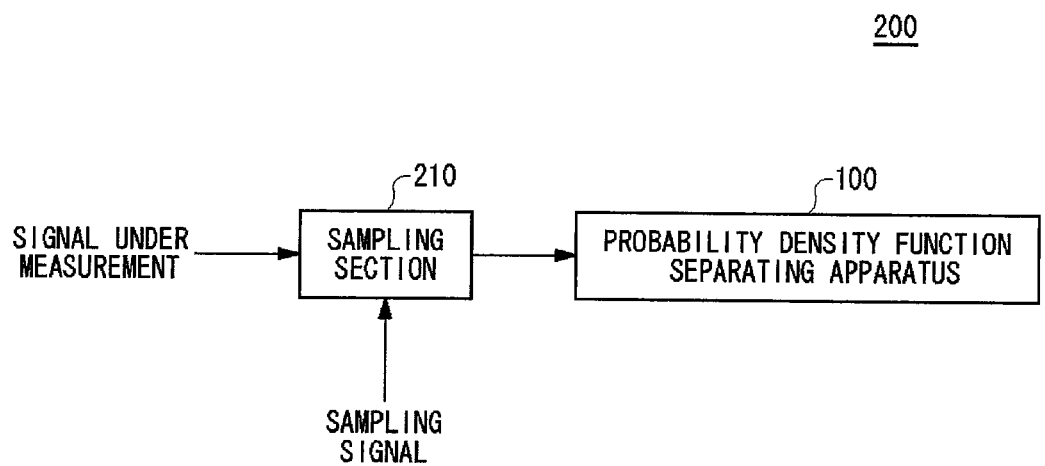
FIG. 29 is a view exemplary showing a configuration of a noise separating apparatus 200 according to an embodiment of the present invention.

FIG. 29 is a view exemplary showing a configuration of a noise separating apparatus 200 according to an embodiment of the present invention. The noise separating apparatus 200 separates a probability density function with a predetermined noise component from a probability density function of a signal under test. For example, the noise separating apparatus 200 separates a random noise component and a deterministic noise component from a probability density function with noises included in the signal under test.

The noise separating apparatus 200 includes a sampling section 210 and the probability density function separating apparatus 100. The probability density function separating apparatus 100 may have the same function and configuration as those of the probability density function separating apparatus 100 described in FIGS. 1 to 28.

The sampling section 210 samples the signal under test according to a given sampling signal, and generates a probability density function of the signal under test. For example, the sampling section 210 may generate a probability density function with jitter included in the signal under test, or generate a probability density function with amplitude noises of the signal under test.

Figure 30:
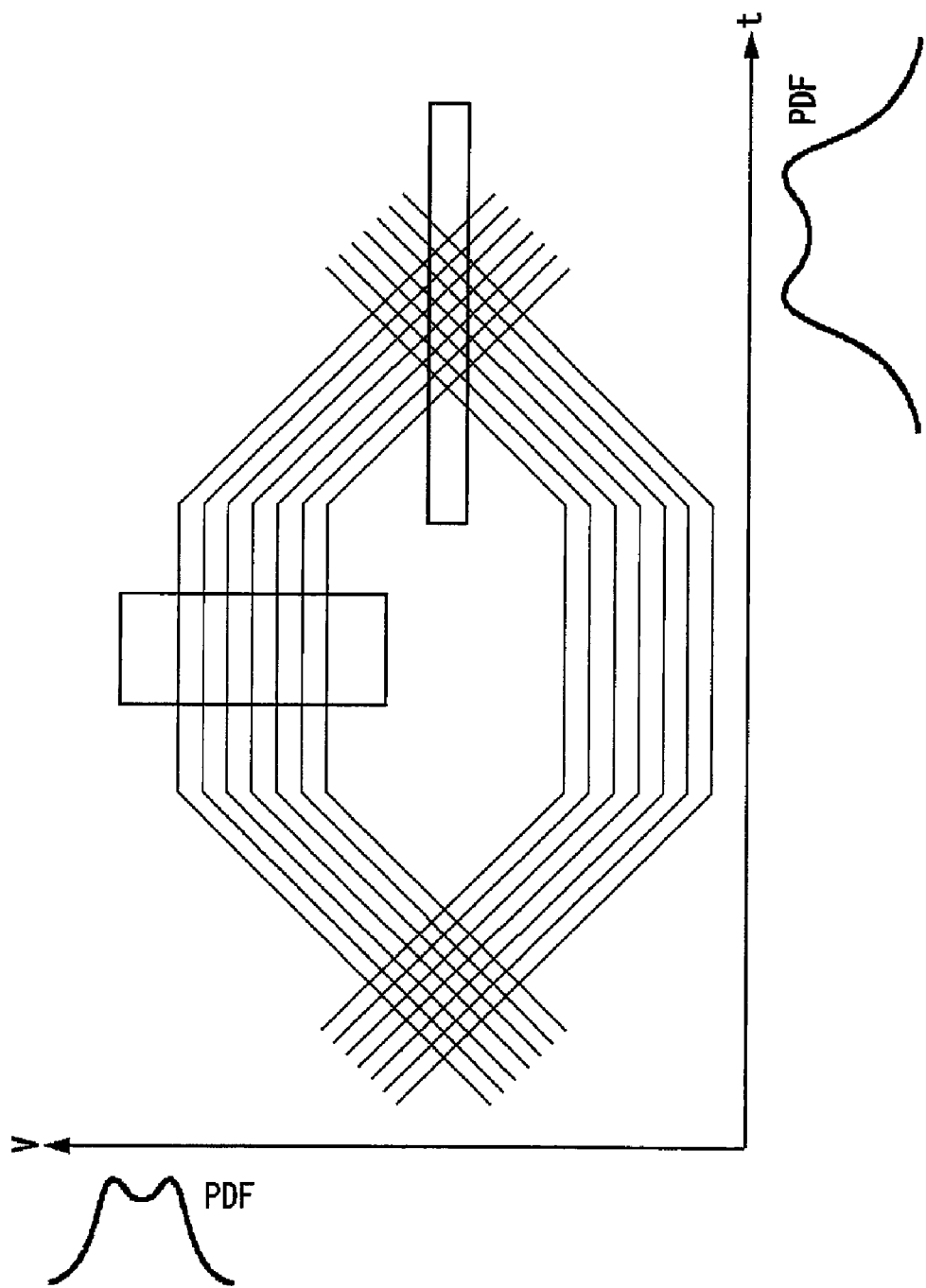
FIG. 30 is a view exemplary showing a probability density function of a signal under test generated from a sampling section 210.

FIG. 30 is a view exemplary showing a probability density function of a signal under test generated from the sampling section 210. The sampling section 210 according to the present example outputs a probability density function of a signal under test as described in FIG. 29. FIG. 30 shows an eye diagram of the signal under test assuming that a horizontal axis is a time and a vertical axis is a level of the signal under test. The sampling section 210 may acquire this eye diagram.

When generating a probability density function with jitter included in the signal under test, the sampling section 210 computes a probability by which an edge of the signal under test exists for each time. For example, the sampling section 210 may sample the signal under test by multiple times for each of relative timings for the signal under test in a transition timing of the signal under test. Then, a probability by which an edge exists at each of the relative timings may be acquired based on a sampling result.

Moreover, when generating a probability density function of amplitude noises in a signal under test, the sampling section 210 acquires a probability by which the signal under test is likely to have a particular amplitude value. For example, the sampling section 210 acquires an amplitude value of the signal under test at the generally same relative timing to the signal under test in a stationary timing of the signal under test.

When the sampling section 210 is a comparator for comparing a reference voltage and a level of the signal under test, the sampling section 210 may change this reference voltage and sample the signal under test for each reference voltage by multiple times. For each amplitude value, the sampling section 210 acquires a probability based on a sampling result.

The probability density function separating apparatus 100 separates a random component and a deterministic component from a probability density function provided from the sampling section 210. For example, when this probability density function is a probability density function of jitter in a signal under test, the probability density function separating apparatus 100 can separate a random jitter from a deterministic jitter in the signal under test with high precision.

Moreover, when this probability density function is a probability density function of amplitude noises in a signal under test, the probability density function separating apparatus 100 can separate a random component from a deterministic component in amplitude noises of the signal under test with high precision. For this reason, according to the noise separating apparatus 200 in the present example, it is possible to separate a noises component of a signal under test with high precision and thus analyze the signal under test with high precision.

Moreover, the noise separating apparatus 200 can also separate a random component from a deterministic component in noises of a sampling signal given to the sampling section 210. For example, the sampling section 210 has a comparator or an ADC for converting a level of a signal under test into a digital value according to the sampling signal.

When an analog sinusoidal jitter or amplitude noise is given as a signal under test, a probability density function of digital data output from the comparator or the ADC in the sampling section 210 shows a characteristic that both ends sharply attenuated as shown in FIG. 2. However, when internal noises occur in a sampling signal and measurement errors occur in digital data, this probability density function becomes a composite component of a random component and a deterministic component.

The sampling section 210 generates a probability density function of the signal under test based on a result obtained by sampling the signal under test with small noises. Then, the probability density function separating apparatus 100 separates a random component and a deterministic component included in this probability density function. In this way, it is possible to measure noises of a sampling signal with high precision. Moreover, the noise separating apparatus 200 can be also used for a test of the ADC. That is to say, it is possible to separate a deterministic component caused by a code error of the ADC.

Figure 31:
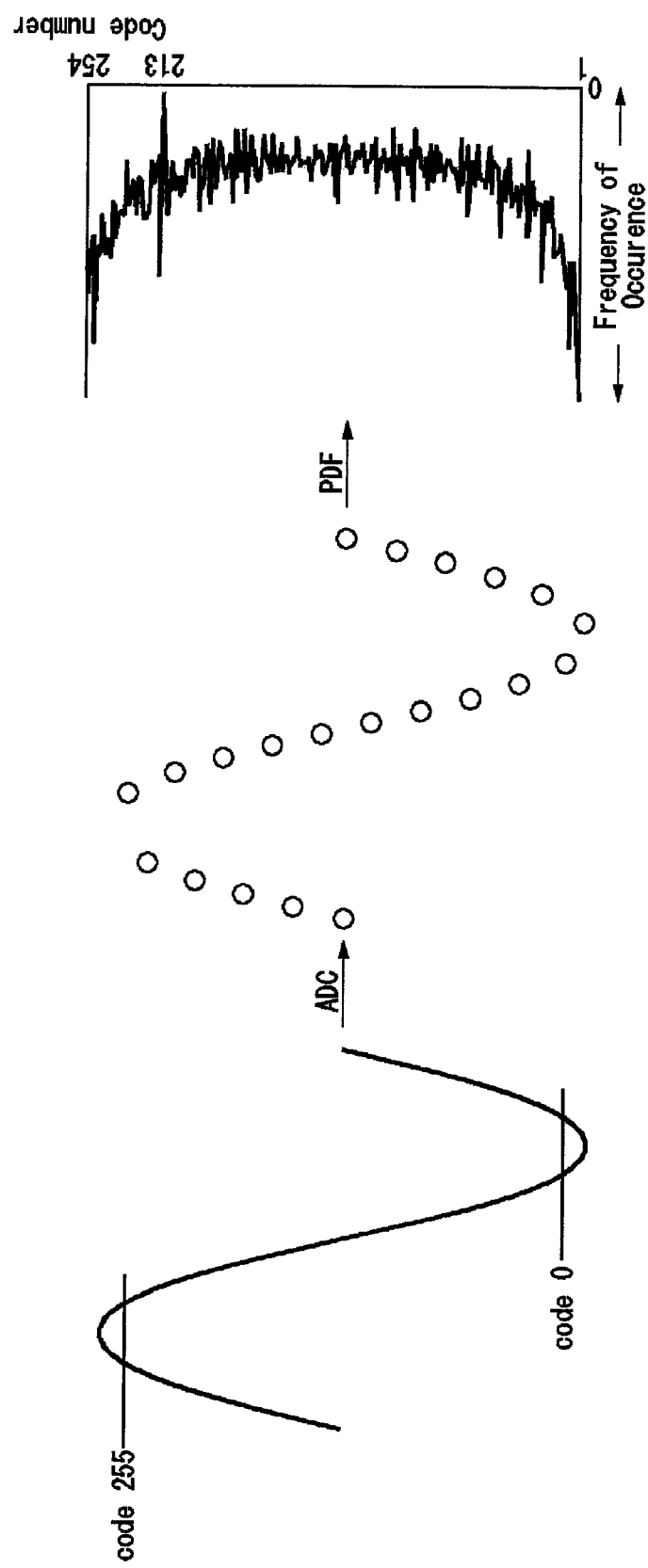
FIG. 31 is a view explaining a deterministic component by a code error of ADC.

FIG. 31 is a view showing probability density of each code of an ADC when the ADC samples a sine wave without noises. Here, a code of the ADC is a code corresponding to each digital value output from the ADC. The ADC determines which code corresponds to a level of a signal to be input, and outputs a digital value according to this code.

In the present example, the ADC has codes of 0 to 255. Here, it will be described, for example, about when an error occurs in the 213th code and a level corresponding to this code cannot be detected. In this case, as shown in FIG. 31, probability density of the code 213 deteriorates and probability density of a code (a code 214 in the present example) adjacent to the code 213 rises. The reason is that the code 214 detects a level of a sine wave to be originally detected by the code 213.

A probability density function shown in FIG. 31 includes a deterministic component by a sine wave to be input and a deterministic component caused by a code error of the ADC. As described in reference to FIG. 28, the probability density function separating apparatus 100 can separate these deterministic components.

Figure 32:
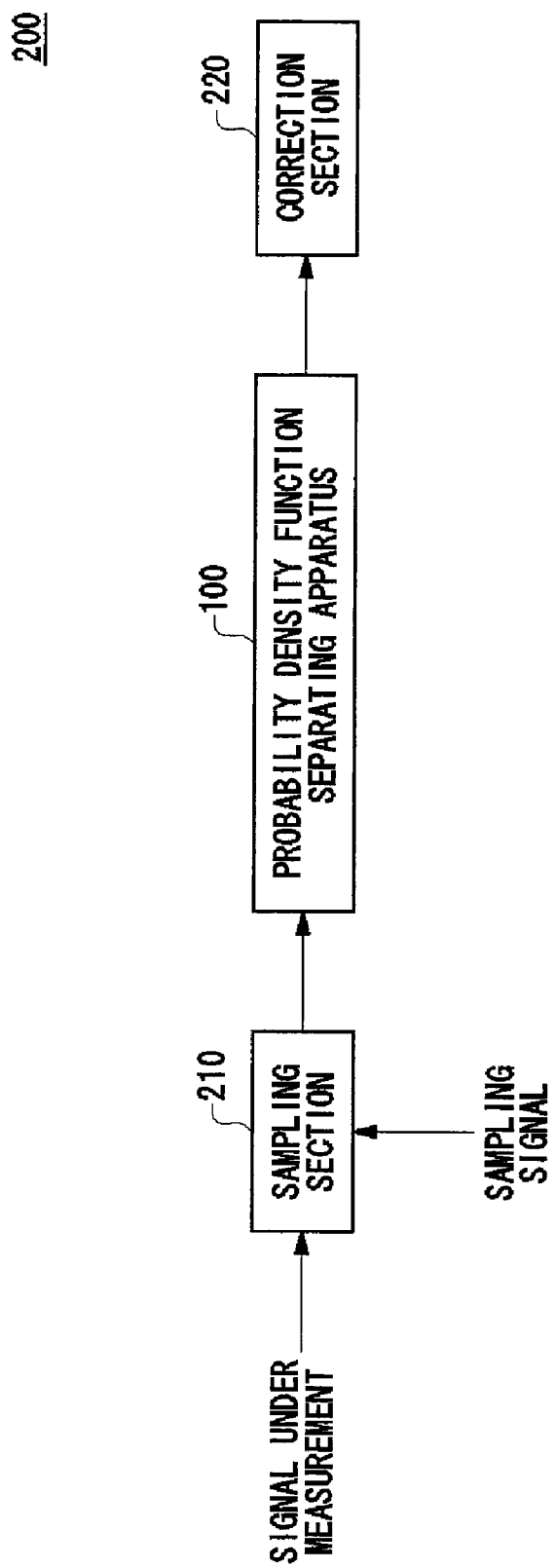
FIG. 32 is a view showing another example of a configuration of a noise separating apparatus 200.

FIG. 32 is a view showing another example of a configuration of the noise separating apparatus 200. The noise separating apparatus 200 in the present example further includes a correction section 220 in addition to a configuration of the noise separating apparatus 200 described with reference to FIG. 29. The noise separating apparatus 200 in the present example reduces an influence by internal noises of the above-described sampling signal to separate a deterministic component and a random component from a probability density function of a signal under test.

For example, when reducing an influence by noises of a sampling signal, the sampling section 210 first functions as a sampling signal measuring section that computes a probability density function of a sampling signal itself as described above. At this time, it is preferable that the sampling section 210 is supplied with a reference signal with small noises.

Moreover, the sampling section 210 functions as a signal under test measuring section that computes a probability density function of a measurement signal to be measured. At this time, the sampling section 210 may perform an operation similar to that of the sampling section 210 described in FIG. 24.

The probability density function separating apparatus 100 separates a random component and a deterministic component from each of a probability density function of a signal under test and a probability density function of a timing signal.

Then, the correction section 220 separates a random component from a deterministic component in the signal under test with higher precision by correcting a parameter of the probability density function of the signal under test based on the probability density function of the timing signal.

For example, the correction section 220 may correct a random component according to the signal under test by subtracting energy of a random component according to the timing signal from energy of a random component according to the signal under test. Moreover, the correction section 220 may correct a deterministic component according to the signal under test by subtracting a deterministic component according to the timing signal from a deterministic component according to the signal under test. By such a process, it is possible to separate a random component from a deterministic component according to a signal under test with high precision.

Figure 33:
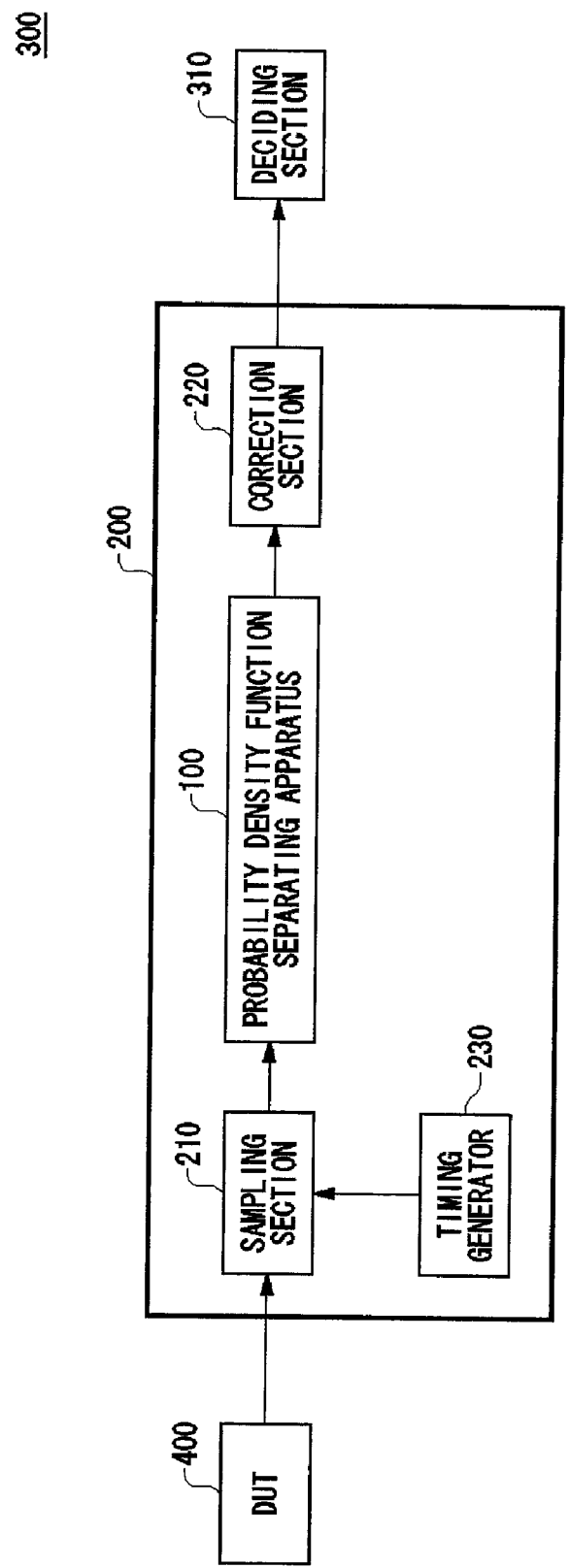
FIG. 33 is a view exemplary showing a configuration of a testing apparatus 300 according to an embodiment of the present invention.

FIG. 33 is a view exemplary showing a configuration of a testing apparatus 300 according to an embodiment of the present invention. The testing apparatus 300 is an apparatus for testing a device under test 400 and includes a noise separating apparatus 200 and a deciding section 310.

The noise separating apparatus 200 has a configuration substantially equal to that of the noise separating apparatus 200 described in FIGS. 29 to 32 and measures a signal under test output from the device under test 400. In the present example, the noise separating apparatus 200 has a configuration substantially equal to that of the noise separating apparatus 200 shown in FIG. 32. The noise separating apparatus 200 may have a timing generator 230 for generating a timing signal as shown in FIG. 32. The other components are equal to components with the same symbol described in reference to FIGS. 29 to 28.

The deciding section 310 decides the good or bad of the device under test 400 based on a random noise component and a deterministic noise component separated from the noise separating apparatus 200. For example, the deciding section 310 may decide the good or bad of the device under test 400 based on whether standard deviation of the random noise component is within a predetermined range.

Moreover, the deciding section 310 may decide the good or bad of the device under test 400 based on whether a peak to peak value of the deterministic noise component is within a predetermined range. The deciding section 310 may compute total jitter from the standard deviation of the random noise component and the peak to peak value of the deterministic noise component, and decide the good or bad of the device under test 400. The deciding section 310 may compute total jitter, for example, given by $14*\sigma+D(p-p)$. Here, the coefficient "14" is associated with the bit error rate of $10^{-12}$ in the table shown in FIG. 19D. The coefficient may be selected in accordance with the bit error rate threshold for the device under test.

According to the testing apparatus 300 in the present example, since a probability density function of a signal under test can be separated with high precision, it is possible to decide the good or bad of the device under test 400 with high precision. Moreover, the testing apparatus 300 may further include a pattern generating section that inputs a test signal into the device under test 400 and outputs a predetermined output signal.

FIG. 34 is a view exemplary showing a measurement result of jitter by the jitter separating apparatus 200 and a measurement result of jitter by a conventional method. As shown in FIG. 34, the jitter separating apparatus 200 can obtain a measurement result with precision more preferable than a conventional method in any measurement result of a random jitter and a deterministic jitter, about when only a random jitter is included in a signal under test, when a random jitter and sine wave jitter (a deterministic jitter) are included in a signal under test, and when noises are included in a sampling signal.

Figure 35:
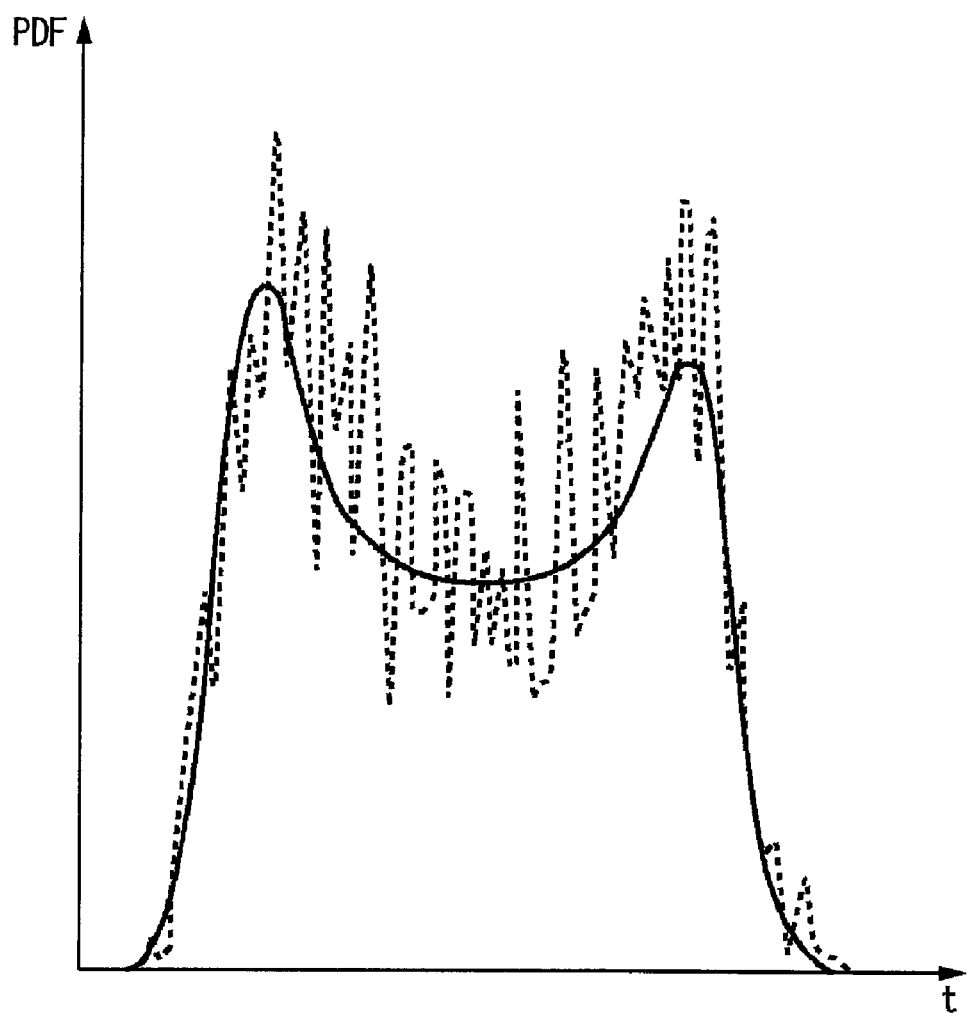
FIG. 35 is a view showing a conventional measurement result described in FIG. 34.

FIG. 35 is a view showing a conventional measurement result described in FIG. 34. As described above, according to a conventional measuring method, tail portions of an input PDF shown with a wavy line in FIG. 35 is curve fitted. As a result, random components as shown with a solid line in FIG. 35 is detected. Moreover, an interval between two peaks of this random components is detected as a deterministic component. When using such a measuring method, since curve-fitting approximation is used, each component cannot be measured with high precision. For this reason, a measurement result has gross errors with respect to an expected value as shown in FIG. 34.

Moreover, this method cannot separate a deterministic component caused by the above-described error in sampling signal and a deterministic component caused by a code error of an ADC. For this reason, for example, when a sampling error occurs as shown in FIG. 34, it is not possible to perform measurement with high precision.

Figure 36B:
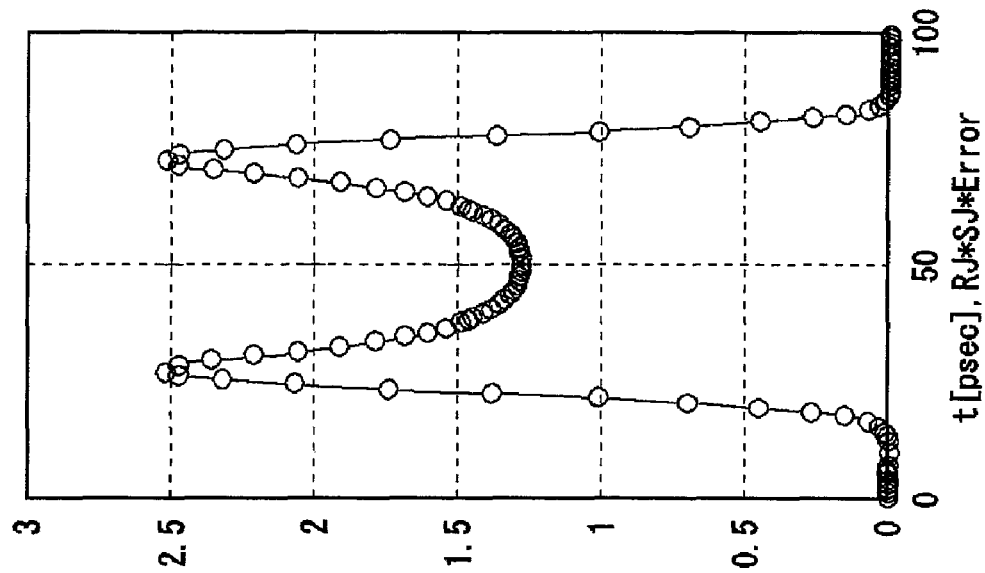
FIG. 36B is a view showing a probability density function obtained by convolving a deterministic component and a random component which are separated by the probability density function separating apparatus 100.
Figure 36A:
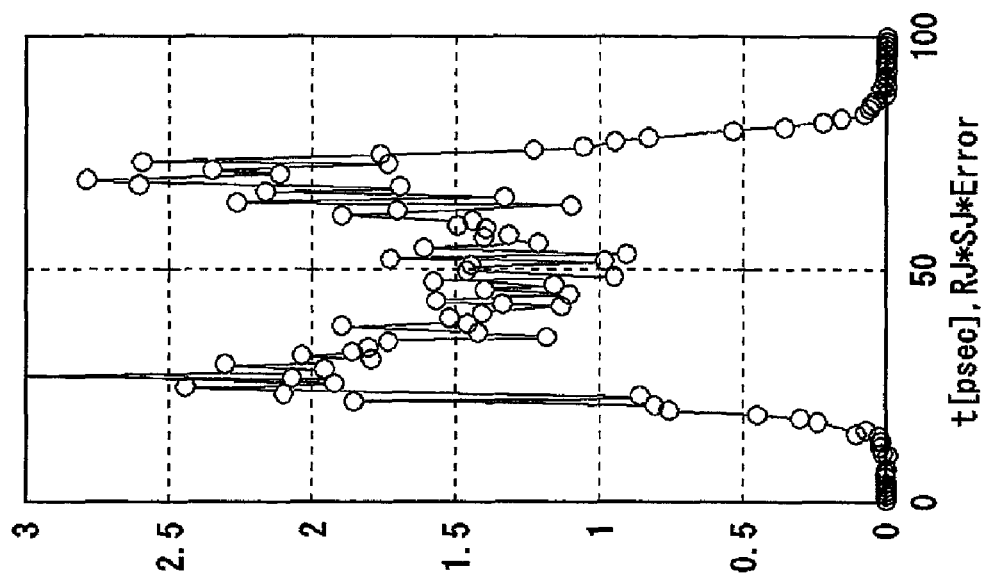
FIG. 36A is a view showing an input PDF.

FIGS. 36A and 36B are views showing a measurement result by the present invention described in FIG. 34. FIG. 36A shows an input PDF and FIG. 36B shows a probability density function obtained by convolving a deterministic component and a random component separated using the probability density function separating apparatus 100.

The probability density function separating apparatus 100 can separate a random component from a deterministic component in the input PDF with high precision as described above. For this reason, as shown in FIG. 34, it is possible to obtain a measurement result with a small error for an expected value. Furthermore, since the present invention can separate a plurality of deterministic components, it is possible to separate, for example, a deterministic component of a sinusoid and a deterministic component caused by timing errors in a sampling signal. As a result, it is possible to perform measurement with higher precision.

Figure 37:
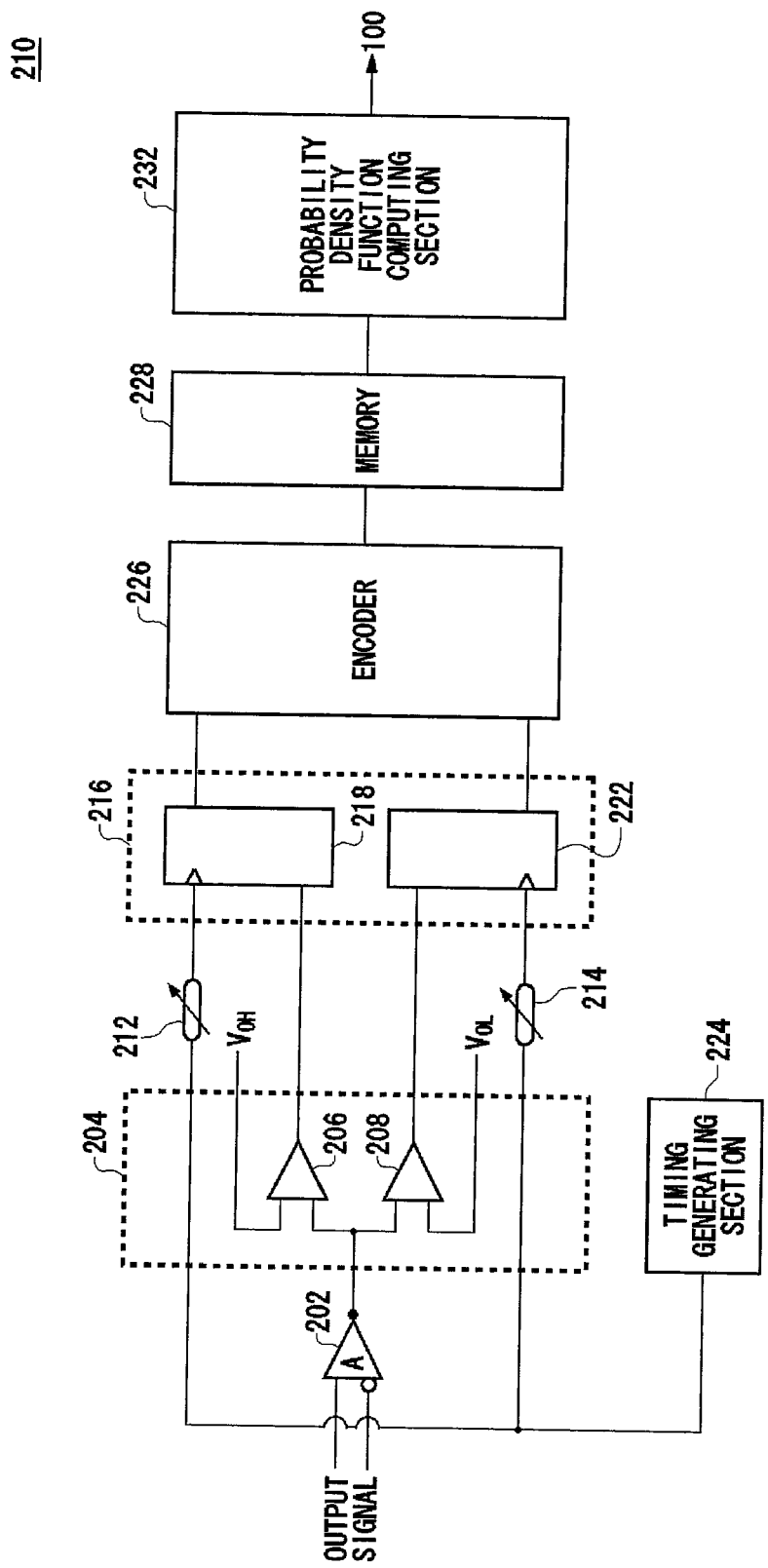
FIG. 37 is a view exemplary showing a configuration of a sampling section 210 described in FIG. 33.

FIG. 37 is a view exemplary showing a configuration of the sampling section 210 described in FIG. 33. The sampling section 210 has an amplifier 202, a level comparing section 204, a variable delay circuit 212, a variable delay circuit 214, a timing comparing section 216, an encoder 226, a memory 228, and a probability density function computing section 232.

The amplifier 202 receives an output signal from the device under test 400, amplifies the signal at a predetermined amplification gain, and outputs the amplified signal. The level comparing section 204 compares a level of the output signal and a given reference value, and outputs a comparison result. In the present example, the level comparing section 204 has a comparator 206 and a comparator 208. The comparator 206 is supplied with a reference value of a High level. Moreover, the comparator 208 is supplied with a reference value of a Low level.

The timing comparing section 216 samples the comparison result output from the level comparing section 204 according to a given timing signal, and converts it into digital data. In the present example, the timing comparing section 216 has a flip-flop 218 and a flip-flop 222.

The flip-flop 218 receives the timing signal output from the timing generating section 224 via the variable delay circuit 212. Moreover, the flip-flop 218 samples the comparison result output from the comparator 206 according to this timing signal.

The flip-flop 222 receives the timing signal output from the timing generating section 224 via the variable delay circuit 214. Moreover, the flip-flop 222 samples the comparison result output from the comparator 208 according to this timing signal.

In the present example, the level comparing section 204 has two comparators 206 and 208. However, the level comparing section 204 may output a comparison result by one comparator, or may output a comparison result by three or more comparators. In other words, the level comparing section 204 may output a comparison result with multiple values. The timing comparing section 216 may have flip-flops according to the number of comparators belonging to the level comparing section 204.

The variable delay circuits 212 and 214 delay and output a timing signal. The variable delay circuits 212 and 214 adjust a phase of the timing signal to a predetermined phase to supply it to the timing comparing section 216.

The encoder 226 encodes the digital data output from the timing comparing section 216. For example, the encoder 226 may generate digital data with multiple values based on each of the digital data output from the flip-flop 218 and the flip-flop 222. The memory 228 stores the digital data generated from the encoder 226.

The probability density function computing section 232 computes a probability density function of the output signal based on the digital data stored on the memory 228. For example, the probability density function computing section 232 may generate a probability density function with a jitter described in FIG. 30, or may generate a probability density function with an amplitude degradation component described in FIG. 30.

When generating a probability density function with a jitter, the timing generating section 224 generates a timing signal of which a phase for the output signal is sequentially changed. The phase of the timing signal may be adjusted by changing a delay amount in the variable delay circuits 212 and 214. Moreover, the level comparing section 204 is supplied with a reference value.

The timing comparing section 216 samples a logical value of the output signal according to a timing signal of which a phase for the output signal is sequentially changed. The probability density function computing section 232 compares a sampled value sequence stored on the memory 228 and a given expected value sequence.

Moreover, the probability density function computing section 232 detects a phase of the output signal based on this comparison result. For example, the probability density function computing section 232 may detect a phase of an edge of the output signal based on this comparison result. Moreover, the probability density function computing section 232 may detect a timing at which a logical value of the output signal is changed. At this time, although consecutive data in the output sequence show the identical logical value, the probability density function computing section 232 can detect a boundary timing of each data section in the output signal.

Moreover, the timing comparing section 216 and the probability density function computing section 232 perform comparison between the logical value of the output sequence and the expected value at each phase of the timing signal for multiple times, and obtains an error count value. A probability by which the logical value of the output signal is generated at each phase can be computed from this error count value. In other words, it is possible to generate a probability density function with a jitter. For example, the timing comparing section 216 and the probability density function computing section 232 perform comparison between the logical value of the output sequence and the expected value at each phase of the timing signal for multiple times. Then, a probability density function may be obtained by computing a difference between error count values of adjacent phases of the corresponding timing signals.

Next, it will be described about when a probability density function with an amplitude degradation component in an output signal is generated. In this case, the timing generating section 224 generates a timing signal substantially synchronized with the output signal. In other words, an edge of the timing signal has a constant phase for the output signal. Moreover, the level comparing section 204 is sequentially supplied with different reference values.

The timing comparing section 216 samples the comparison result according to the timing signal synchronized with the output signal. In other words, the timing comparing section 216 detects a comparison result between a level of the output signal at an edge timing of the timing signal and a reference value. It is possible to generate a probability density function with an amplitude degradation component in the output signal by detecting this comparison result for each reference value for multiple times.

The probability density function computing section 232 supplies the generated probability density function to the probability density function separating apparatus 100. By such a configuration, it is possible to separate a noise component from an output signal with high precision and thus test the device under test 400 with high precision. For example, in case of testing a random jitter included in an output signal from the device under test 400, when a deterministic jitter occurs in a timing signal, the good or bad of the device under test 400 cannot be decided with high precision. However, according to the testing apparatus 300 in the present example, it is possible to simultaneously separate a component of a deterministic jitter caused by a timing signal and detect a component of a random jitter in an output signal.

FIG. 38 is a view exemplary showing a measurement result by the testing apparatus 300 described with reference to FIG. 37 and a measurement result by a conventional curve fitting method described in FIG. 2. In FIG. 2 shows an error between each measurement result and a measurement result to be expected.

In addition, the measurement result by a conventional method in the present example has been quoted from the following document: G. Hansel, K. Stieglbauer, "Implementation of an Economic Jitter Compliance Test for a Multi-Gigabit Device on ATE", in Proc. IEEE int. Test Conf., Charlotte, N.C., Oct. 26-28, 2004, pp. 1303-1311.

Moreover, in measurement of the present example, a random component and a deterministic component in a probability density function of jitter in an output signal from the device under test 400 have been separated from each other. Moreover, the measurement result by the conventional method corresponds to a case of including a large sinusoidal component with amplitude of about 40 ps and a case including a small sinusoidal component with amplitude of about 5 ps as a deterministic component. As shown in FIG. 38, the testing apparatus 300 can obtain a measurement result with a smaller error than that of a conventional curve fitting method in any case.

Figure 39:
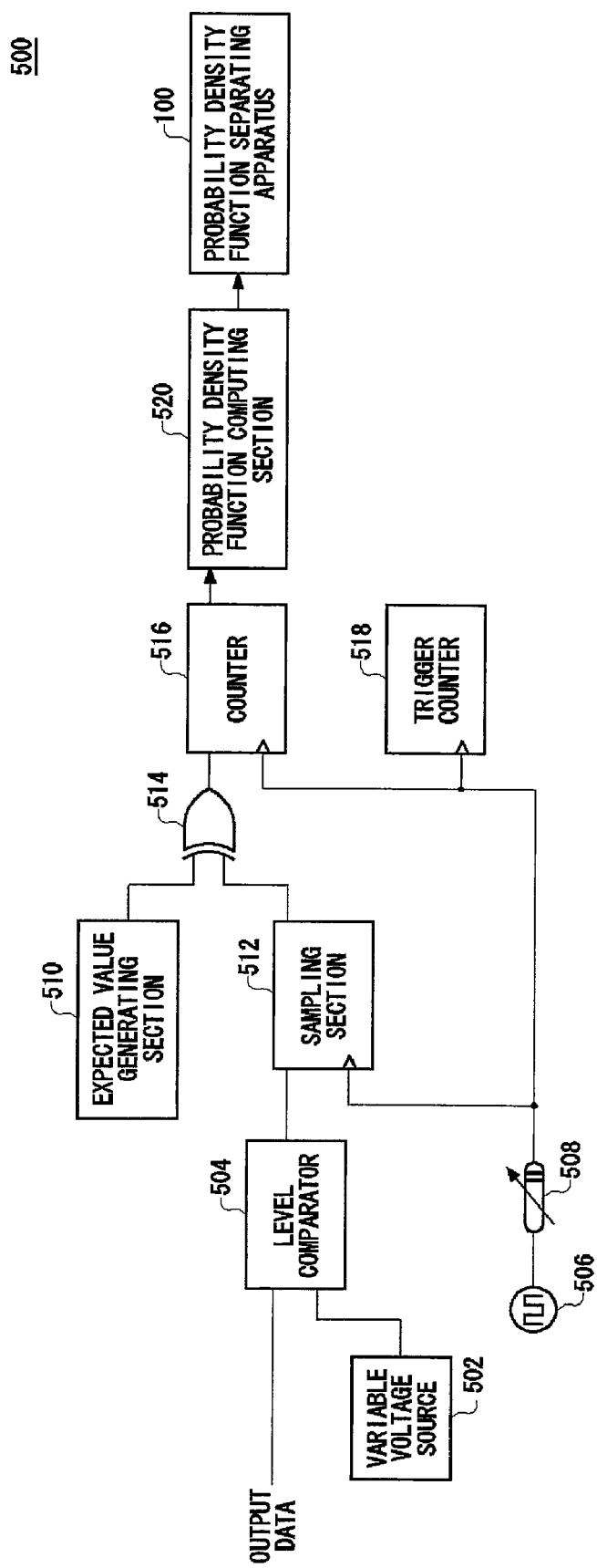
FIG. 39 is a view exemplary showing a configuration of a bit error rate measuring apparatus 500 according to an embodiment of the present invention.

FIG. 39 is a view exemplary showing a configuration of a bit error rate measuring apparatus 500 according to an embodiment of the present invention. The bit error rate measuring apparatus 500 is an apparatus for measuring a bit error rate of output data provided from the device under test 400 or the like, and includes a variable voltage source 502, a level comparator 504, an expected value generating section 510, a sampling section 512, an expected value comparing section 514, a timing generating section 506, a variable delay circuit 508, a counter 516, a trigger counter 518, a probability density function computing section 520, and a probability density function separating apparatus 100.

The level comparator 504 compares a level of output data and a given reference value, and outputs comparison data. For example, the level comparator 504 outputs comparison data showing a magnitude relation between a level of output data and the given reference value with a binary logical value. The variable voltage source 502 generates this reference value. The sampling section 512 samples a data value output from the level comparator 504 according to a given timing signal.

The timing generating section 506 generates a timing signal, and supplies the generated signal to the sampling section 512 via the variable delay circuit 508. The timing generating section 506 may generate a timing signal with a period substantially equal to that of the output data. The variable delay circuit 508 adjusts the timing signal to a predetermined phase.

The expected value generating section 510 generates an expected value that the data value output from the sampling section 512 should have. The expected value comparing section 514 compares the data value output from the sampling section 512 and the expected value output from the expected value generating section 510. The expected value comparing section 514 may output, for example, an exclusive OR of this data value and this expected value.

The counter 516 counts the number of times by which a comparison result in the expected value comparing section 514 shows a predetermined logical value. For example, the counter counts the number of times by which the exclusive OR output from the expected value comparing section 514 is one. Moreover, the trigger counter 518 counts pulses of the timing signal.

By such a configuration, it is possible to count the number of erroneous timings by which a data value of output data at a particular phase of timing signal is different form expected value. Moreover, similarly to the testing apparatus 300 described in FIG. 37, an error count value is obtained for each phase of a timing signal by sequentially changing a phase of the timing signal. The probability density function computing section 520 may compute a probability density function of a jitter in output data by computing a difference between adjacent error count values.

In addition, similarly to the testing apparatus 300 described in FIG. 37, although consecutive data in an output sequence show the identical logical value, the probability density function computing section 520 can detect a boundary timing of each data section in output data.

Moreover, similarly to the testing apparatus 300 described in FIG. 37, the probability density function computing section 520 can compute a probability density function of an amplitude degradation component of output data by sequentially changing the reference value generated from the variable voltage source 502. In this case, a phase of a timing signal for capturing output data is substantially constantly controlled.

The probability density function separating apparatus 100 is equal to the probability density function separating apparatus 100 described with reference to FIG. 33. That is to say, a deterministic component and a random component in a given probability density function are separated from each other.

By such a configuration, it is possible to generate a probability density function of given output data and simultaneously separate a deterministic component and a random component. In other words, it is possible to simultaneously separate and analyze a bit error caused by a deterministic component from a bit error caused by a random component.

Figure 40:
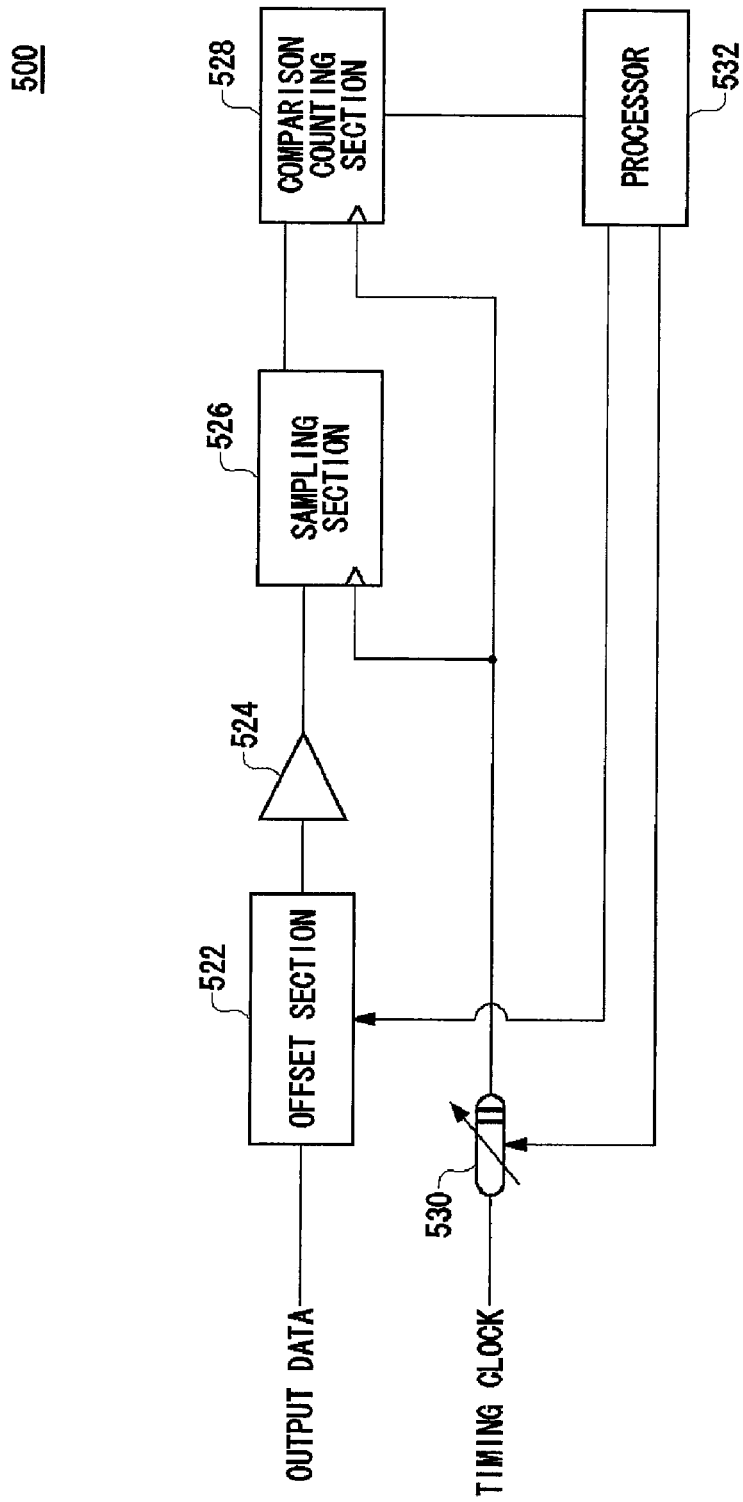
FIG. 40 is a view showing another example of the configuration of the bit error rate measuring apparatus 500.

FIG. 40 is a view showing another example of a configuration of the bit error rate measuring apparatus 500. The bit error rate measuring apparatus 500 in the present example includes an offset section 522, an amplifier 524, a sampling section 526, a comparison counting section 528, a variable delay circuit 530, and a processor 532.

The offset section 522 adds a predetermined offset voltage to a waveform of output data. The amplifier 524 outputs a signal output from the offset section 522 at a predetermined amplification factor.

The sampling section 526 samples a data value of the signal output from the amplifier 524 according to a given timing clock. A timing clock may be, e.g., a recovered clock generated from output data. The variable delay circuit 530 adjusts a timing clock to a predetermined phase.

The comparison counting section 528 compares a data value output from the sampling section 526 and a given expected value, and counts a comparison result. The comparison counting section 528 may have a function equal to that of the expected value comparing section 514 and the counter 516 described in FIG. 39.

The processor 532 controls the offset section 522 and the variable delay circuit 530. For example, the processor adjusts an offset voltage to a predetermined level and controls a delay amount in the variable delay circuit 530. By such a configuration, it is possible to compute a probability by which a data value of output data corresponding to a phase of a timing clock is different from the expected value.

Moreover, the processor 532 functions as the probability density function computing section 520 and the probability density function separating apparatus 100 described in FIG. 39. Similarly to the testing apparatus 300 described in FIG. 37, the processor 532 can compute a probability density function of a jitter in output data by sequentially changing a phase of a timing clock. For example, it is possible to can change a phase of a timing clock by changing a delay amount in the variable delay circuit 530.

Here, a jitter in output data may be a timing jitter at a boundary of each data section in output data. Although consecutive data in an output signal show the identical logical value, the probability density function computing section 520 can detect a boundary timing of each data section in output signal.

Moreover, it is possible to perform measurement equal to a case when changing a reference value described in FIG. 39 by sequentially changing an offset voltage added by the offset section 522. In this case, the processor 532 can compute a probability density function with an amplitude degradation component of output data. In this case, a phase of a timing clock for output data is substantially constantly controlled.

The probability density function separating apparatus 100 is equal to the probability density function separating apparatus 100 described with reference to FIG. 33. That is to say, a deterministic component and a random component in a given probability density function are separated from each other.

By such a configuration, it is also possible to generate a probability density function of given output data and separate a deterministic component from a random component in this probability density function. In other words, it is possible to simultaneously separate and analyze a bit error caused by a deterministic component and a bit error caused by a random component.

Figure 41:
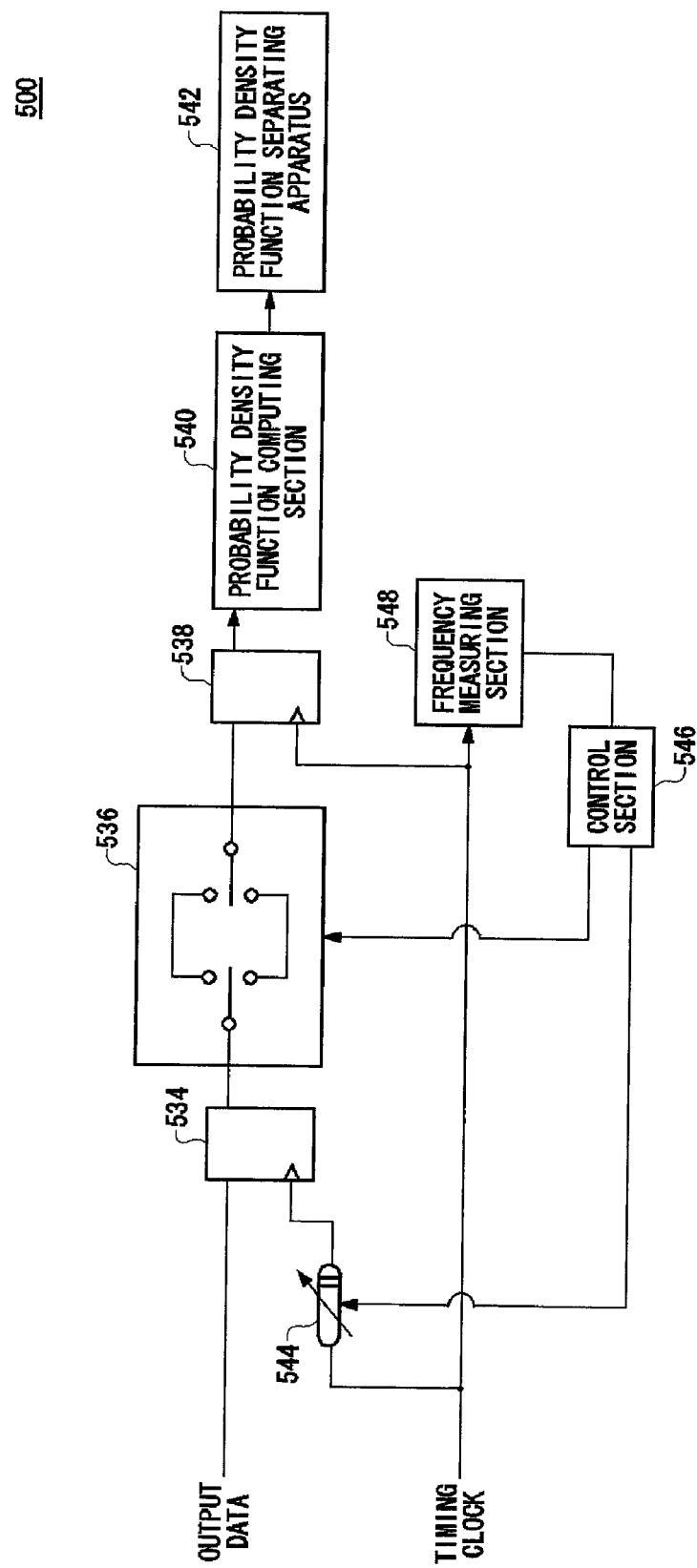
FIG. 41 is a view showing another example of the configuration of the bit error rate measuring apparatus 500.

FIG. 41 is a view showing another example of a configuration of the bit error rate measuring apparatus 500. The bit error rate measuring apparatus 500 in the present example includes a flip-flop 534, a switch section 536, a flip-flop 538, a frequency measuring section 548, a control section 546, a probability density function computing section 540, and a probability density function separating apparatus 542.

The flip-flop 534 samples a data value of output data according to a given timing clock. The switch section 536 selects one path from a plurality of paths having path length different from one another, and delays and outputs the data value output from the flip-flop 534 in a fixed delay amount according to the selected path. The latch section 538 latches the data value of which a phase is adjusted by the switch section 536 according to a given timing clock.

In other words, the bit error rate measuring apparatus 500 shown in FIG. 40 adjusts a relative phase of a sampling clock for output data by adjusting a phase of a timing clock. However, the bit error rate measuring apparatus 500 in the present example adjusts a relative phase of a sampling clock for output data by adjusting a phase of the output data.

As shown in FIG. 40, if a timing of a clock is controlled in a large range by means of a variable delay circuit, the variable delay element will output incomplete or partial clocks when delay setting changes are made. The bit error rate measuring apparatus 500 in the present example can reduce a delay range of the variable delay circuit 544 and thus reduce the generation of incomplete clocks.

The frequency measuring section 548 measures frequency of a timing clock. The control section 546 generates a first control signal controlling a delay amount in the variable delay circuit 544 and a second control signal controlling a delay amount in the switch section 536 based on frequency of a timing clock to be expected and a relative phase of a sampling clock to be set.

The probability density function computing section 540 computes a probability density function of output data based on a data value sequentially latched in the latch section 538. For example, similarly to the bit error rate measuring apparatus 500 described in FIG. 40, it is possible to compute a probability density function with a jitter of output data by sequentially changing a relative phase of a timing clock for the output data. Moreover, similarly to the bit error rate measuring apparatus 500 described in FIG. 40, in the present example, the bit error rate measuring apparatus 500 may further include means for computing a probability density function with an amplitude degradation component.

The probability density function separating apparatus 542 is equal to the probability density function separating apparatus 100 described with reference to FIG. 33. That is to say, a deterministic component and a random component are separated from a given probability density function.

By such a configuration, it is also possible to generate a probability density function of given output data and separate a deterministic component from a random component in this probability density function. In other words, it is possible to simultaneously separate and analyze a bit error caused by a deterministic component and a bit error caused by a random component.

In addition, a configuration of the bit error rate measuring apparatus 500 is not limited to the configurations described in FIGS. 39 to 41. It is possible to simultaneously separate and measure a random component and a deterministic component of a probability density function corresponding to a bit error rate by adding a probability density function separating apparatus and a probability density function computing section to a configuration of a conventional bit error rate measuring apparatus.

Figure 42:
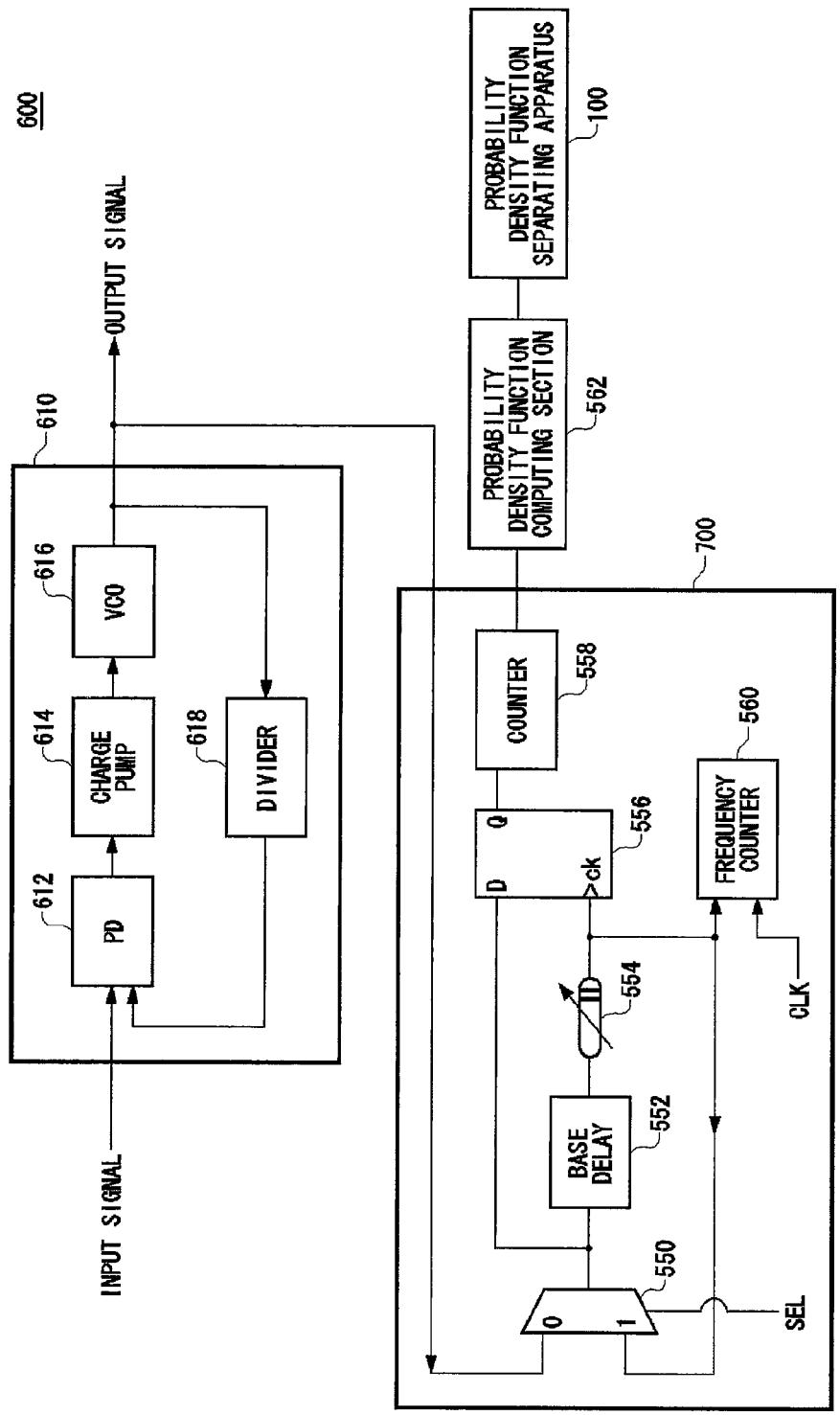
FIG. 42 is a view exemplary showing a configuration of an electronic device 600 according to an embodiment of the present invention.

FIG. 42 is a view exemplary showing a configuration of an electronic device 600 according to an embodiment of the present invention. The electronic device 600 may be a semiconductor chip for generating a predetermined signal. The electronic device 600 includes an operation circuit 610, a measurement circuit 700, a probability density function computing section 562, and a probability density function separating apparatus 100.

The operation circuit 610 outputs a predetermined signal according to a given input signal. In the present example, the operation circuit 610 is a PLL circuit having a phase comparator 612, a charge pump 614, a voltage controlled oscillator 616, and a divider 618. In addition, the operation circuit 610 is not limited to the PLL circuit.

The measurement circuit 700 has a selector 550, a base delay 552, a variable delay circuit 554, a flip-flop 556, a counter 558, and a frequency counter 560. The selector 550 selects and outputs either of an output signal from the operation circuit 610 or a round loop signal output from the variable delay circuit 554.

The base delay 552 delays the signal output from the selector 550 in a predetermined delay amount. Moreover, the variable delay circuit 554 delays the signal output from the base delay 552 in a set delay amount.

The flip-flop 556 samples a signal output from the selector 550 according to a signal output from the variable delay circuit 554. The flip-flop 556 can sample the signal output from the selector 550 at a desired phase by controlling a delay amount in the variable delay circuit 554.

The counter 558 counts the number of times by which data output from the flip-flop 556 show a predetermined logical value. When the selector 550 selects an output signal from the operation circuit 610, it is possible to obtain an existing probability of an edge at each phase of the output signal from the operation circuit 610 by changing a delay amount in the variable delay circuit 554.

The probability density function computing section 562 computes a probability density function of an output signal based on the counted result output from the counter 558. The probability density function computing section 562 may compute a probability density function in an operation similar to that of the probability density function computing section 232 described in FIG. 37.

The probability density function separating apparatus 100 separates a predetermined component from a probability density function computed from the probability density function computing section 562. The probability density function separating apparatus 100 may have the same or similar function and configuration as or to those of the probability density function separating apparatus 100 described with reference to FIGS. 1 to 31.

Moreover, the probability density function separating apparatus 100 in the present example may include a part of a configuration of the probability density function separating apparatus 100 described with reference to FIGS. 1 to 31. For example, the probability density function separating apparatus 100 may output standard deviation of a random component or a peak to peak value of a deterministic component detected from the standard deviation computing section 120 or the peak to peak value detecting section 140 to an external apparatus, without including the random component computing section 130 or the deterministic component computing section 150 described in FIG. 1.

By such a configuration, it is possible to separate a predetermined component from a probability density function of a signal output from the operation circuit 610 by a circuit provided in a chip including the operation circuit 610. It is possible to obtain standard deviation of a random component of a signal output from the operation circuit 610 with high precision without receiving an influence of a deterministic component depending on the base delay 552 and the variable delay circuit 554. In this way, it is possible to easily perform analysis of the operation circuit 610.

Moreover, when the selector 550 selects an output signal from the variable delay circuit 554, the output signal from the variable delay circuit 554 is input into the base delay 552 by round looping. The frequency counter 560 measures frequency of a pulse signal by counting pulse signals transmitting this loop within a predetermined period. Since this frequency varies with a delay amount set in the variable delay circuit 554, a delay amount in the variable delay circuit 554 can be measured by measuring this frequency.

Figure 43:
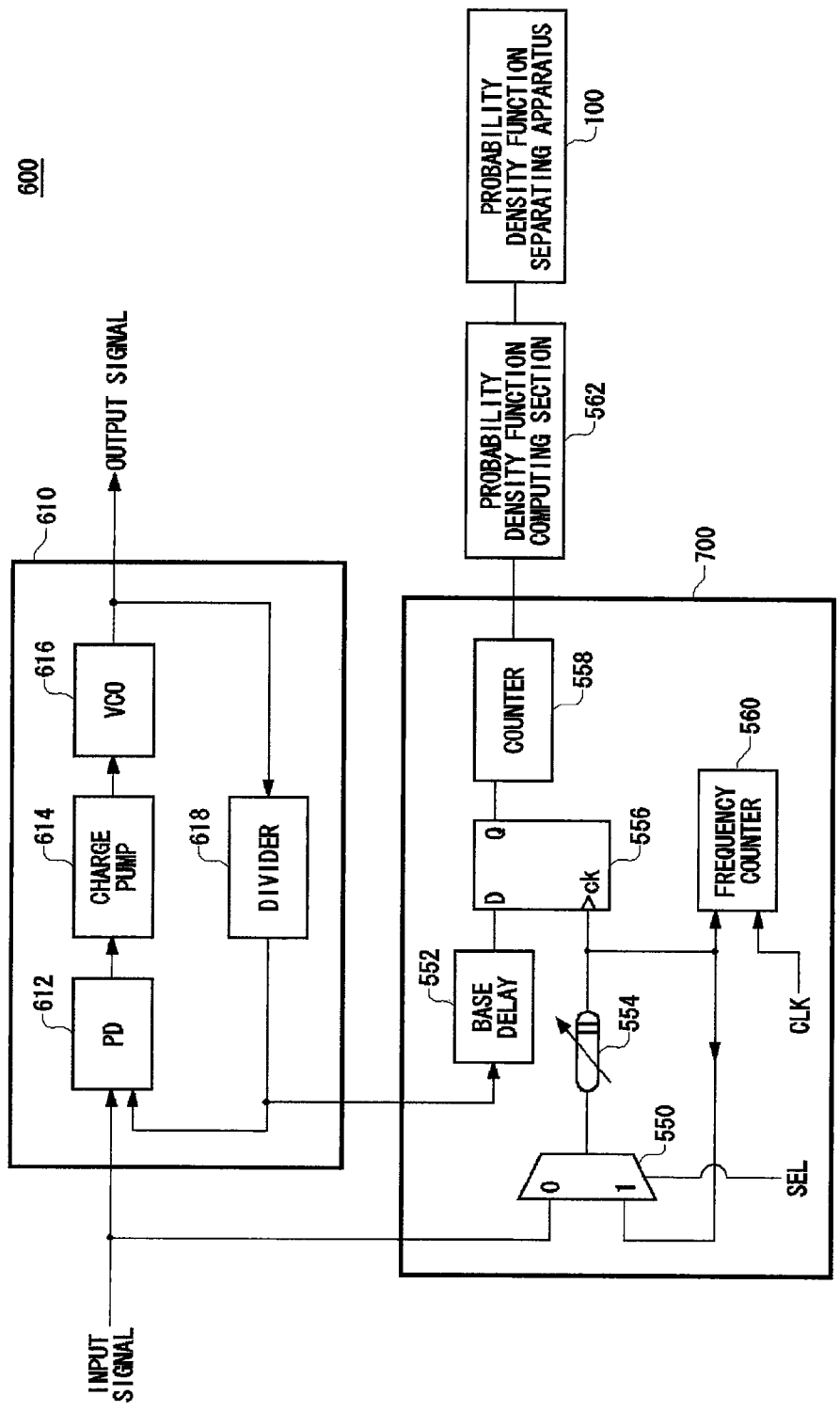
FIG. 43 is a view showing another example of the configuration of the electronic device 600.

FIG. 43 is a view showing another example of a configuration of the electronic device 600. The electronic device 600 in the present example includes the same components as those of the electronic device 600 described in FIG. 42. However, connection relation between components is different.

In the present example, the selector 550 receives an input signal being split from the input into the operation circuit 610. The selector 550 selects and outputs either of this input signal or an output signal from the variable delay circuit 554.

Moreover, the base delay 552 is provided between the operation circuit 610 and the flip-flop 556. In the present example, the base delay 552 delays a signal output from the divider 618, and inputs it into the flip-flop 556.

By such a configuration, similarly to the electronic device 600 described in FIG. 42, it is possible to compute a probability density function of a signal generated from the operation circuit 610. Moreover, it is possible to separate a predetermined component from this probability density function. It is possible to obtain standard deviation of a random component of a signal output from the operation circuit 610 with high precision, without receiving an influence of a deterministic component depending on the base delay 552 and the variable delay circuit 554.

In addition, a configuration of the measurement circuit 700 is not limited to a configuration described in FIG. 42 or 43.

The measurement circuit 700 can adopt various configurations. For example, the measurement circuit 700 may have a configuration similar to that of the testing apparatus 300 described in FIG. 37, or may have a configuration similar to that of the bit error rate measuring apparatus 500 described in FIGS. 39 to 41.

Moreover, the probability density function separating apparatus 100 described above may input a high-purity signal into a circuit to be measured and compute a probability density function of a signal output from the circuit to be measured. A high-purity signal is, e.g., a signal of which a noise component is sufficiently small for a signal component.

Moreover, the probability density function separating apparatus 100 may input a signal of which a component such as jitter or amplitude degradation is known into a circuit to be measured. That is to say, a signal of which a random component of a probability density function is known may be input into a circuit to be measured. In this case, the probability density function separating apparatus 100 may separate the random component of the probability density function of the signal output from the circuit to be measured. Then, the random component generated in the circuit to be measured may be computed by comparing a random component of an input signal and a random component of an output signal. Any probability density function separating apparatus 100 included in the testing apparatus 200, the bit error rate measuring apparatus 500, or the electronic device 600 may have this function.

Figure 44A:
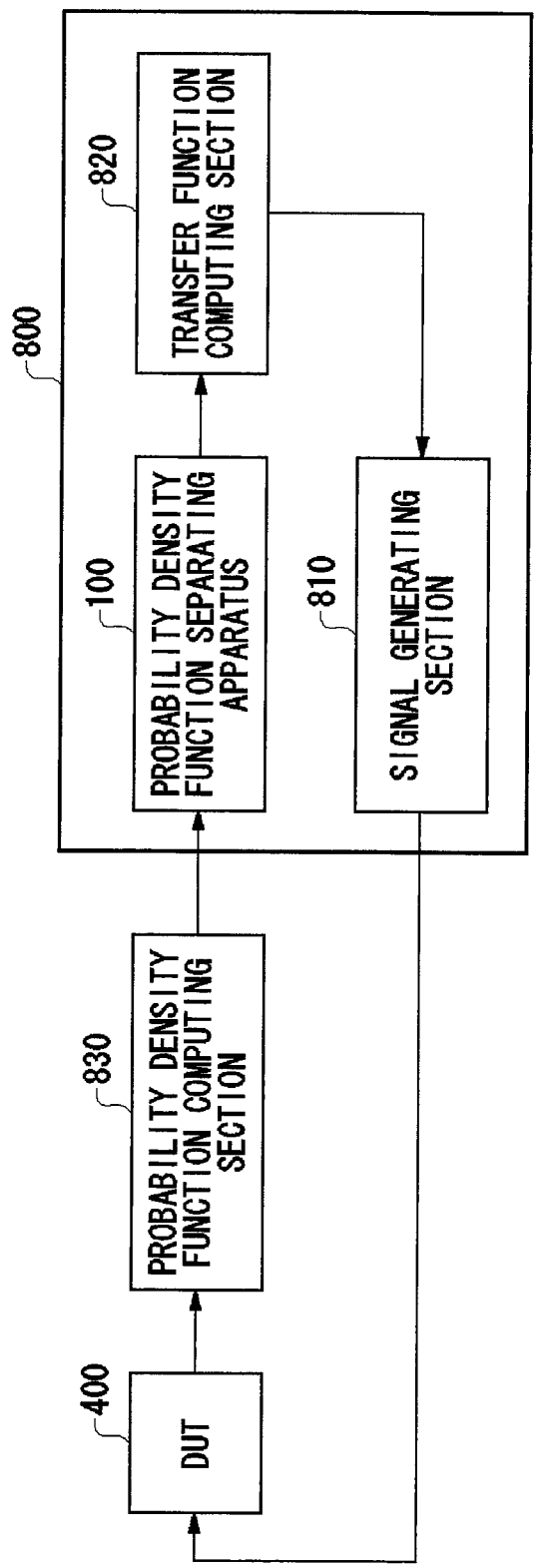
FIG. 44A illustrates an exemplary configuration of a transfer function measuring apparatus 800 relating to an embodiment of the present invention.

FIG. 44A illustrates an exemplary configuration of a transfer function measuring apparatus 800 relating to an embodiment of the present invention. The transfer function measuring apparatus 800 includes therein the probability density function separating apparatus 100, a transfer function computing section 820, and a signal generating section 810. The signal generating section 810 generates a test signal, and supplies the generated test signal to the device under test 400. The signal generating section 810 has a function of injecting deterministic jitter to the test signal. The deterministic jitter is, for example, sinusoidal jitter. The signal generating section 810 has a function of adjusting the amplitude of the deterministic jitter.

The transfer function computing section 820 causes the signal generating section 810 to generate jitter having a predetermined amplitude. For example, the transfer function computing section 820 may cause the signal generating section 810 to generate deterministic jitter which has a constant peak to peak value, for example, sinusoidal jitter.

The probability density function separating apparatus 100 separates a deterministic component and a random component from a probability density function of jitter contained in a signal under test which is output from the device under test 400 in response to the test signal. The probability density function separating apparatus 100 may be the same as the probability density function separating apparatus 100 described with reference to FIGS. 1 to 43.

The probability density function separating apparatus 100 may receive the probability density function generated by the probability density function computing section 830. The probability density function computing section 830 may be the same as the any of the probability density function computing sections (232, 520, 540, and 562) which are described with reference to FIGS. 37 to 43. The probability density function computing section 830 may be provided between the device under test 400 and the probability density function separating apparatus 100, and generate a probability density function indicating the jitter contained in the signal under test output from the device under test 400. The probability density function computing section 830 may be alternatively provided within the transfer function measuring apparatus 800.

The transfer function computing section 820 computes a jitter transfer function for the device under test 400, based on the jitter generated by the signal generating section 810 and the jitter component separated by the probability density function separating apparatus 100. For example, the transfer function computing section 820 may compute the jitter transfer function for the device under test 400, based on the peak to peak value of the deterministic component generated by the signal generating section 810 and the peak to peak value of the deterministic component separated by the probability density function separating apparatus 100.

Figure 44B:
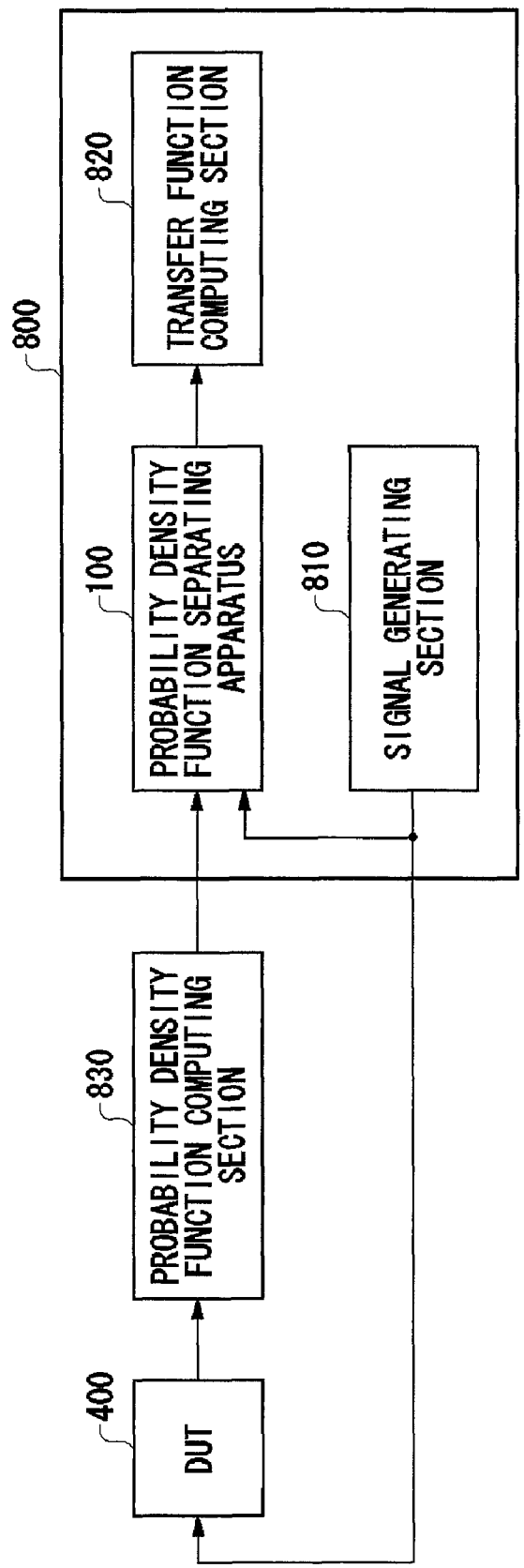
FIG. 44B illustrates another exemplary configuration of the transfer function measuring apparatus 800.

FIG. 44B illustrates another exemplary configuration of the transfer function measuring apparatus 800. The transfer function measuring apparatus 800 relating to the present example may have the same constituents as the transfer function measuring apparatus 800 illustrated in FIG. 44A. However, the probability density function separating apparatus 100 relating to the present embodiment has a channel for measuring the test signal output from the signal generating section 810 and a channel for measuring the signal under test output from the device under test 400. The probability density function separating apparatus 100 relating to the present example may have the same configuration and functions as the probability density function separating apparatus 100 described with reference to FIGS. 1 to 43, for the respective channels.

The probability density function separating apparatus 100 may separate the deterministic component from the probability density function input from the probability density function computing section 830, and separate the deterministic component from the probability density function indicating the jitter contained in the signal under test. The probability density function separating apparatus 100 may simultaneously perform appropriate operations respectively on the test signal and signal under test.

The transfer function computing section 820 computes the jitter transfer function for the device under test 400, based on the jitter components separated from the test signal and signal under test by the probability density function separating apparatus 100. For example, the transfer function computing section 820 may compute the jitter transfer function of the device under test 400 based on the peak to peak value of the deterministic component contained in the test signal and the peak to peak value of the deterministic component contained in the signal under test.

Figure 45:
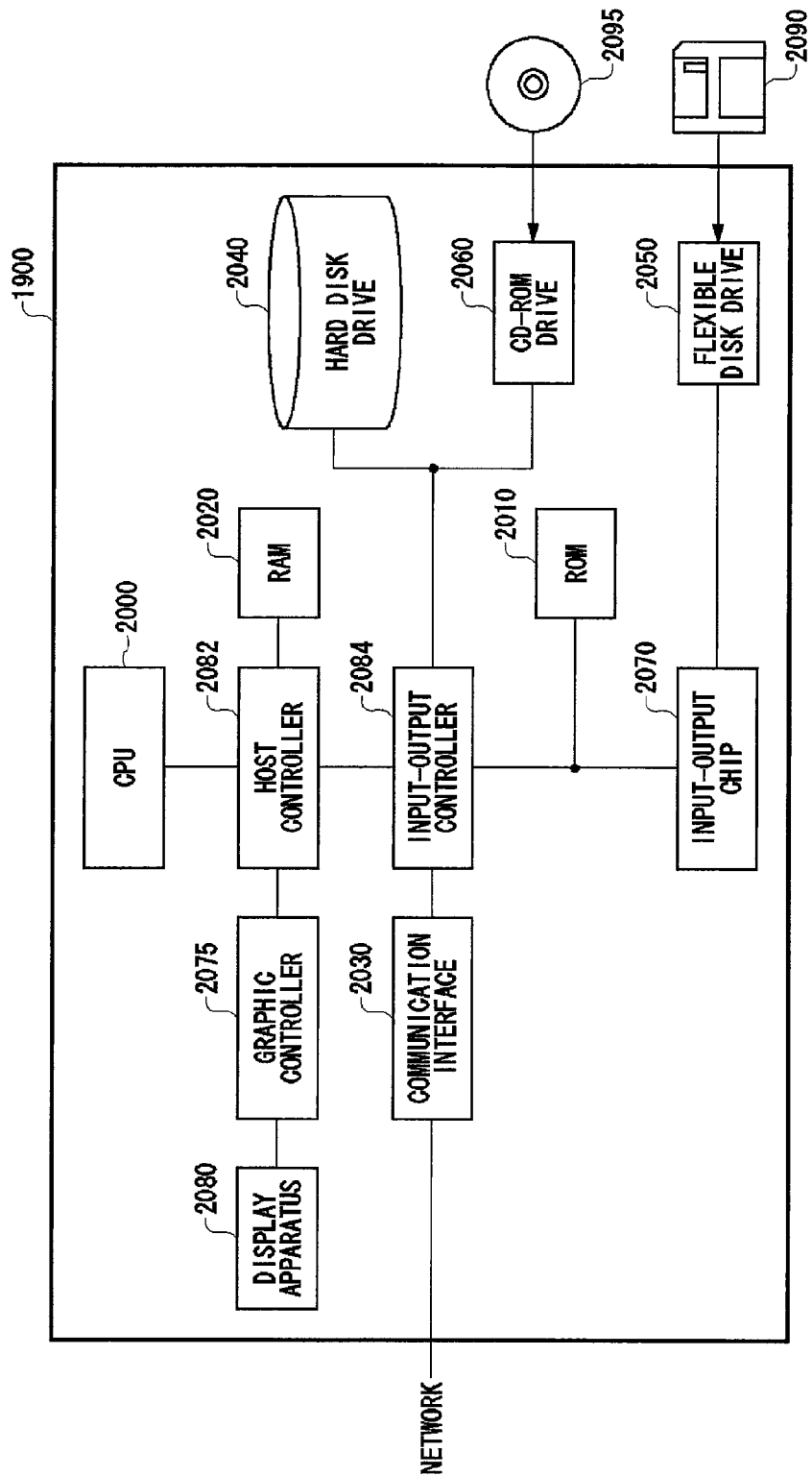
FIG. 45 is a view exemplary showing a hardware configuration of a computer 1900 according to the present embodiment.

FIG. 45 is a view exemplary showing a hardware configuration of a computer 1900 according to the present embodiment. The computer 1900 functions as the probability density function separating apparatus 100, the noise separating apparatus 200, the computing apparatus, the testing apparatus 300, the bit error rate measuring apparatus 500 and the transfer function measuring apparatus 800 described in FIGS. 1 to 44, based on a given program.

For example, when the computer 1900 functions as the probability density function separating apparatus 100, the program may make the computer 1900 function as each component of the probability density function separating apparatus 100 described with reference to FIGS. 1 to 28. Moreover, when the computer 1900 functions as the noise separating apparatus 200, the program may make the computer 1900 function as each component of the noise separating apparatus 200 described with reference to FIGS. 29 to 36.

Moreover, when the computer 1900 functions as the computing apparatus, the program may make the computer 1900 function as a computing apparatus including the time domain computing section 138 described in FIGS. 11 and 12. For example, when the computer 1900 functions as the computing apparatus that directly computes a probability density function in a time domain of a random component from a Gaussian curve in a frequency domain, the program may make the computer 1900 function as each component of the random component computing section 130 described in FIG. 9.

Moreover, when the computer 1900 functions as the computing apparatus that computes a waveform in a time domain from a spectrum in an arbitrary frequency domain, the program may make the computer 1900 function as the time domain computing section 138 and the frequency domain measuring section described with reference to FIG. 12. Moreover, this program may make the computer 1900 function as the probability density function computing section and the probability density function separating apparatus 100 described in FIGS. 37 to 43.

When the computer 1900 functions as the transfer function measuring apparatus 800, the program may cause the computer 1900 to function as the constituents of the transfer function measuring apparatus 800 described with reference to FIGS. 44A and 44B. For example, the program may cause the computer 1900 to function as the probability density function separating apparatus 100 and transfer function computing section 820.

The computer 1900 according to the present embodiment includes a CPU peripheral section, an input-output section, and a legacy input-output section. The CPU peripheral section has a CPU 2000, a RAM 2020, a graphic controller 2075, and a display apparatus 2080 that are interconnected by a host controller 2082. The input-output section has a communication interface 2030, a hard disk drive 2040, and a CD-ROM drive 2060 that are connected to the host controller 2082 by an input-output controller 2084. The legacy input-output section has a ROM 2010, a flexible disk drive 2050, and an input-output chip 2070 that are connected to the input-output controller 2084.

The host controller 2082 connects the RAM 2020 to the CPU 2000 and the graphic controller 2075 that access the RAM 2020 at high transfer rate. The CPU 2000 operates based on a program stored on the ROM 2010 and the RAM 2020, and controls each section. The graphic controller 2075 acquires image data to be generated by the CPU 2000 on a frame buffer provided in the RAM 2020, and displays the data on the display apparatus 2080. Alternatively, the graphic controller 2075 may include therein a frame buffer for storing image data generated from the CPU 2000.

The input-output controller 2084 connects the host controller 2082 to the communication interface 2030, the hard disk drive 2040, and the CD-ROM drive 2060 that are a comparatively fast input-output apparatus. The communication interface 2030 communicates with other apparatuses via network. The hard disk drive 2040 stores a program and data to be used by the CPU 2000 within the computer 1900. The CD-ROM drive 2060 reads a program or data from a CD-ROM 2095, and provides it to the hard disk drive 2040 via the RAM 2020.

Moreover, the ROM 2010 and the flexible disk drive 2050 and the input-output chip 2070 that are a comparatively low-speed input-output apparatus are connected to the input-output controller 2084. The ROM 2010 stores a boot program to be executed by the computer 1900 on starting and a program or the like dependent on hardware of the computer 1900. The flexible disk drive 2050 reads a program or data from a flexible disk 2090, and provides it to the hard disk drive 2040 via the RAM 2020. The input-output chip 2070 connects a various types of input-output apparatuses via the flexible disk drive 2050 and a parallel port, a serial port, a keyboard port, a mouse port, or the like.

A program provided to the hard disk drive 2040 via the RAM 2020 is stored on the flexible disk 2090, the CD-ROM 2095, or a recording medium such as an IC card, to be provided by a user. A program is read from a recording medium, is installed in the hard disk drive 2040 within the computer 1900 via the RAM 2020, and is executed in the CPU 2000.

This program is installed in the computer 1900. This program works on the CPU 2000 or the like, and makes the computer 1900 functions as the probability density function separating apparatus 100, the noise separating apparatus 200, the computing apparatus, the testing apparatus 300, or the bit error rate measuring apparatus 500, that are previously described.

A program described above may be stored on an outside recording medium. A recording medium can include an optical recording medium such as DVD and CD, a magneto-optical recording medium such as MO, a tape medium, a semiconductor memory such as an IC card in addition to the flexible disk 2090 and the CD-ROM 2095. Moreover, a storage device such as a hard disk or a RAM provided in a server system connected to a private communication network and Internet may be used as a recording medium, and a program may be provided to the computer 1900 via a network.

Although one aspect of the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention. As apparent from the above descriptions, according to the present invention, it is possible to separate a random component and a deterministic component from a given probability density function with high precision.

What is claimed is:

1. A probability density function separating apparatus that separates a predetermined component in a given probability density function, comprising:
 a domain transforming section that is supplied with the probability density function and transforms the probability density function into a spectrum in a predetermined variable axis; and
 a deterministic component computing section that multiplies a multiplier coefficient according to a type of distribution of a deterministic component included in the given probability density function by a value, in the variable axis, of a first null of the spectrum and computes a peak to peak value of the probability density function with the deterministic component.

2. The probability density function separating apparatus as claimed in claim 1, wherein the probability density function separating apparatus previously stores the multiplier coefficient every type of distribution of the deterministic component and computes the peak to peak value by means of the multiplier coefficient corresponding to the selected type of distribution of the deterministic component.

3. The probability density function separating apparatus as claimed in claim 1, further comprising a standard deviation computing section that computes standard deviation of a random component included in the probability density function based on the spectrum.

4. The probability density function separating apparatus as claimed in claim 3, wherein the standard deviation computing section computes the standard deviation based on a magnitude of a predetermined variable component, in the variable axis, of the spectrum.

5. The probability density function separating apparatus as claimed in claim 4, wherein the standard deviation computing section computes the standard deviation based on a ratio between a magnitude of a first variable component and a magnitude of a second variable component of the spectrum.

6. The probability density function separating apparatus as claimed in claim 5, wherein the standard deviation computing section calculates a value obtained by dividing the ratio between the magnitude of the first variable component and the magnitude of the second variable component of the spectrum by a ratio between a magnitude of the first variable component and a magnitude of the second variable component of a spectrum of the deterministic component, and computes the standard deviation based on this value.

7. The probability density function separating apparatus as claimed in claim 3, further comprising a random component computing section that computes a probability density function with a random component based on the standard deviation.

8. The probability density function separating apparatus as claimed in claim 7, wherein
the deterministic component computing section comprises:
a candidate value computing section that previously stores the multiplier coefficient every type of distribution of the deterministic component and computes each peak to peak value when each multiplier coefficient is used;
a candidate function computing section that respectively computes a probability density function with the deterministic component based on each peak to peak value computed from the candidate value computing section;
a synthesizing section that respectively generates composite probability density functions made by respectively synthesizing each probability density function with the deterministic component computed from the candidate function computing section and the probability density function with the random component computed from the random component computing section; and
a selecting section that compares each composite probability density function generated from the synthesizing section with the given probability density function and selects one peak to peak value from the plurality of peak to peak values computed from the candidate value computing section based on the comparison result.

9. The probability density function separating apparatus as claimed in claim 1, wherein the deterministic component computing section detects the value, in the variable axis, of the first null of the spectrum based on a peak of a spectrum obtained by second-order differentiating the spectrum output from the domain transforming section by the variable axis.

10. The probability density function separating apparatus as claimed in claim 1, wherein
the deterministic component computing section computes a probability density function corresponding to the deterministic component, based on the peak to peak value, and
the probability density function separating apparatus further includes a random component computing section that computes a random component included in the given probability density function, by dividing the spectrum transformed by the domain transforming section by an absolute value (a magnitude spectrum) of the probability density function corresponding to the deterministic component which is computed by the deterministic component computing section.

11. The probability density function separating apparatus as claimed in claim 1, wherein
the given probability density function is a probability density function with a noise component included in a signal under test, and
the probability density function separating apparatus further comprises a total jitter computing section that computes a value of total jitter included in the signal under test, based on the peak to peak value computed by the deterministic component computing section.

12. The probability density function separating apparatus as claimed in claim 11, further comprising:
a random component computing section that computes a random component included in the probability density function based on the spectrum, wherein
the total jitter computing section computes the value of the total jitter based on the peak to peak value and the random component.

13. The probability density function separating apparatus as claimed in claim 11, wherein
the total jitter computing section is supplied with a random component included in the probability density function, and computes the value of the total jitter based on the peak to peak value and the random component.

14. The probability density function separating apparatus as claimed in claim 11, further comprising
a deciding section that decides whether the signal under test is acceptable based on the value of the total jitter which is computed by the total jitter computing section.

15. A probability density function separating method for separating a predetermined component from a given probability density function, comprising:
a domain transforming step of being supplied with the probability density function and transforming the probability density function into a spectrum in a predetermined variable axis; and
a deterministic component computing step of multiplying a multiplier coefficient according to a type of distribution of a deterministic component included in the given probability density function by a value, in the variable axis, of a first null of the spectrum and computing a peak to peak value of the probability density function with the deterministic component.

16. The probability density function separating method as claimed in claim 15, further comprising a standard deviation computing step of computing standard deviation of a random component included in the probability density function based on the spectrum.

17. An article comprising machine executable instructions tangibly embodied on a non-transitory machine readable medium, the instructions operable to cause one or more machines to make a computer function as a probability density function separating apparatus that separates a predetermined component from a given probability density function, the instructions making the computer function as: a domain transforming section that is supplied with the probability density function and transforms the probability density function into a spectrum in a predetermined variable axis; and a deterministic component computing section that multiplies a multiplier coefficient according to a type of distribution of a deterministic component included in the given probability density function by a value, in the variable axis, of the first null of the spectrum and computes a peak to peak value of the probability density function with the deterministic component.

18. The program as claimed in claim 17, the program further making the computer function as a standard deviation computing section that computes standard deviation of a random component included in the probability density function based on the spectrum.

19. The program as claimed in claim 18, the program making the computer function as the standard deviation computing section that calculates a value obtained by dividing a ratio between a magnitude of a first variable component and a magnitude of a second variable component of the spectrum of the probability density function by a ratio between a magnitude of the first variable component and a magnitude of the second variable component of a spectrum of the deterministic component and computes the standard deviation based on this value.

\* \* \* \* \*